(12) United States Patent
Nishihara et al.

(10) Patent No.: US 8,158,233 B2
(45) Date of Patent: Apr. 17, 2012

(54) OPTICAL INFORMATION RECORDING MEDIUM, METHOD OF MANUFACTURING THE SAME, AND SPUTTERING TARGET

(75) Inventors: Takashi Nishihara, Osaka (JP); Rie Kojima, Osaka (JP); Hideo Kusada, Osaka (JP); Noboru Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 310 days.

(21) Appl. No.: 12/593,693

(22) PCT Filed: Jan. 27, 2009

(86) PCT No.: PCT/JP2009/000288
§ 371 (c)(1),
(2), (4) Date: Sep. 29, 2009

(87) PCT Pub. No.: WO2009/096165
PCT Pub. Date: Aug. 6, 2009

(65) Prior Publication Data
US 2010/0151179 A1    Jun. 17, 2010

(30) Foreign Application Priority Data
Jan. 31, 2008  (JP) ................. 2008-021760

(51) Int. Cl.
*B32B 3/02* (2006.01)

(52) U.S. Cl. ............ 428/64.1; 428/64.4; 428/64.5; 428/64.6; 430/270.13

(58) Field of Classification Search .......... 428/64.4; 430/270.13
See application file for complete search history.

(56) References Cited

U.S. PATENT DOCUMENTS

| | | |
|---|---|---|
| 5,146,299 A | 9/1992 | Lampe et al. |
| 2003/0038028 A1 | 2/2003 | Schultheis et al. |
| 2003/0180473 A1 | 9/2003 | Nishihara et al. |
| 2004/0105182 A1 | 6/2004 | Nishihara et al. |
| 2004/0191683 A1 | 9/2004 | Nishihara et al. |
| 2005/0030882 A1 | 2/2005 | Kusada et al. |
| 2005/0074694 A1 | 4/2005 | Nishihara et al. |
| 2005/0202204 A1 | 9/2005 | Nishihara et al. |
| 2006/0044991 A1 | 3/2006 | Nishihara et al. |
| 2006/0141202 A1* | 6/2006 | Suenaga ............ 428/64.1 |
| 2009/0022932 A1* | 1/2009 | Fujii et al. ............ 428/64.4 |
| 2009/0086608 A1 | 4/2009 | Takaoka et al. |
| 2009/0246558 A1 | 10/2009 | Nishihara et al. |
| 2010/0046346 A1 | 2/2010 | Kusada et al. |
| 2011/0151277 A1 | 6/2011 | Nishihara et al. |
| 2011/0177280 A1 | 7/2011 | Tsuchino et al. |

FOREIGN PATENT DOCUMENTS

| | | |
|---|---|---|
| JP | 2000-036130 A | 2/2000 |
| JP | 2003-013201 | 1/2003 |
| JP | 2005-071577 A | 3/2005 |
| JP | 2008-097794 A | 4/2008 |
| WO | WO 03/025922 A1 | 3/2003 |
| WO | WO 2007/119439 A1 | 10/2007 |
| WO | WO 2008/032548 A1 | 3/2008 |

* cited by examiner

*Primary Examiner* — Elizabeth Mulvaney
(74) *Attorney, Agent, or Firm* — Hamre, Schumann, Mueller & Larson, P.C.

(57) ABSTRACT

An optical information recording medium (9) of the present invention is an optical information recording medium including: N information layers, where N is a natural number of 2 or more; and an intermediate layer for separating the N information layers optically from each other. With the N information layers being referred to as a first information layer (10) to an N-th information layer (7) sequentially from an optical beam incident side, a first information layer (10) corresponding to an L-th information layer included in the N information layers includes a recording layer (104) on which information can be recorded by irradiation with an optical beam, a reflective layer (108), and a transmittance adjusting layer (109) in this order from the optical beam incident side, where L is an at least one natural number that satisfies $1 \leq L \leq N-1$. The transmittance adjusting layer (109) contains tungsten (W) and oxygen (O).

43 Claims, 10 Drawing Sheets

US 8,158,233 B2

OPTICAL INFORMATION RECORDING MEDIUM, METHOD OF MANUFACTURING THE SAME, AND SPUTTERING TARGET

TECHNICAL FIELD

The present invention relates to an information recording medium for recording, erasing, rewriting and/or reproducing information optically, a method of manufacturing the same, and a sputtering target.

BACKGROUND ART

One type of conventional information recording medium is a phase-change type information recording medium that utilizes a phenomenon in which a recording layer (phase-change material layer) included in the medium undergoes a phase change. Among the phase-change type information recording media, there is a type of information recording medium that utilizes a laser beam to record, erase, rewrite or reproduce information optically. This type of information recording medium has a recording layer made of a phase change material that changes its state between, for example, a crystalline phase and an amorphous phase by heat generated by irradiation with a laser beam. A difference in reflectance between the crystalline phase and the amorphous phase is detected and read out as information.

Among the phase-change type information recording media, a rewritable information recording medium is one in which recorded information can be erased or rewritten. This rewritable information recording medium includes a recording layer whose initial state is usually in the crystalline phase. When recording information, the recording layer is melted by irradiation with a laser beam of high power (recording power) and cooled rapidly, so that a portion irradiated with the laser beam is changed to the amorphous phase. On the other hand, when erasing information, the recording layer is heated by irradiation with a laser beam of lower power (erasing power) than that applied during recording and cooled slowly, so that a portion irradiated with the laser beam is changed to the crystalline phase. Therefore, it is possible to record new information or rewrite information on the rewritable information recording medium while erasing recorded information by irradiating the recording layer with a laser beam whose power is modulated between a high power level and a lower power level. In order to change the recording layer into the crystalline phase, the recording layer needs to be maintained for a given period of time (crystallization time) at a temperature (crystallization temperature) for allowing the recording layer to change its phase into the crystalline phase. A time required for changing the recording layer into the crystalline phase becomes shorter when its crystallization time is shorter, and thus information can be erased or rewritten in a shorter time, that is, at a higher speed.

In addition, among the phase-change type information recording media, a write-once information recording medium is one in which information can be recorded only once and the recorded information cannot be erased or rewritten. The write-once information recording medium includes a recording layer whose initial state is usually in the amorphous phase. When recording information, the recording layer is heated by irradiation with a laser beam of high power (recording power) and is then cooled slowly, so that a portion irradiated with the laser beam is changed into the crystalline phase.

In recent years, various techniques have been introduced to increase the recording capacity of optical information recording media. For example, a technique for achieving high density recording has been introduced in which a blue-violet laser having a short wavelength is used, a thin substrate is provided on the side from which a laser beam is incident, and an objective lens having a large numerical aperture (NA) is used so as to reduce the spot diameter of the laser beam.

Another technique has been introduced in which an optical information recording medium provided with two information layers is used to double the recording capacity and information is recorded/reproduced on/from the two information layers using a laser beam that is incident from the side of one of the two information layers (see, for example, JP 2000-36130 A, pages 2 to 11, FIG. 2). In this two-layer optical information recording medium, a laser beam that has passed through one information layer (hereinafter, a "first information layer") disposed closer to the incident side of the laser beam is used to record/reproduce information on/from another information layer (hereinafter, a "second information layer") disposed farther away from the laser beam incident side. Therefore, in the first information layer, a recording layer and a reflective layer provided for allowing the recording layer to absorb light efficiently and for increasing the reflectance of the first information layer must be extremely thin. In addition, a transmittance adjusting layer having a high refractive index needs to be disposed to increase the transmittance further by optical interference. Conventionally, $TiO_2$, which is an oxide of titanium (Ti), is used for the transmittance adjusting layer to increase the transmittance of the first information layer (see, for example, WO 03/025922, pages 10 to 20, FIG. 1).

However, a $TiO_2$ layer conventionally used as a transmittance adjusting layer has a problem in that when the $TiO_2$ layer is formed by sputtering, which is a commonly known film forming method, the thickness of the film formed per unit time (hereinafter referred to as a "film formation rate") is small and it takes a long time to obtain a desired thickness (that is, the film formation rate is low). Furthermore, the film formation rate of the $TiO_2$ layer varies within a given range of values because it is dependent on the degree of vacuum in the film forming chamber. Therefore, the $TiO_2$ layer has another problem in that it is difficult to maintain the thickness of the $TiO_2$ layer within a desired thickness range particularly during mass production thereof. A multi-layer optical information recording medium having three or more information layers, which is expected to be commercialized in the future, has an increased number of information layers on the laser beam incident side. Accordingly, the number of $TiO_2$ layers serving as transmittance adjusting layers also increases, which may make this problem more serious.

DISCLOSURE OF THE INVENTION

The present invention has been made in order to solve the above-mentioned problems, and is intended to provide a transmittance adjusting layer having a high film formation rate that is not dependent on the degree of vacuum in a film forming chamber while maintaining the good characteristics such as a refractive index and moisture resistance of conventional transmittance adjusting layers not to degrade significantly, and thus to provide an optical information recording medium having high mass productivity. The present invention also is intended to provide a sputtering target that can be used for forming a transmittance adjusting layer as described above.

In order to achieve the above objects, an optical information recording medium of the present invention is an optical information recording medium including: N information layers, where N is a natural number of 2 or more; and an intermediate layer for separating the N information layers optically from each other. In this optical information recording medium, with the N information layers being referred to as a first information layer to an N-th information layer sequentially from an optical beam incident side, an L-th information layer included in the N information layers includes a recording layer on which information can be recorded by irradiation with an optical beam, a reflective layer, and a transmittance adjusting layer in this order from the optical beam incident side, where L is an at least one natural number that satisfies $1 \leq L \leq N-1$, and the transmittance adjusting layer contains tungsten (W) and oxygen (O).

The present invention also provides a method of manufacturing the optical information recording medium of the present invention. This method includes at least a step of forming the transmittance adjusting layer. In the step of forming the transmittance adjusting layer, the transmittance adjusting layer is formed by using a sputtering target containing at least tungsten (W) and oxygen (O), or the transmittance adjusting layer is formed by using a sputtering target containing at least tungsten (W) and a gas containing at least oxygen (O).

The present invention also provides a sputtering target (first sputtering target) containing at least tungsten (W) and M1, where M1 is at least one element selected from Ce, Nb, and Ti, or a sputtering target (second sputtering target) containing at least tungsten (W) and M2, where M2 is at least one element selected from Ag, Bi, Mg, Mn, Y, Zn, and Zr.

The optical information recording medium of the present invention makes it possible to obtain a transmittance adjusting layer having a high film formation rate that is not dependent on the degree of vacuum in a film forming chamber without degrading its characteristics, and therefore to provide an optical information recording medium that includes an information layer having a high transmittance and is suitable for mass production. Furthermore, the method of manufacturing an optical information recording medium of the present invention and the sputtering target of the present invention make it possible to manufacture the optical information recording medium of the present invention easily.

BEST MODE FOR CARRYING OUT THE INVENTION

Figure 1:
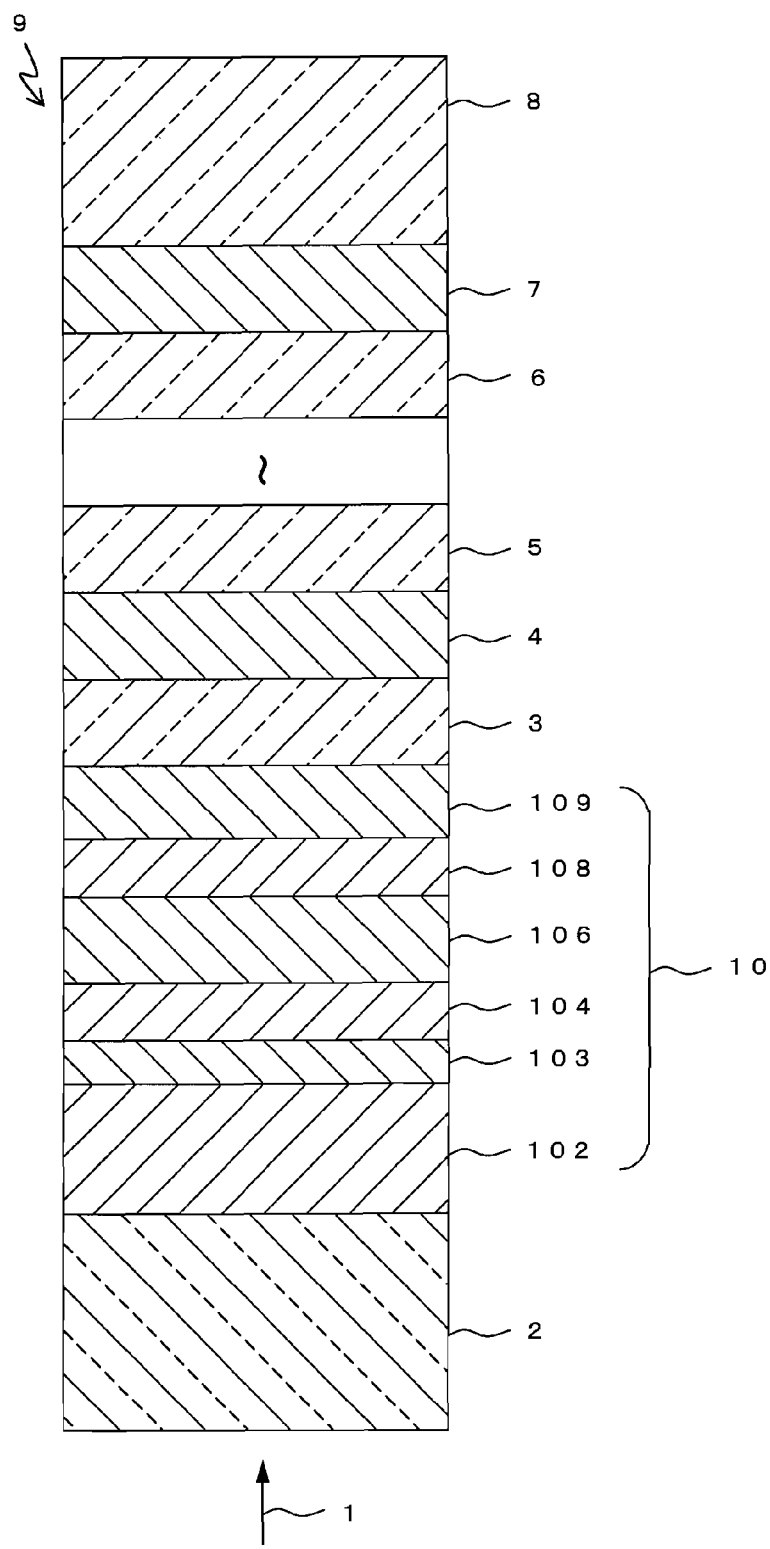
FIG. 1 is a partial cross-sectional view showing an example of a layered structure of an optical information recording medium of the present invention including N information layers.

The optical information recording medium of the present invention is an optical information recording medium including: N information layers, where N is a natural number of 2 or more; and an intermediate layer for separating the N information layers optically from each other. In this optical information recording medium, with the N information layers being referred to as a first information layer to an N-th information layer sequentially from an optical beam incident side, an L-th information layer included in the N information layers includes a recording layer on which information can be recorded by irradiation with an optical beam, a reflective layer, and a transmittance adjusting layer in this order from the optical beam incident side, where L is an at least one natural number that satisfies $1 \leq L \leq N-1$, and the transmittance adjusting layer contains tungsten (hereinafter referred to as "W") and oxygen (hereinafter referred to as "O"). This feature makes it possible to provide a transmittance adjusting layer having a high film formation rate that is not dependent on the degree of vacuum in a film forming chamber, and to provide an optical information recording medium having high mass productivity.

In the optical information recording medium of the present invention, the transmittance adjusting layer further may contain M1, where M1 is at least one element selected from Ce, Nb, and Ti. In this case, the transmittance adjusting layer may contain a material represented by the following formula (1):

$$W_{a1}M1_{b1}O_{100-a1-b1} \text{ (atom \%)} \quad (1)$$

where a1 and b1 satisfy $0<a1<30$ and $0<b1<29$, respectively. Among the materials represented by the formula (1), materials in which a1 satisfies $10<a1<22$ and b1 satisfies $5<b1<23$ are used suitably. From another aspect, the transmittance adjusting layer may contain a material represented by the following formula (2):

$$(WO_3)_{100-c1}(D1)_{c1} \text{ (mol \%)} \quad (2)$$

where D1 is at least one compound selected from $CeO_2$, $Nb_2O_5$, and $TiO_2$, and c1 satisfies $0<c1 \leq 95$. Among the materials represented by the formula (2), materials in which c1 satisfies $50 \leq c1 \leq 80$ are used suitably.

The use of the materials mentioned above makes it possible to increase the refractive index of the transmittance adjusting layer and further increase the transmittance of the information layer.

In the present specification, the formula "$W_{a1}M1_{b1}O_{100-a1-b1}$ (atom %)" denotes a composition formula that is expressed with the total number of "W" atoms, "M1" atoms and "O" atoms being considered as a reference value (100%). The formula "$(WO_3)_{100-c1}(D1)_{c1}$ (mol %)" denotes a mixture of (100−c1) mol % of $WO_3$ and c1 mol % of compound D1. Hereinafter, the same notation system is used in the same manner. In the present specification, "M1" below also denotes at least one element selected from Ce, Nb, and Ti in the same manner as mentioned above.

In the optical information recording medium of the present invention, the transmittance adjusting layer further may contain M2, where M2 is at least one element selected from Ag, Bi, Mg, Mn, Y, Zn, and Zr. In this case, the transmittance adjusting layer may contain at least one compound selected from $Ag_2WO_4$, $Bi_2WO_6$, $MgWO_4$, $MnWO_4$, $Y_2W_3O_{12}$, $ZnWO_4$, and $ZrW_2O_8$. From another aspect, the transmittance adjusting layer may contain a material represented by the following formula (3):

$$W_{a2}M2_{b2}O_{100-a2-b2} \text{ (atom \%)} \tag{3}$$

where a2 and b2 satisfy 0<a2<30 and 0<b2<35, respectively.

The use of the materials mentioned above makes it possible to improve the stability of the transmittance adjusting layer, and thus to provide an optical information recording medium having high mass productivity and provided with an information layer having a high transmittance. In the present specification, "M2" below also denotes at least one element selected from Ag, Bi, Mg, Mn, Y, Zn, and Zr, in the same manner as mentioned above.

In the optical information recording medium of the present invention, the transmittance adjusting layer containing W and O further may contain both M1 and M2. In this case, the transmittance adjusting layer may contain a material represented by the following formula (4):

$$W_{a3}M1_{b3}M2_{c3}O_{100-a3-b3-c3} \text{ (atom \%)} \tag{4}$$

where a3, b3, and c3 satisfy 0<a3<30, 4<b3<16, and 3<c3<22, respectively.

Thereby, it is possible to provide an optical information recording medium provided with a transmittance adjusting layer having a high refractive index as well as high stability and suitable for mass production, and an information layer having a high transmittance.

The transmittance adjusting layer in the optical information recording medium of the present invention may contain a small amount of components other than the components of each of the above materials as long as the transmittance adjusting layer having the characteristics intended by the present invention can be obtained, but the transmittance adjusting layer that is made substantially of each of the above materials is used suitably. The phrase "a transmittance adjusting layer is made substantially only of each of the above materials" means that not only the transmittance adjusting layer is made only of each of the above materials but also it may be made of a material containing inevitably other components in addition to each of the above materials.

In the optical information recording medium of the present invention, the transmittance adjusting layer may have a thickness d1 (nm) in a range of 9≦d1≦30. Thereby, the transmittance of the information layer can be enhanced.

In the optical information recording medium of the present invention, the recording layer may be a layer capable of undergoing a phase change by irradiation with the optical beam. For example, the recording layer may contain Ge, Te, and at least one element selected from Sb, Bi, In, and Sn, and the recording layer may contain at least 50 atom % of Te. The recording layer may contain at least 70 atom % of Sb. Thereby, it is possible to provide an optical information recording medium with good erasing characteristics when rewriting information.

The recording layer may have a thickness of 9 nm or less. Thereby, the transmittance of the information layer can be enhanced.

The reflective layer may contain Ag as a main component. The phrase "a reflective layer contains Ag as a main component" means that the content of Ag in the reflective layer is at least 50 atom %. Thereby, it is possible to provide an optical information recording medium provided with an information layer having a good transmittance, recording sensitivity, and signal intensity.

The reflective layer may have a thickness of 15 nm or less. Thereby, the transmittance of the information layer can be enhanced.

In the optical information recording medium of the present invention, the intermediate layer may contain an acrylic resin as a main component. The phrase "an intermediate layer contains an acrylic resin as a main component" means that the content of that resin in the intermediate layer is at least 90 weight %. Thereby, it is possible to provide an optical information recording medium having high mass productivity.

A method of manufacturing an optical information recording medium of the present invention is a method of manufacturing the optical information recording medium mentioned above. This method includes at least a step of forming the transmittance adjusting layer containing W and O. In the step of forming the transmittance adjusting layer, the transmittance adjusting layer is formed by using a sputtering target containing at least W and O, or the transmittance adjusting layer is formed by using a sputtering target containing at least W and a gas containing at least O.

In the method of manufacturing the optical information recording medium of the present invention, the sputtering target and the transmittance adjusting layer each further may contain M1. Thereby, it is possible to manufacture an optical information recording medium provided with a transmittance adjusting layer having an increased refractive index and an information layer having a further increased transmittance.

In the method of manufacturing the optical information recording medium of the present invention, the sputtering target and the transmittance adjusting layer each further may contain M2. Thereby, it is possible to manufacture, with good productivity, an optical information recording medium provided with a transmittance adjusting layer having improved stability and an information layer having a high transmittance.

The method of manufacturing the optical information recording medium of the present invention further may include a step of forming the intermediate layer prior to the step of forming the transmittance adjusting layer. Thereby, it is possible to manufacture, with good productivity, an optical information recording medium provided with a plurality of information layers.

When an optical information recording medium provided with the transmittance adjusting layer containing W, O, and M1 is manufactured as the optical information recording medium of the present invention, a sputtering target (first target) used for the manufacture contains at least W and M1. The use of such a sputtering target makes it possible to form a transmittance adjusting layer having a high film formation rate that is not dependent on the degree of vacuum in a film forming chamber, and thus to produce an optical information recording medium with good mass productivity. This first sputtering target further may contain M2. When the first sputtering target further contains M2, it is possible to form a transmittance adjusting layer containing W, O, M1 and M2 and having higher stability and thus to increase further the transmittance of the information layer. The first sputtering target further may contain O. In this case, it is possible to produce the transmittance adjusting layer for the optical information recording medium of the present invention without performing reactive sputtering using a gas containing oxygen.

When the first sputtering target of the present invention contains W, M1, and O, the first sputtering target may contain a material represented by the following formula (5):

$$W_{a1}M1_{b1}O_{100-a1-b1} \text{ (atom \%)} \quad (5)$$

where a1 and b1 satisfy $0<a1<30$ and $0<b1<29$, respectively. From another aspect, the first sputtering target may contain a material represented by the following formula (6):

$$(WO_3)_{100-c1}(D1)_{c1} \text{ (mol \%)} \quad (6)$$

where D1 is at least one compound selected from $CeO_2$, $Nb_2O_5$, and $TiO_2$, and c1 satisfies $0<c1\leq95$. The use of such a first sputtering target makes it possible to produce an optical information recording medium provided with a transmittance adjusting layer having an increased refractive index and an information layer having a further increased transmittance.

In the case where the first sputtering target of the present invention contains W, M1, M2, and O, the first sputtering target may contain a material represented by the following formula (7):

$$W_{a3}M1_{b3}M2_{c3}O_{100-a3-b3-c3} \text{ (atom \%)} \quad (7)$$

where a3, b3, and c3 satisfy $0<a3<30$, $4<b3<16$, and $3<c3<22$, respectively. The use of such a sputtering target makes it possible to produce, with high mass productivity, an optical information recording medium provided with a transmittance adjusting layer having an increased refractive index and stability and an information layer having a high transmittance.

The first sputtering target of the present invention is a sputtering target containing each of the above materials. It may contain other components according to the components of the transmittance adjusting layer to be produced, or may be formed substantially only of each of the above materials. The phrase "a first sputtering target is formed substantially of each of the above materials" means that not only the first sputtering target is made only of each of the above materials but also it is made of a material containing inevitably other components in addition to each of the above materials.

When an optical information recording medium provided with the transmittance adjusting layer containing W, O, and M2 is manufactured as the optical information recording medium of the present invention, a sputtering target containing at least W and M2 also can be used as another sputtering target (second sputtering target) to be used for the manufacture. In the case where this second sputtering target contains W, M2, and O, this second sputtering target further may contain a material represented by the following formula (8):

$$W_{a2}M2_{b2}O_{100-a2-b2} \text{ (atom \%)} \quad (8)$$

where a2 and b2 satisfy $0<a2<30$ and $0<b2<35$, respectively. The second sputtering target of the present invention is a sputtering target containing each of the above materials. It may contain other components according to the components of the transmittance adjusting layer to be produced, or may be formed substantially only of each of the above materials. The meaning of the word "substantially" is the same as in the case of the first sputtering target.

Hereinafter, embodiments of the present invention will be described with reference to the drawings. The following embodiments are examples and the present invention is not limited to the following embodiments. Furthermore, in the following embodiments, the same reference numerals are assigned to the same components and the same description thereof is not repeated.

Embodiment 1

In Embodiment 1, an example of an optical information recording medium of the present invention will be described. FIG. 1 shows a partial cross-sectional view of an optical information recording medium 9 according to Embodiment 1. The optical information recording medium 9 is a multi-layer optical information recording medium on/from which information can be recorded/reproduced by a laser beam 1 irradiated from one side of the medium.

The optical information recording medium 9 includes a substrate 8, and N (N is a natural number that satisfies $N\geq2$) information layers including an N-th information layer 7, ..., a second information layer 4, and a first information layer 10 that are formed sequentially on the substrate 8, with respective intermediate layers 6, 5, 3, etc. being interposed therebetween, and a transparent layer 2. In the present embodiment, an information layer disposed at the K-th position ($1\leq K\leq N$) when counted from the incident side of the laser beam 1 is referred to as a "K-th information layer". The first information layer 10, the second information layer 4, the third information layer (not shown), ..., and (N−1)th information layer (not shown), which are the first to (N−1)th information layers counted from the incident side of the laser beam 1, are optically-transparent information layers.

The transparent layer 2 is made of a resin such as a photo-curable resin (especially an ultraviolet curable resin) or a slow-acting thermosetting resin, a dielectric material, or the like. It is preferable that these materials have low light absorption with respect to the laser beam 1 to be used, and low optical birefringence in a short wavelength range. As a material of the transparent layer 2, an acrylic resin is particularly preferable. The transparent layer 2 may be a transparent disk-shaped sheet or plate made of a resin such as polycarbonate, amorphous polyolefin, and PMMA (polymethylmethacrylate), or glass. In this case, the transparent layer 2 can be bonded to a first dielectric layer 102 by using a resin such as a photo-curable resin (especially an ultraviolet curable resin) or a slow-acting thermosetting resin, an adhesive sheet, or the like. When recording/reproduction is performed using an objective lens having a NA of 0.6, for example, the thickness of the transparent layer 2 preferably is in the range of 0.55 mm to 0.65 mm. When recording/reproduction is performed using an objective lens having a NA of 0.85, the thickness of the transparent layer 2 preferably is in the range of 50 μm to 120 μm.

It is preferable that the wavelength λ of the laser beam 1 is 450 nm or less particularly for high-density recording. This is because the spot diameter of the focused laser beam 1 is determined according to the wavelength λ (as the wavelength λ becomes shorter, the laser beam can be focused on a spot with a smaller diameter). If the wavelength λ is shorter than 350 nm, the transparent layer 2 and others absorb light excessively. Thus, it is more preferable that the wavelength λ is within the range of 350 nm to 450 nm.

The substrate 8 is a transparent disk-shaped substrate. The substrate 8 can be made of a resin such as polycarbonate, amorphous polyolefin, and PMMA, or glass. As a material for the substrate 8, polycarbonate is especially useful for its excellent transfer characteristics, suitability for mass production, as well as its low cost.

Guide grooves for guiding the laser beam may be formed, if necessary, on the surface of the substrate 8 facing the N-th information layer 7. The other surface of the substrate 8 opposite to the N-th information layer 7 is preferably flat and smooth. It is preferable that the thickness of the substrate 8 is in the range of 0.5 mm to 1.2 mm, so that the substrate 8 is sufficiently strong and the optical information recording medium 9 has a thickness of about 1.2 mm. If the thickness of the transparent layer 2 is about 0.6 mm (thickness at which recording/reproduction can be performed well with NA=0.6), then it is preferable that the thickness of the substrate 8 is in the range of 0.55 mm to 0.65 mm. If the thickness of the transparent layer 2 is about 0.1 mm (thickness at which recording/reproduction can be performed well with NA=0.85), then it is preferable that the thickness of the substrate 8 is in the range of 1.05 mm to 1.15 mm.

The intermediate layers 6, 5, 3, etc. are made of a resin such as a photo-curable resin (especially an ultraviolet curable resin) or a slow-acting thermosetting resin, a dielectric material, or the like. It is preferable that these intermediate layers 6, 5, 3, etc. have low light absorption with respect to the laser beam 1 to be used, and low optical birefringence in a short wavelength range. As a material of the intermediate layers 6, 5, 3, etc., an acrylic resin is particularly preferable.

The intermediate layers 6, 5, 3, etc. are provided to differentiate the focus positions of the first information layer 10, the second information layer 4, ..., the N-th information layer 7, etc. from each other in the optical information recording medium 9. The intermediate layers 6, 5, 3, etc. are required to have a thickness equal to or more than the focal depth $\Delta Z$ that is determined according to the numerical aperture NA of an objective lens and the wavelength $\lambda$, of the laser beam 1. The value of $\Delta Z$ can be approximated by $\Delta Z=\lambda/\{2(NA)^2\}$, assuming that the reference value of the intensity at the focus is 80% of the aberration-free case. When $\lambda$ is equal to 405 nm and NA is equal to 0.85, $\Delta Z$ is determined to be 0.280 µm. A value within ±0.3 µm of 0.280 µm is within the focal depth. In this case, therefore, the intermediate layers 6, 5, 3, etc. are required to have a thickness of at least 0.6 µm.

It is desirable that a distance between the adjacent two information layers and a distance between the first information layer 10 and the N-th information layer disposed farthest therefrom be set to values in the ranges that allow the laser beam 1 to be focused using an objective lens. Accordingly, the total thickness of the intermediate layers 6, 5, 3, etc. preferably is within a tolerance allowed by the objective lens (for example, 60 µm or less).

Guide grooves for guiding the laser beam 1 may be formed on the surfaces of the intermediate layers 6, 5, 3, etc. on the incident side of the laser beam 1, if necessary.

In this case, recording/reproduction can be performed on/from the K-th information layer (K is a natural number that satisfies 1<K≦N) by the laser beam 1 that has been irradiated only from one side and passed through the first information layer through (K−1)th information layer.

Any one of the first information layer through the N-th information layer can be a reproduction-only (read only memory (ROM) type) information layer or a write-once (recordable (R) type) information layer on which writing can be performed only once.

Hereafter, the structure of the first information layer 10 will be described in detail. In the present embodiment, the first information layer 10 corresponds to the L-th information layer in the optical information recording medium of the present invention. In the case where a plurality of layers having the same functions are provided in the optical information recording medium of the present embodiment, they are distinguished from each other by referring to them as a first layer, second layer, ... from the incident side of the laser beam 1, for the sake of explanation.

The first information layer 10 includes a first dielectric layer 102, a first recording layer 104, a second dielectric layer 106, a first reflective layer 108, and a transmittance adjusting layer 109 that are disposed in this order from the incident side of the laser beam 1. The first information layer 10 may include a first interface layer 103 between the first dielectric layer 102 and the first recording layer 104.

The first dielectric layer 102 is made of a dielectric material. This first dielectric layer 102 has functions of protecting the first recording layer 104 from oxidation, corrosion, deformation and the like, adjusting the optical distance so as to enhance the light absorption efficiency of the first recording layer 104, and increasing a difference in the amount of reflected light between before and after recoding so as to increase the signal intensity.

As a material for forming the first dielectric layer 102, one or more oxides selected from $TiO_2$, $ZrO_2$, $HfO_2$, $ZnO$, $Nb_2O_5$, $Ta_2O_5$, $SiO_2$, $SnO_2$, $Al_2O_3$, $Bi_2O_3$, $Cr_2O_3$, $Ga_2O_3$, $In_2O_3$, $Sc_2O_3$, $Y_2O_3$, $La_2O_3$, $Gd_2O_3$, $Dy_2O_3$, $Yb_2O_3$, $CaO$, $MgO$, $CeO_2$, $TeO_2$, and the like can be used, for example. One or more nitrides selected from C—N, Ti—N, Zr—N, Nb—N, Ta—N, Si—N, Ge—N, Cr—N, Al—N, Ge—Si—N, Ge—Cr—N, and the like can be used as well. Sulfides such as ZnS, carbides such as SiC, fluorides such as $LaF_3$ and $CeF_3$, and C also can be used as materials for the first dielectric layer 102. Furthermore, the first dielectric layer 102 also can be made of a mixture containing one or more materials selected from the above-mentioned materials. For example, ZnS—$SiO_2$, which is a mixture of ZnS and $SiO_2$, is particularly excellent as a material of the first dielectric layer 102. This is because ZnS—$SiO_2$ is an amorphous material and has a high refractive index, high film formation rate, good mechanical characteristics, and good moisture resistance.

The thickness of the first dielectric layer 102 can be determined exactly by calculations based on a matrix method so that the following conditions are satisfied: a change in the amount of reflected light between when the first recording layer 4 is in the crystalline phase and when it is in the amorphous phase is large; the light absorption efficiency of the first recording layer 104 is high; and the transmittance of the first information layer 10 is large.

The first interface layer 103, which is provided if necessary, has a function of preventing mass transfer from occurring between the first dielectric layer 102 and the first recording layer 104 due to repeated recording. The first interface layer 103 also has a function of controlling the crystallization ability of the first recording layer 104, that is, promoting or suppressing crystallization thereof. Preferably, the first interface layer 103 is formed of a material that absorbs less light, has a melting point high enough to prevent it from melting during recording, and has good adhesion to the first recording layer 104. A melting point high enough to prevent melting during recording is a property required for the material to prevent it from melting into the first recording layer 104 when it is irradiated with the laser beam 1 of high power. When the material of the first interface layer 103 is mixed into the first recording layer 104, the composition of the first recording layer 104 changes, which deteriorates its rewriting performance significantly. Good adhesion to the first recording layer 104 is a property required for the material to ensure reliability.

The first interface layer 103 can be made of any of the materials that can be used for the first dielectric layer 102, that is, a material containing at least one selected from the above-mentioned oxides, nitrides, carbides, sulfides, and fluorides. Among such materials, a material containing Cr and O is particularly preferable because it promotes crystallization of the first recording layer 104. Among such materials, an oxide in which Cr and O form $Cr_2O_3$ is a more preferable material. This is because $Cr_2O_3$ is a material having good adhesion to the first recording layer 104.

As a material of the first interface layer 103, a material containing In and O also can be used particularly. Among such materials, an oxide in which In and O form $In_2O_3$ is a preferable material. This is because $In_2O_3$ is a material having good adhesion to the first recording layer 104.

As a material of the first interface layer 103, a material containing Ga and O also can be used particularly. Among such materials, an oxide in which Ga and O form $Ga_2O_3$ is a preferable material. This is because $Ga_2O_3$ is a material having good adhesion to the first recording layer 104.

Furthermore, the first interface layer 103 further may contain at least one element selected from Zr, Hf, and Y, in addition to Cr and O, Ga and O, or In and O, and more preferably, these elements are contained as oxides. $ZrO_2$ and $HfO_2$ are transparent materials each having a high melting point at approximately 2700° C. to 2800° C. as well as a low thermal conductivity among oxides. Thus, these materials improve the repeated rewriting performance of an optical information recording medium. $Y_2O_3$ is a transparent material and has a function of stabilizing $ZrO_2$ and $HfO_2$. By using a mixture containing any one or more of these three types of oxides, a highly reliable first information layer 10 capable of exhibiting excellent repeated rewriting performance can be obtained, even if the first interface layer 103 is formed partially or fully in contact with the recording layer 104.

It is preferable that the content of $Cr_2O_3$, $Ga_2O_3$, or $In_2O_3$ in the first interface layer 103 is at least 10 mol % in order to ensure the adhesion to the first recording layer 104. Furthermore, the content of $Cr_2O_3$ in the first interface layer 103 is preferably 70 mol % or less in order to keep the amount of light absorbed by the first interface layer 103 at a low level. Light absorption tends to increase as the content of $Cr_2O_3$ increases.

A material further containing Si in addition to Cr, Ga, In, Zr, Hf, Y, and O may be used for the first interface layer 103. The first interface layer 103 containing Si as, for example, $SiO_2$ has high transparency, and thus the first information layer 10 capable of exhibiting excellent recording performance can be obtained. The content of $SiO_2$ in the first interface layer 103 is preferably at least 5 mol %. The content of $SiO_2$ is preferably 50 mol % or less in order to ensure adhesion to the first recording layer 104, and more preferably at least 10 mol % but not more than 40 mol %.

It is desirable that the thickness of the first interface layer 103 is in the range of 0.5 nm to 15 nm in order to prevent the difference in the amount of reflected light between before and after recording on the first information layer 10 from decreasing due to light absorption in the first interface layer 103. More preferably, the thickness is in the range of 1 nm to 10 nm.

The first recording layer 104 is made of a material that undergoes a phase change between a crystalline phase and an amorphous phase when it is irradiated with the laser beam 1. In this case, as a material of the first recording layer 104, materials containing any one of Ge—Te, (Ge—Sn)Te, GeTe—$Sb_2Te_3$, (Ge—Sn)Te—$Sb_2Te_3$, GeTe—$Bi_2Te_3$, (Ge—Sn)Te—$Bi_2Te_3$, GeTe—(Sb—Bi)$_2$Te$_3$, (Ge—Sn)Te—(Sb—Bi)$_2$Te$_3$, GeTe—(Bi—In)$_2$Te$_3$, and (Ge—Sn)Te—(Bi—In)$_2$Te$_3$ can be used. Furthermore, as a material of the first recording layer 104, materials containing any one of Sb—Ga, (Sb—Te)—Ga, Sb—Ge, (Sb—Te)—Ge, Sb—In, (Sb—Te)—In, Sb—Mn—Ge, Sb—Sn—Ge, Sb—Mn—Sn—Ge, and (Sb—Te)—Ag—In also can be used.

Among these materials, for example, a material containing Ge, Te, and at least one element selected from Sb, Bi, In, and Sn can be used suitably. In this case, the first recording layer 104 may contain at least 50 atom % of Te. In the case where the first recording layer 104 is made of a material containing Sb, it may contain at least 70 atom % of Sb.

In order to allow the amount of laser light required for recording/reproduction to reach the information layer disposed beyond the first information layer 10 relative to the incident side of the laser beam 1, the first information layer 10 needs to have a high transmittance. For this reason, the thickness of the first recording layer 104 is preferably 9 nm or less, and more preferably 8 nm or less.

The first recording layer 104 also may be formed as a recording body having a layered structure of at least two types of layers selected from a layer containing Te, a layer containing Bi, a layer containing Ge, a layer containing Sb, a layer containing Ge—Te, a layer containing Bi—Te, a layer containing Sb—Ge, and the like. In the present specification, a material represented as "(element A)-(element B)" is a material containing the elements A and B as components thereof, that is, a mixture or an alloy of the elements A and B. For example, in a phase-change optical information recording medium including a layered structure of a layer containing Bi having a relatively high crystallization rate and a layer containing Ge—Te having a relatively stable amorphous phase, the recording sensitivity and erasing performance can be controlled easily.

Examples of the layered structure include $Bi_2Te_3$ (3 nm)/GeTe (4 nm), (Bi—In)$_2$Te$_3$ (3 nm)/(GeSn)Te (4 nm), GeTe—$Bi_2Te_3$ (5 nm)/(GeSn)Te (2 nm), and Sb—Ge (4 nm)/Sb—Te (3 nm). It also is possible, of course, to use a layer made of a material other than the materials listed above, or employ a structure in which a layer has a thickness other than the thicknesses exemplified above or a structure in which layers are stacked in the reverse order. For example, by considering the thickness of each layer exemplified above as a preferable thickness ratio, the thickness of each layer may be increased to two to four times the above thickness according to a desired thickness of the recording body.

The first recording layer 104 may be made of a material that undergoes an irreversible phase change. For example, the first recording layer 104 may be made of a material represented by Te—O, Te—Pd—O, Bi—O, or Sb—O. In this case, the thickness of the first recording layer 104 is preferably 30 nm or less.

The first recording layer 104 also may be a layered film (for example, a layered structure of Cu/Si) made of a material that undergoes an irreversible alloying.

The second dielectric layer 106 has functions of adjusting the optical distance so as to enhance the light absorption efficiency of the first recording layer 104, and increasing a difference in the amount of reflected light between before and after recoding so as to increase the signal intensity. The second dielectric layer 106 can be formed using a material of the same line as the material of the first dielectric layer 102. The thickness of the second dielectric layer 106 is preferably in the range of 0.5 nm to 75 nm, and more preferably in the range of 1 nm to 40 nm. By selecting the thickness of the second dielectric layer 106 in this range, it is possible to diffuse heat generated in the first recording layer 104 effectively to the first reflective layer 108.

A second interface layer (not shown) may be disposed between the first recording layer 104 and the second dielectric layer 106. In the case where the second interface layer is disposed in the optical information recording medium 9 shown in FIG. 1, the second interface layer can be shown as, for example, a layer indicated with a reference numeral 105 between the layer indicated with a reference numeral 104 and the layer indicated with a reference numeral 106 (the second interface layer is not shown in FIG. 1, but it is explained as a "second interface layer 105" for the sake of convenience in the present specification). Like the first interface layer 103, the second interface layer 105 can be provided to prevent mass transfer from occurring between the second dielectric layer 106 and the first recording layer 104 due to repeated recording. The second interface layer 105 can be formed using a material along the same lines as the material of the first dielectric layer 102. Among such materials, it is preferable to use a material containing In and O particularly. Among such materials, an oxide in which In and O form $In_2O_3$ is a preferable material. The second interface layer 105 also can be formed using a material containing Cr and O particularly. Among such materials, an oxide in which Cr and O form $Cr_2O_3$ is a preferable material. The second interface layer 105 also can be formed using a material containing Ga and O particularly. Among such materials, an oxide in which Ga and O form $Ga_2O_3$ is a preferable material.

Like the first interface layer 103, the second interface layer 105 further may contain at least one element selected from Zr, Hf, and Y, in addition to In and O, Cr and O, or Ga and O. The second interface layer 105 further may contain Si in addition to In, Cr, Ga, Zr, Hf, Y, and O. Since the second interface layer 105 tends to have poorer adhesion than the first interface layer 104, the lower limit of a preferable content of $In_2O_3$, $Cr_2O_3$, or $Ga_2O_3$ in the second interface layer 105 is 20 mol %, which is greater than that in the first interface layer 103.

It is desirable that the thickness of the second interface layer 105 is in the range of 0.5 nm to 15 nm as in the case of the first interface layer 103, and more preferably, it is in the range of 1 nm to 10 nm.

The first reflective layer 108 has an optical function of increasing the amount of light absorbed by the first recording layer 104. The first reflective layer 108 also has a thermal function of diffusing heat generated in the first recording layer 104 quickly so that the first recording layer 104 becomes amorphous easily. Furthermore, the first reflective layer 108 also has a function of protecting the multi-layer film from the surrounding environment.

As a material of the first reflective layer 108, for example, a single metal such as Ag, Au, Cu, and Al having high thermal conductivity can be used. Alloys such as Al—Cr, Al—Ti, Al—Ni, Al—Cu, Au—Pd, Au—Cr, Ag—Cu, Ag—Pd, Ag—Pd—Cu, Ag—Pd—Ti, Ag—Ru—Au, Ag—Cu—Ni, Ag—Zn—Al, Ag—Nd—Au, Ag—Nd—Cu, Ag—Bi, Ag—Ga, Ag—Ga—In, Ag—Ga—Cu, Ag—In, Ag—In—Sn, and Cu—Si also can be used. Particularly, an Ag alloy containing at least 50 atom % of Ag is preferable as a material for the first reflective layer 108 because of its high thermal conductivity. In order to increase the transmittance of the first information layer 10 as much as possible, the thickness of the first reflective layer 108 is preferably 15 nm or less, and more preferably 10 nm or less. When the thickness of the first reflective layer 108 is within this range, its heat diffusion function is sufficiently high, and the reflectance of the first information layer 10 can be ensured, and further the first information layer 10 has a sufficiently high transmittance.

In the optical information recording medium 9 of the present embodiment, the transmittance adjusting layer 109 is made of a dielectric material and has a function of adjusting the transmittance of the first information layer 10. This transmittance adjusting layer 109 makes it possible to increase both the transmittance $T_{c1}$(%) of the first information layer 10 obtained when the first recording layer 104 is in the crystalline phase and the transmittance $T_{a1}$(%) of the first information layer 10 obtained when the first recording layer 104 is in the amorphous phase. Specifically, in the first information layer 10 including the transmittance adjusting layer 109, the transmittance is increased by about 2% to 10% compared with the case where the transmittance adjusting layer 109 is not included. Furthermore, the transmittance adjusting layer 109 also has a function of diffusing effectively heat generated in the first recording layer 104.

It is preferable that the material of the transmittance adjusting layer 109 includes at least W and O. In this case, it is preferable that W and O form a compound in the form of an oxide $WO_3$. This is because the oxide $WO_3$ has a high melting point of 1470° C. and is stable in the air. Since the transmittance adjusting layer 109 contains such a material, a transmittance adjusting layer having a high film formation rate that is not dependent on the degree of vacuum in a film forming chamber can be provided. The transmittance adjusting layer 109 also can be formed of a material that further contains M1, where M1 is at least one element selected from Ce, Nb, and Ti. In this case, the transmittance adjusting layer 109 may contain a material represented by the following formula (1):

$$W_{a1}M1_{b1}O_{100-a1-b1} \text{ (atom \%)} \qquad (1)$$

where a1 and b1 satisfy 0<a1<30 and 0<b1<29, respectively. Among the materials represented by the formula (1), materials in which a1 satisfies 10<a1<22 and b1 satisfies 5<b1<23 are used suitably. From another aspect, the transmittance adjusting layer 109 may contain a material represented by the following formula (2):

$$(WO_3)_{100-c1}(D1)_{c1} \text{ (mol \%)} \qquad (2)$$

where D1 is at least one compound selected from $CeO_2$, $Nb_2O_5$, and $TiO_2$, and c1 satisfies 0<c1≦95. Among the materials represented by the formula (2), materials in which c1 satisfies 50≦c1≦80 are used suitably.

The use of the materials mentioned above makes it possible to increase the refractive index of the transmittance adjusting layer 109 and further to increase the transmittance of the first information layer 10.

The transmittance adjusting layer 109 also can be formed of a material that further contains M2 in addition to W and O, where M2 is at least one element selected from Ag, Bi, Mg, Mn, Y, Zn, and Zr. In this case, the transmittance adjusting layer 109 may contain at least one compound (composite oxide) selected from $Ag_2WO_4$, $Bi_2WO_6$, $MgWO_4$, $MnWO_4$, $Y_2W_3O_{12}$, $ZnWO_4$, and $ZrW_2O_8$. Furthermore, the transmittance adjusting layer 109 may contain a material represented by the following formula (3):

$$W_{a2}M2_{b2}O_{100-a2-b2} \text{ (atom \%)} \qquad (3)$$

where a2 and b2 satisfy 0<a2<30 and 0<b2<35, respectively. The transmittance adjusting layer 109 may contain a material represented by the following formula (4):

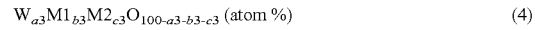

$$W_{a3}M1_{b3}M2_{c3}O_{100-a3-b3-c3} \text{ (atom \%)} \qquad (4)$$

where a3, b3, and c3 satisfy 0<a3<30, 4<b3<16, and 3<c3<22, respectively. Thereby, it is possible to increase the stability of the transmittance adjusting layer 109, and thus to provide the optical information recording medium 9 having high mass productivity and provided with the first information layer 10 having a high transmittance.

The above-mentioned materials have high refractive indices (n=2.4 to 2.8) and small extinction coefficients (k=0.0 to 0.05). By forming the transmittance adjusting layer 109 using these materials, the transmittance of the first information layer 10 can be increased further.

Preferably, the refractive index $n_t$ and extinction coefficient $k_t$ of the transmittance adjusting layer 109 satisfy $2.0 \leq n_t$ and $k_t \leq 0.1$ in order to enhance the effect of increasing the transmittances $T_{c1}$ and $T_{a1}$ of the first information layer 10, and more preferably, they satisfy $2.4 \leq n_t \leq 3.0$ and $k_t \leq 0.05$.

It is preferable that the thickness d1 of the transmittance adjusting layer 109 is in the range of $(3/32)\lambda/n_t \leq d1 \leq (5/32)\lambda/n_t$. When the wavelength $\lambda$ of the laser beam 1 and the refractive index $n_t$ of the transmittance adjusting layer 109 are selected so that they satisfy, for example, 350 nm $\leq \lambda \leq$ 450 nm and $2.0 \leq n_t \leq 3.0$, respectively, the preferable range of d1 is 9 nm $\leq$ d1 $\leq$ 30 nm. The selection of d1 in this range makes it possible to increase both the transmittances $T_{c1}$ and $T_{a1}$ of the first information layer 10.

In order to allow the amount of laser light required for recording/reproduction to reach the information layer disposed beyond the first information layer 10 relative to the incident side of the laser beam 1, the transmittances $T_{c1}$ and $T_{a1}$ of the first information layer 10 preferably satisfy $40 < T_{c1}$ and $40 < T_{a1}$, respectively, and more preferably they satisfy $46 < T_{c1}$ and $46 < T_{a1}$, respectively.

Preferably, the transmittances $T_{c1}$ and $T_{a1}$ of the first information layer 10 satisfy $-5 \leq (T_{c1} - T_{a1}) \leq 5$, and more preferably they satisfy $-3 \leq (T_{c1} - T_{a1}) \leq 3$. When $T_{c1}$ and $T_{a1}$ satisfy these conditions, changes in the transmittance due to the state of the first recording layer 104 in the first information layer 10 have little influence when recording/reproduction is performed on/from the information layer disposed beyond the first information layer 10 relative to the incident side of the laser beam 1, and thereby good recording/reproducing characteristics can be obtained.

Preferably, a reflectance $R_{c1}$(%) of the first information layer 10 obtained when the first recording layer 104 is in the crystalline phase and a reflectance $R_{a1}$(%) of the first information layer 10 obtained when the first recording layer 104 is in the amorphous phase satisfy $R_{a1} < R_{c1}$. This allows the reflectance to be high in the initial state in which information has not been recorded yet, thereby allowing a stable recording/reproducing operation to be performed. Furthermore, in order to obtain good recording/reproduction characteristics by increasing a difference in reflectance $(R_{c1} - R_{a1})$, $R_{c1}$ and $R_{a1}$ preferably satisfy $0.1 \leq R_{a1} \leq 5$ and $4 \leq R_{c1} \leq 15$, respectively, and more preferably they satisfy $0.1 \leq R_{a1} \leq 3$ and $4 \leq R_{c1} \leq 10$, respectively.

The optical information recording medium 9 can be manufactured by the method described below.

First, (N−1) information layers (an N-th information layer 7 to a second information layer 4) are formed sequentially on a substrate 8 (whose thickness is 1.1 mm, for example) with respective intermediate layers (including intermediate layers 6, 5, etc.) being interposed therebetween. Each of the information layers is formed of a single-layer film or a multi-layer film. Each layer of the information layer can be formed by sputtering targets to be used as materials sequentially in a film forming apparatus. The intermediate layer can be formed by applying a photo-curable resin (especially an acrylic resin or an ultraviolet curable resin) or slow-acting thermosetting resin onto the information layer, rotating the substrate 8 to spread the resin uniformly (spin coating), and then curing the resin. In order to provide guide grooves on the intermediate layer for guiding the laser beam 1, a substrate (mold) having grooves formed thereon is attached tightly to the resin before being cured, the substrate 8 and the substrate (mold) attached to the substrate 8 are rotated for spin-coating, the resin is cured, and then the substrate (mold) is peeled off. Thus, the guide grooves can be formed on the intermediate layer. The intermediate layer can be formed by using not only the above-mentioned spin-coating method but also a printing technique such as, for example, screen printing and ink-jet printing applied to microfabrication technology.

Thus, the (N−1) information layers are formed on the substrate 8 with the respective intermediate layers being interposed therebetween, and then the intermediate layer 3 (whose thickness is 10 μm, for example) further is formed thereon.

Subsequently, the first information layer 10 is formed on the intermediate layer 3. Specifically, the substrate 8, on which the (N−1) information layers are formed with the respective intermediate layers being interposed therebetween and the intermediate layer 3 further is formed, is placed in the film forming apparatus, where the transmittance adjusting layer 109 is formed on the intermediate layer 3. The transmittance adjusting layer 109 containing W and O can be formed by sputtering a sputtering target containing at least W and O in an atmosphere of a rare gas (especially Ar gas) or a mixed gas atmosphere of a rare gas and a reactive gas (especially $O_2$ gas) with a radio frequency (RF) power source. The transmittance adjusting layer 109 containing W and O also can be formed by sputtering a sputtering target containing at least W in an atmosphere of a gas containing at least O (such as, for example, a mixed gas of a rare gas and $O_2$ gas) with a RF power source.

Furthermore, the transmittance adjusting layer 109 can be formed by sputtering a sputtering target whose composition is adjusted so that the composition contains or consists only of the material represented by any one of the above formulas (1) to (4) with a single power source. For example, in order to form the transmittance adjusting layer 109 having a composition of $(WO_3)_{50}(TiO_2)_{50}$ (mol %), a film is formed in an Ar gas atmosphere or a mixed gas atmosphere of Ar gas and $O_2$ gas by using a sputtering target having a composition of, for example, $(WO_3)_{50}(TiO_2)_{50}$ (mol %). Thus, the transmittance adjusting layer 109 having such a composition can be formed. The actual composition of the film thus formed can be analyzed with, for example, an X-ray microanalyzer to see whether the composition is a desired one. A sputtering apparatus tends to cause oxygen deficiency of an oxide in the film or to increase the amount of oxygen in the film, and thereby a desired composition may not be obtained. Therefore, if a sputtering target composition is adjusted previously or the amount of $O_2$ gas mixed with Ar gas is adjusted, the desired film composition can be obtained.

In order to increase the film formation rate, it is preferable to impart conductivity to a sputtering target by adding a trace amount of conductive material to a material to form the transmittance adjusting layer 109 and to sputter the sputtering target with a direct-current (DC) power source or a pulse DC power source.

The transmittance adjusting layer 109 also can be formed by sputtering sputtering targets each made of a different single compound simultaneously with a plurality of power sources. The transmittance adjusting layer 109 also can be formed by sputtering targets such as a binary target and a ternary target each made of a mixture of two or more compounds simultaneously with a plurality of power sources. Even when these sputtering targets are used, sputtering can be performed in a rare gas atmosphere or a mixed gas atmosphere of a rare gas and a reactive gas (especially O₂ gas).

Subsequently, the first reflective layer 108 is formed on the transmittance adjusting layer 109. The first reflective layer 108 can be formed by sputtering a sputtering target made of a metal or an alloy to form the first reflective layer 108 in an atmosphere of a rare gas (for example, Ar gas) or a mixed gas atmosphere of a rare gas and a reactive gas (for example, at least one gas selected from $O_2$ gas and $N_2$ gas) with a DC power source, a pulse DC power source, or a RF power source. Since the first reflective layer 108 is made of a metal or an alloy, it is preferable to perform sputtering with a DC power source or a pulse DC power source to increase the film formation rate.

Subsequently, the second dielectric layer 106 is formed on the first reflective layer 108. The second dielectric layer 106 can be formed by sputtering a sputtering target of a compound to form the second dielectric layer 106 in a rare gas atmosphere or in a mixed gas atmosphere of a rare gas and a reactive gas (especially $O_2$ gas) with a RF power source. In order to increase the film formation rate, it is also possible to impart conductivity to a sputtering target by adding a trace amount of conductive material to a material to form the second dielectric layer 106 and to sputter the sputtering target with a direct current (DC) power source or a pulse DC power source. The second dielectric layer 106 also can be formed by performing reactive sputtering of a sputtering target made of a metal to form the second dielectric layer 106 in a mixed gas atmosphere of a rare gas and a reactive gas with a DC power source, a pulse DC power source, or a RF power source.

The second dielectric layer 106 also can be formed by sputtering targets each made of a different single compound simultaneously with a plurality of power sources. The second dielectric layer 106 also can be formed by sputtering targets such as a binary target and a ternary target each made of a mixture of two or more compounds simultaneously with a plurality of power sources. Even when these sputtering targets are used, sputtering can be performed in a rare gas atmosphere or a mixed gas atmosphere of a rare gas and a reactive gas (especially $O_2$ gas).

Subsequently, the second interface layer 105 is formed on the second dielectric layer 106, if necessary. The second interface layer 105 can be formed in the same manner as in the case of the second dielectric layer 106.

Subsequently, the first recording layer 104 is formed on the second dielectric layer 106 or the second interface layer 105. The first recording layer 104 can be formed by sputtering, for example, a sputtering target containing Ge, Te, and at least one element selected from Sb, Bi, In, and Sn and containing at least 50 atom % of Te or a sputtering target containing Ge, Te, and at least one element selected from Sb, Bi, In, and Sn and containing at least 70 atom % of Sb, with a single power source. The first recording layer 104 also can be formed by sputtering at least two sputtering targets selected from, for example, a sputtering target containing Te, a sputtering target containing Bi, a sputtering target containing Ge, a sputtering target containing Sb, a sputtering target containing Ge—Te, a sputtering target containing Bi—Te, a sputtering target containing Sb—Ge, and the like, simultaneously with two or more power sources. In this case, the composition of the recording layer to be obtained is determined according to the types and number of the sputtering targets to be used as well as the output power levels of the power sources. Therefore, it is preferable to select these factors suitably to obtain the first recording layer 104 having a desired composition. The use of two or more types of sputtering targets as described above is useful, for example, when it is difficult to form a sputtering target made of a mixture.

In the case where the first recording layer 104 is formed as a recording body having a layered structure of at least two layers, it also can be formed by sputtering at least two sputtering targets selected from, for example, a sputtering target containing Te, a sputtering target containing Bi, a sputtering target containing Ge, a sputtering target containing Sb, a sputtering target containing Ge—Te, a sputtering target containing Bi—Te, a sputtering target containing Sb—Ge, and the like, sequentially and/or simultaneously with two or more power sources. In other words, in order to form the recording body, sputtering may be performed twice or more using at least two sputtering targets, or at least two sputtering targets may be sputtered simultaneously.

As an atmosphere gas for sputtering, a rare gas or a mixed gas of a rare gas and a reactive gas (for example, at least one selected from $N_2$ gas and $O_2$ gas) can be used in either case where the first recording layer 104 of a single-layer structure is formed, or where the first recording layer 104 is formed as a recording body having a layered structure of at least two layers. As a power source for sputtering, any of a DC power source, a pulse DC power source and a RF power source can be used.

Subsequently, the first interface layer 103 is formed on the first recording layer 104. The first interface layer 103 can be formed in the same manner as in the case of the second dielectric layer 106.

Subsequently, the first dielectric layer 102 is formed on the first interface layer 103. The first dielectric layer 102 can be formed in the same manner as in the case of the second dielectric layer 106.

Finally, the transparent layer 2 is formed on the first dielectric layer 102. The transparent layer 2 can be formed by applying a photo-curable resin (especially an ultraviolet curable resin) or a slow-acting thermosetting resin onto the first dielectric layer 102, subjecting it to spin coating, and then curing the resin. As the transparent layer 2, a disk-shaped transparent substrate may be used. The substrate is made of a resin such as polycarbonate, amorphous polyolefin, and PMMA, or glass. In this case, the transparent layer 2 can be formed by applying a resin such as a photo-curable resin (especially an ultraviolet curable resin) or a slow-acting thermosetting resin onto the first dielectric layer 102, attaching the substrate tightly onto the first dielectric layer 102 and subjecting them to spin coating, and then curing the resin. Alternatively, an adhesive resin may be applied uniformly onto the substrate ahead of time, which is attached tightly to the first dielectric layer 102.

After the first dielectric layer 102 is formed or after the transparent layer 2 is formed, an initialization process for crystallizing the entire surface of the first recording layer 104 may be carried out, if necessary. The first recording layer 104 can be crystallized by irradiation with a laser beam.

The optical information recording medium 9 can be manufactured in the manner as described above. In the present embodiment, sputtering is employed as a film forming method for each of the layers, but the method is not limited thereto, and it also is possible to employ, for example, vacuum vapor deposition, ion plating, CVD, or MBE. The information layers other than the first information layer 10 may be formed in the same manner as in the case of the first information layer 10.

Embodiment 2

Figure 2:
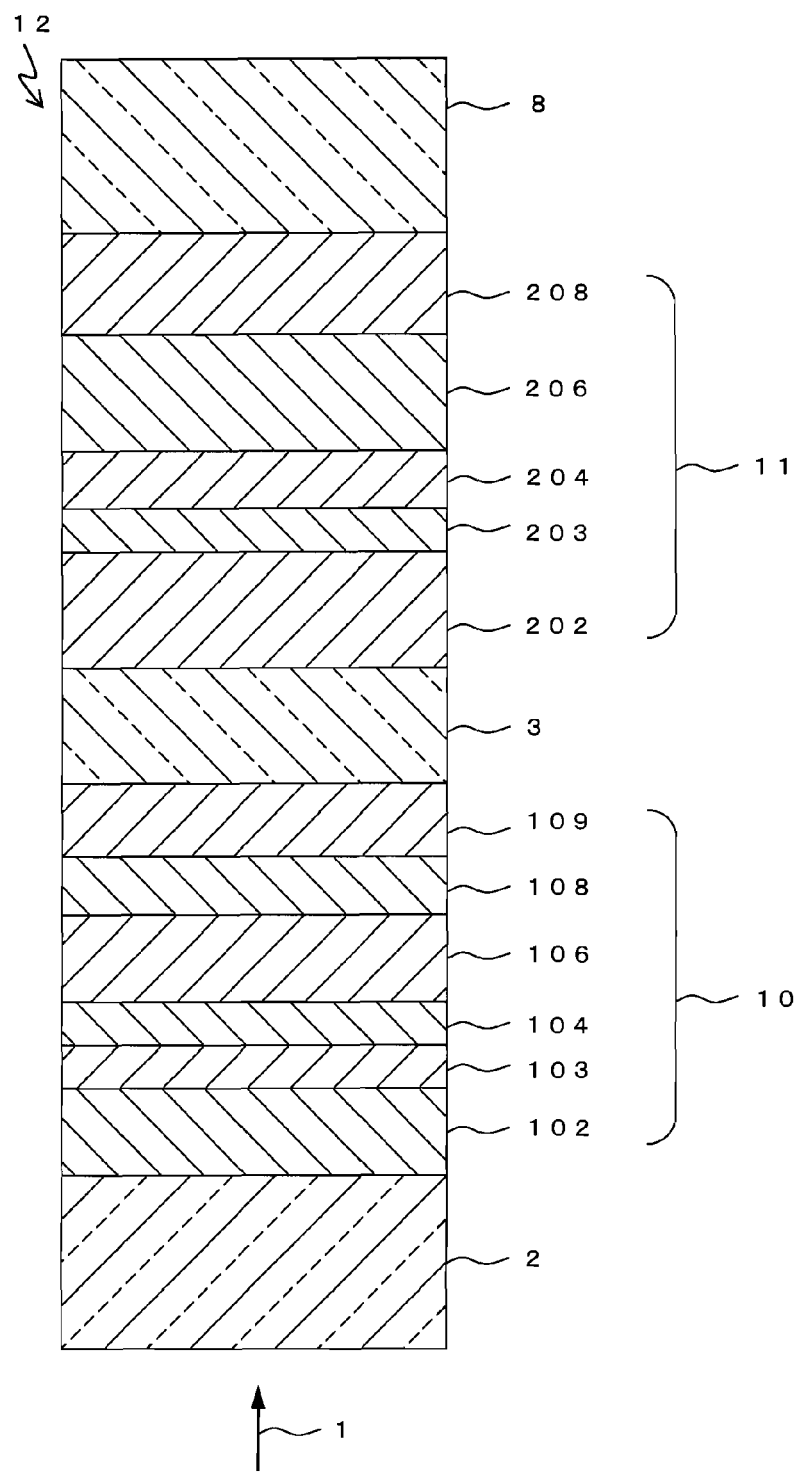
FIG. 2 is a partial cross-sectional view showing an example of a layered structure of an optical information recording medium of the present invention including two information layers.

In Embodiment 2, an example of an optical information recording medium will be described, in which the multi-layer optical information recording medium according to Embodiment 1 of the present invention is provided with two information layers, that is, N=2. FIG. 2 shows a partial cross-sectional view of an optical information recording medium 12 according to Embodiment 2. The optical information recording medium 12 is a two-layer optical information recording medium on/from which information can be recorded/reproduced by a laser beam 1 irradiated from one side of the medium.

The optical information recording medium 12 includes a substrate 8, and a second information layer 11, an intermediate layer 3, a first information layer 10, and a transparent layer 2 that are formed sequentially on the substrate 8. The substrate 8, the intermediate layer 3, the first information layer 10, and the transparent layer 2 can be formed of the same materials as those of the corresponding layers described in Embodiment 1. The layers of the optical information recording medium 12 have the same shapes and functions as those of the corresponding layers described in Embodiment 1. In the present embodiment, the first information layer 10 corresponds to the L-th information layer in the optical information recording medium of the present invention. In the case where a plurality of layers having the same functions are provided in the optical information recording medium of the present embodiment, they are distinguished from each other by referring to them as a first layer, a second layer, . . . from the incident side of the laser beam 1, for the sake of explanation.

The structure of the second information layer 11 will be described below in detail.

The second information layer 11 includes a third dielectric layer 202, a third interface layer 203, a second recording layer 204, a fourth dielectric layer 206, and a second reflective layer 208, which are disposed in this order from the incident side of the laser beam 1. Information is recorded/reproduced on/from the second information layer 11 by the laser beam 1 that has passed through the transparent layer 2, the first information layer 10, and the intermediate layer 3.

The third dielectric layer 202 can be formed of the same material as that of the first dielectric layer 102 described in Embodiment 1. The third dielectric layer 202 has the same functions as those of the first dielectric layer 102 of Embodiment 1.

The thickness of the third dielectric layer 202 can be determined exactly by calculations based on a matrix method so that the condition that a change in the amount of reflected light between when the second recording layer 204 is in the crystalline phase and when it is in the amorphous phase is large is satisfied.

The third interface layer 203 can be formed of the same material as that of the first interface layer 103 of Embodiment 1. The third interface layer 203 has the same functions and shape as those of the first interface layer 103 of Embodiment 1.

The second recording layer 204 can be formed of the same material as that of the first recording layer 104 of Embodiment 1. In the case where the second recording layer 204 is made of a material that undergoes a reversible phase change, the thickness thereof is preferably in the range of 6 nm to 15 nm in order to increase the recording sensitivity of the second information layer 11. When the second recording layer 204 has a large thickness even if it is in the above range, it may have a significant thermal influence on the adjacent areas due to the diffusion of heat in the in-plane direction in the areas. When the second recording layer 204 is thin, the reflectance of the second information layer 11 may be reduced. Accordingly, it is more preferable that the thickness of the second recording layer 204 is in the range of 8 nm to 13 nm. In the case where the second recording layer 204 is made of a material (for example, Te—Pd—O) that undergoes an irreversible phase change, the thickness thereof is preferably in the range of 10 nm to 40 nm.

The fourth dielectric layer 206 can be formed of the same material as that of the second dielectric layer 106 of Embodiment 1. The fourth dielectric layer 206 has the same functions and shape as those of the second dielectric layer 106 of Embodiment 1.

A fourth interface layer may be disposed, if necessary, between the second recording layer 204 and the fourth dielectric layer 206. The fourth interface layer can be formed of the same material as that of the second interface layer 105 of Embodiment 1. The fourth interface layer has the same functions and shape as those of the second interface layer 105 of Embodiment 1. In the case where the fourth interface layer is disposed in the optical information recording medium 12 shown in FIG. 2, the fourth interface layer can be shown as, for example, a layer indicated with a reference numeral 205 between the layer indicated with a reference numeral 204 and the layer indicated with a reference numeral 206 (the fourth interface layer is not shown in FIG. 2, but it is explained as a "fourth interface layer 205" for the sake of convenience in the present specification).

The second reflective layer 208 can be formed of the same material as that of the first reflective layer 108 of Embodiment 1. The second reflective layer 208 has the same functions as those of the first reflective layer 108 of Embodiment 1. The thickness of the second reflective layer 208 is preferably at least 30 nm, at which the second reflective layer 208 can exhibit its thermal diffusion function sufficiently. When the second reflective layer 208 has a thickness larger than 200 nm even if it is in the above range, it exhibits the thermal diffusion function excessively and thereby the recording sensitivity of the second information layer 11 decreases. Accordingly, it is more preferable that the thickness of the second reflective layer 208 is in the range of 30 nm to 200 nm.

An interface layer further may be disposed between the second reflective layer 208 and the fourth dielectric layer 206. In the case where such an interface layer is disposed in the optical information recording medium 12 shown in FIG. 2, the interface layer may be formed as a layer indicated with a reference numeral 207 between the layer indicated with a reference numeral 208 and the layer indicated with a reference numeral 206. In this case, as a material to form the interface layer 207 (the interface layer is not shown in FIG. 2, but it is explained as an "interface layer 207" for the sake of convenience in the present specification), a material having a thermal conductivity lower than that of the materials described for the second reflective layer 208 can be used. In the case where an Ag alloy is used as a material of the second reflective layer 208, Al or an Al alloy, for example, can be used as a material of the interface layer 207.

As a material of the interface layer 207, elements such as Cr, Ni, Si, and C, as well as oxides such as $TiO_2$, $ZrO_2$, $HfO_2$, ZnO, $Nb_2O_5$, $Ta_2O_5$, $SiO_2$, $SnO_2$, $Al_2O_3$, $Bi_2O_3$, $Cr_2O_3$, $Ga_2O_3$, $In_2O_3$, $Sc_2O_3$, $Y_2O_3$, $La_2O_3$, $Gd_2O_3$, $Dy_2O_3$, $Yb_2O_3$, CaO, MgO, $CeO_2$, and $TeO_2$ can be used. Nitrides such as C—N, Ti—N, Zr—N, Nb—N, Ta—N, Si—N, Ge—N, Cr—N, Al—N, Ge—Si—N, and Ge—Cr—N and can be used as well. Sulfides such as ZnS, carbides such as SiC, fluorides such as $LaF_3$ and $CeF_3$, and C also can be used. Furthermore, the interface layer 207 also can be made of a mixture containing one or more materials selected from the above-mentioned materials. The thickness of the interface layer 207 is preferably in the range of 3 nm to 100 nm, and more preferably in the range of 10 nm to 50 nm.

Preferably, a reflectance $R_{c2}$(%) of the second information layer 11 obtained when the second recording layer 204 is in the crystalline phase and a reflectance $R_{a2}$(%) of the second information layer 11 obtained when the second recording layer 204 is in the amorphous phase satisfy $R_{a2}<R_{c2}$. When this relationship is satisfied, a high reflectance can be obtained in the initial state in which information has not been recorded yet, and thereby a stable recording/reproducing operation can be performed. Furthermore, in order to obtain good recording/reproduction characteristics by increasing a difference in reflectance ($R_{c2}-R_{a2}$), the reflectances $R_{c2}$ and $R_{a2}$ preferably satisfy $0.2 \leq R_{a2} \leq 10$ and $12 \leq R_{c2} \leq 40$, respectively, and more preferably they satisfy $0.2 \leq R_{a2} \leq 5$ and $12 \leq R_{c2} \leq 30$, respectively.

The optical information recording medium 12 can be manufactured by the method described below.

First, the second information layer 11 is formed. Specifically, a substrate 8 (whose thickness is 1.1 mm, for example) is prepared and disposed in a film forming apparatus.

Subsequently, the second reflective layer 208 is formed on the substrate 8. In the case where guide grooves for guiding the laser beam 1 are formed on the substrate 8, the second reflective layer 208 is formed on the side of the substrate 8 on which the guide grooves are formed. The second reflective layer 208 can be formed in the same manner as in the case of the first reflective layer 108 of Embodiment 1.

Subsequently, an interface layer 207 is formed on the second reflective layer 208, if necessary. The interface layer 207 can be formed in the same manner as in the case of the first reflective layer 108 or the second dielectric layer 106 of Embodiment 1.

Subsequently, the fourth dielectric layer 206 is formed on the second reflective layer 208 or the interface layer 207. The fourth dielectric layer 206 can be formed in the same manner as in the case of the second dielectric layer 106 of Embodiment 1.

Subsequently, the fourth interface layer 205 is formed on the fourth dielectric layer 206, if necessary. The fourth interface layer 205 can be formed in the same manner as in the case of the second dielectric layer 106 of Embodiment 1.

Subsequently, the second recording layer 204 is formed on the fourth dielectric layer 206 or the fourth interface layer 205. By using a sputtering target suitable for its composition, the second recording layer 204 can be formed in the same manner as in the case of the first recording layer 104 of Embodiment 1.

Subsequently, the third interface layer 203 is formed on the second recording layer 204, if necessary. The third interface layer 203 can be formed in the same manner as in the case of the second dielectric layer 106 of Embodiment 1.

Subsequently, the third dielectric layer 202 is formed on the second recording layer 204 or the third interface layer 203. The third dielectric layer 202 can be formed in the same manner as in the case of the second dielectric layer 106 of Embodiment 1.

The second information layer 11 is formed in this manner.

Subsequently, the intermediate layer 3 (whose thickness is 25 μm, for example) is formed on the third dielectric layer 202 of the second information layer 11. The intermediate layer 3 can be formed by applying a photo-curable resin (especially an acrylic ultraviolet curable resin) or a slow-acting thermosetting resin onto the third dielectric layer 202, subjecting it to spin coating, and then curing the resin. In order to provide guide grooves for guiding the laser beam 1 on the intermediate layer 3, a substrate (mold) having grooves formed thereon is attached tightly to the resin before being cured, the resin is cured, and then the substrate (mold) is peeled off. Thus, the guide grooves can be formed on the intermediate layer 3. The intermediate layer 3 can be formed by using not only the above-mentioned spin-coating method but also a printing technique such as, for example, screen printing and ink-jet printing applied to microfabrication technology.

After the third dielectric layer 202 is formed or after the intermediate layer 3 is formed, an initialization process for crystallizing the entire surface of the second recording layer 204 may be carried out, if necessary. The second recording layer 204 can be crystallized by irradiation with a laser beam.

Subsequently, the first information layer 10 is formed on the intermediate layer 3. Specifically, first, the transmittance adjusting layer 109, the first reflective layer 108, the second dielectric layer 106, the first recording layer 104, the first interface layer 103 and the first dielectric layer 102 are formed in this order on the intermediate layer 3. In this case, the second interface layer 105 may be formed between the second dielectric layer 106 and the first recording layer 104, if necessary. The first interface layer 103 may be provided if necessary, and it does not always have to be provided. Each of these layers can be formed in the same manner as described in Embodiment 1.

Finally, the transparent layer 2 (whose thickness is 75 μm, for example) is formed on the first dielectric layer 102. The transparent layer 2 can be formed in the same manner as described in Embodiment 1.

After the first dielectric layer 102 is formed or after the transparent layer 2 is formed, an initialization process for crystallizing the entire surface of the first recording layer 104 may be carried out, if necessary. The first recording layer 104 can be crystallized by irradiation with a laser beam.

After the first dielectric layer 102 is formed or after the transparent layer 2 is formed, an initialization process for crystallizing the entire surfaces of the second recording layer 204 and the first recording layer 104 may be carried out, if necessary. In this case, if the crystallization of the first recording layer 104 is performed first, the laser power required for crystallizing the second recording layer 204 tends to increase. Therefore, it is preferable that the second recording layer 204 is crystallized first.

The optical information recording medium 12 can be manufactured in the manner as described above. In the present embodiment, sputtering is employed as a film forming method for each of the layers, but the method is not limited thereto, and it also is possible to employ, for example, vacuum vapor deposition, ion plating, CVD, or MBE.

Embodiment 3

Figure 3:
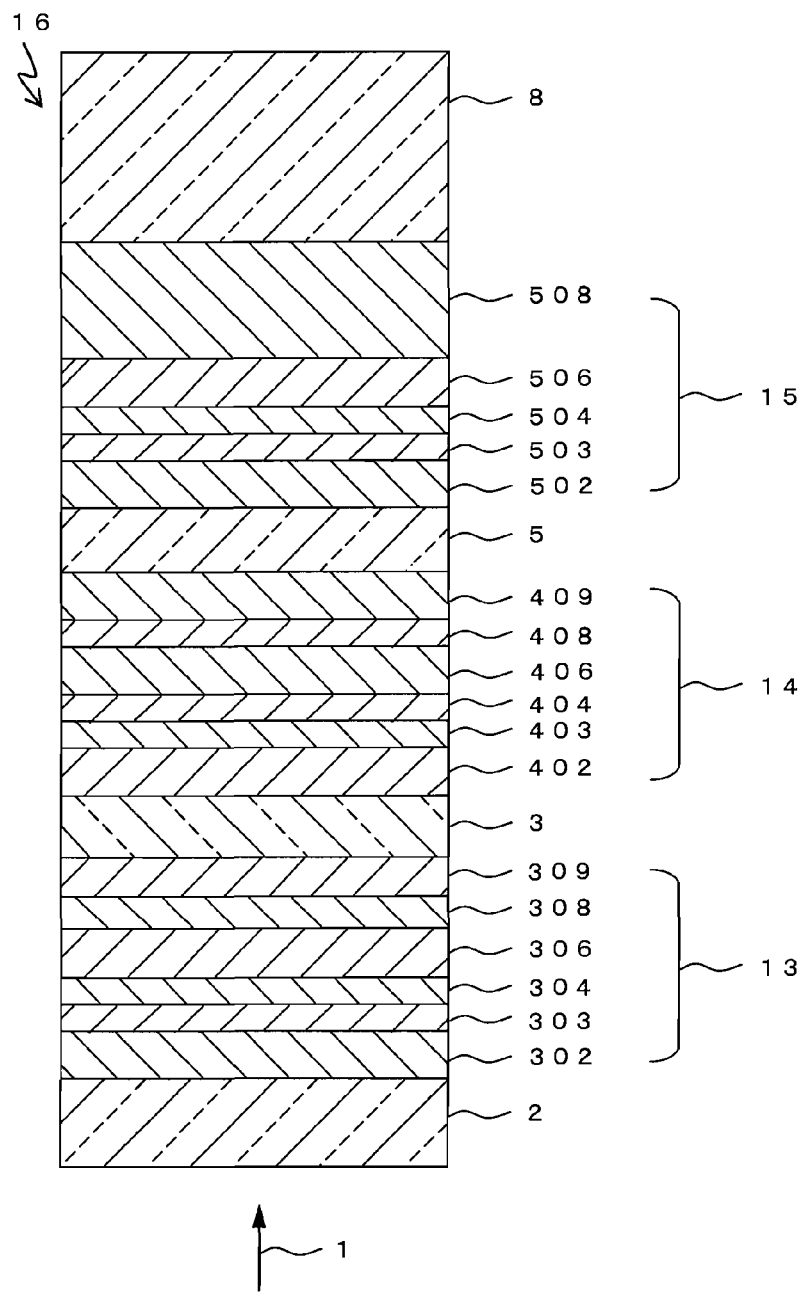
FIG. 3 is a partial cross-sectional view showing an example of a layered structure of an optical information recording medium of the present invention including three information layers.

In Embodiment 3, an example of an optical information recording medium will be described, in which the multi-layer optical information recording medium according to Embodiment 1 is provided with three information layers, that is, N=3. FIG. 3 shows a partial cross-sectional view of an optical information recording medium 16 according to Embodiment 3. The optical information recording medium 16 is a three-layer optical information recording medium on/from which information can be recorded/reproduced by a laser beam 1 irradiated from one side of the medium.

The optical information recording medium 16 includes a substrate 8, and a third information layer 15, an intermediate layer 5, a second information layer 14, an intermediate layer 3, a first information layer 13, and a transparent layer 2 that are formed sequentially on the substrate 8. The substrate 8, the intermediate layers 3 and 5, and the transparent layer 2 can be formed of the same materials as those of the corresponding layers described in Embodiments 1 and 2. These layers of the optical information recording medium 16 have the same shapes and functions as those of the corresponding layers described in Embodiments 1 and 2.

Hereinafter the structures of the third information layer 15, the second information layer 14, and the first information layer 13 are described in detail. In the present embodiment, the first information layer 13 and the second information layer 14 correspond to the L-th information layer in the optical information recording medium of the present invention. In the case where a plurality of layers having the same functions are provided in the optical information recording medium of the present embodiment, they are distinguished from each other by referring to them as a first layer, second layer, ... from the incident side of the laser beam 1, for the sake of explanation.

The third information layer 15 includes a fifth dielectric layer 502, a fifth interface layer 503, a third recording layer 504, a sixth dielectric layer 506, and a third reflective layer 508, which are disposed in this order from the incident side of the laser beam 1. The fifth interface layer 503 may be provided if necessary, and it does not always have to be provided. A sixth interface layer 505 further may be disposed between the third recording layer 504 and the sixth dielectric layer 506 (the sixth interface layer is not shown in FIG. 3, but it is explained as a "sixth interface layer 505" for the sake of convenience in the present specification). An interface layer 507 further may be disposed between the sixth dielectric layer 506 and the third reflective layer 508 (the interface layer 507 is not shown in FIG. 3, but it is explained as an "interface layer 507" for the sake of convenience in the present specification). Information is recorded/reproduced on/from the third information layer 15 by the laser beam 1 that has passed through the transparent layer 2, the first information layer 13, the intermediate layer 3, the second information layer 14, and the intermediate layer 5.

The fifth dielectric layer 502, the fifth interface layer 503, the third recording layer 504, the sixth interface layer 505, the sixth dielectric layer 506, the interface layer 507, and the third reflective layer 508 that constitute the third information layer 15, respectively, can be formed of the same materials as those of the third dielectric layer 202, the third interface layer 203, the second recording layer 204, the fourth interface layer 205, the fourth dielectric layer 206, the interface layer 207, and the second reflective layer 208 of the second information layer 11 of Embodiment 2. These layers of the third information layer 15 have the same shapes and functions as those of the corresponding layers described in Embodiment 2.

Preferably, a reflectance $R_{c3}$(%) of the third information layer 15 obtained when the third recording layer 504 is in the crystalline phase and a reflectance $R_{a3}$(%) of the third information layer 15 obtained when the third recording layer 504 is in the amorphous phase satisfy $R_{a3}<R_{c3}$. This allows the reflectance to be high in the initial state in which information has not been recorded yet, thereby allowing a stable recording/reproducing operation to be performed. Furthermore, in order to obtain good recording/reproduction characteristics by increasing a difference in reflectance ($R_{c3}-R_{a3}$), $R_{c3}$ and $R_{a3}$ preferably satisfy $1 \leq R_{a3} \leq 12$ and $16 \leq R_{c3} \leq 48$, respectively, and more preferably they satisfy $1 \leq R_{a3} \leq 6$ and $16 \leq R_{c3} \leq 32$, respectively.

The second information layer 14 includes a third dielectric layer 402, a third interface layer 403, a second recording layer 404, a fourth dielectric layer 406, a second reflective layer 408, and a second transmittance adjusting layer 409, which are disposed in this order from the incident side of the laser beam 1. The third interface layer 403 may be provided if necessary, and it does not always have to be provided. A fourth interface layer 405 may be disposed between the second recording layer 404 and the fourth dielectric layer 406 (the fourth interface layer is not shown in FIG. 3, but it is explained as a "fourth interface layer 405" for the sake of convenience in the present specification). Information is recorded/reproduced on/from the second information layer 14 by the laser beam 1 that has passed through the transparent layer 2, the first information layer 13, and the intermediate layer 3.

The third dielectric layer 402, the third interface layer 403, the second recording layer 404, the fourth interface layer 405, the fourth dielectric layer 406, the second reflective layer 408, and the second transmittance adjusting layer 409 that constitute the second information layer 14, respectively, can be formed of the same materials as those of the first dielectric layer 102, the first interface layer 103, the first recording layer 104, the second interface layer 105, the second dielectric layer 106, the first reflective layer 108, and the transmittance adjusting layer 109 of the first information layer 10 of Embodiment 1. These layers of the second information layer 14 have the same shapes and functions as those of the corresponding layers described in Embodiment 1.

In order to allow the amount of laser light required for recording/reproduction to reach the information layer disposed beyond the second information layer 14 relative to the incident side of the laser beam 1, a transmittance $T_{c2}$(%) of the second information layer 14 obtained when the second recording layer 404 is in the crystalline phase and a transmittance $T_{a2}$(%) of the second information layer 14 obtained when the second recording layer 404 is in the amorphous phase preferably satisfy $50<T_{c2}$ and $50<T_{a2}$, respectively, and more preferably they satisfy $55<T_{c2}$ and $55<T_{a2}$, respectively.

Preferably, the transmittances $T_{c2}$ and $T_{a2}$ of the second information layer 14 satisfy $-5 \leq (T_{c2}-T_{a2}) \leq 5$, and more preferably they satisfy $-3 \leq (T_{c2}-T_{a2}) \leq 3$. When $T_{c2}$ and $T_{a2}$ satisfy these conditions, changes in the transmittance due to the state of the second recording layer 404 in the second information layer 14 have little influence when recording/reproduction is performed on/from the information layer disposed beyond the second information layer 14 relative to the incident side of the laser beam 1, and thereby good recording/reproducing characteristics can be obtained.

Preferably, a reflectance $R_{c2}$(%) of the second information layer 14 obtained when the second recording layer 404 is in the crystalline phase and a reflectance $R_{a2}$(%) of the second information layer 14 obtained when the second recording layer 404 is in the amorphous phase satisfy $R_{a2}<R_{c2}$. This allows the reflectance to be high in the initial state in which information has not been recorded yet, thereby allowing a stable recording/reproducing operation to be performed. Furthermore, in order to obtain good recording/reproduction characteristics by increasing a difference in reflectance ($R_{c2}-R_{a2}$), $R_{c2}$ and $R_{a2}$ preferably satisfy $0.3 \leq R_{a2} \leq 4$ and $5 \leq R_{c2} \leq 15$, respectively, and more preferably they satisfy $0.3 \leq R_{a2} \leq 3$ and $5 \leq R_{c2} \leq 9$, respectively.

The first information layer 13 includes a first dielectric layer 302, a first interface layer 303, a first recording layer 304, a second dielectric layer 306, a first reflective layer 308, and a first transmittance adjusting layer 309, which are disposed in this order from the incident side of the laser beam 1. The first interface layer 303 may be provided if necessary, and it does not always have to be provided. A second interface layer 305 may be disposed between the first recording layer 304 and the second dielectric layer 306 (the second interface layer is not shown in FIG. 3, but it is explained as a "second interface layer 305" for the sake of convenience in the present specification).

The first dielectric layer 302, the first interface layer 303, the first recording layer 304, the second interface layer 305, the second dielectric layer 306, the first reflective layer 308, and the first transmittance adjusting layer 309 that constitute the first information layer 13, respectively, can be formed of the same materials as those of the first dielectric layer 102, the first interface layer 103, the first recording layer 104, the second interface layer 105, the second dielectric layer 106, the first reflective layer 108, and the transmittance adjusting layer 109 of the first information layer 10 of Embodiment 1. These layers of the first information layer 13 have the same shapes and functions as those of the corresponding layers described in Embodiment 1.

In order to allow the amount of laser light required for recording/reproduction to reach the information layer disposed beyond the first information layer 13 relative to the incident side of the laser beam 1, a transmittance $T_{c1}$(%) of the first information layer 13 obtained when the first recording layer 304 is in the crystalline phase and a transmittance $T_{a1}$(%) of the first information layer 13 obtained when the first recording layer 304 is in the amorphous phase preferably satisfy 50<$T_{c1}$ and 50<$T_{a1}$, respectively, and more preferably they satisfy 55<$T_{c1}$ and 55<$T_{a1}$, respectively.

Preferably, the transmittances $T_{c1}$ and $T_{a1}$ of the first information layer 13 satisfy $-5 \leq (T_{c1}-T_{a1}) \leq 5$, and more preferably they satisfy $-3 \leq (T_{c1}-T_{a1}) \leq 3$. When $T_{c1}$ and $T_{a1}$ satisfy these conditions, changes in the transmittance due to the state of the first recording layer 304 in the first information layer 13 have little influence when recording/reproduction is performed on/from the information layer disposed beyond the first information layer 13 relative to the incident side of the laser beam 1, and thereby good recording/reproducing characteristics can be obtained.

Preferably, a reflectance $R_{c1}$(%) of the first information layer 13 obtained when the first recording layer 304 is in the crystalline phase and a reflectance $R_{a1}$(%) of the first information layer 13 obtained when the first recording layer 304 is in the amorphous phase satisfy $R_{a1}<R_{c1}$. This allows the reflectance to be high in the initial state in which information has not been recorded yet, thereby allowing a stable recording/reproducing operation to be performed. Furthermore, in order to obtain good recording/reproduction characteristics by increasing a difference in reflectance ($R_{c1}-R_{a1}$), $R_{c1}$ and $R_{a1}$ preferably satisfy $0.1 \leq R_{a1} \leq 1$ and $1.5 \leq R_{c1} \leq 5$, respectively, and more preferably they satisfy $0.1 \leq R_{a1} \leq 0.7$ and $1.5 \leq R_{c1} \leq 3$, respectively.

When $R_{c1}$, $R_{a1}$, $R_{c2}$, $R_{a2}$, $R_{c3}$, $R_{a3}$, $T_{c1}$, $T_{a1}$, $T_{c2}$ and $T_{a2}$ are designed as described above, the amounts of effective reflected light from the first information layer 13, the second information layer 14 and the third information layer 15 can be matched with each other (for example, the effective reflectance of these layers is 2%).

The optical information recording medium 16 can be manufactured by the method described below.

First, a substrate 8 (whose thickness is 1.1 mm, for example) is prepared and disposed in a film forming apparatus.

Subsequently, the third information layer is formed on the substrate 8. Specifically, first, the third reflective layer 508, the sixth dielectric layer 506, the third recording layer 504, the fifth interface layer 503, and the fifth dielectric layer 502 are formed in this order on the substrate 8. In this case, an interface layer 507 may be formed between the third reflective layer 508 and the sixth dielectric layer 506, if necessary.

Furthermore, a sixth interface layer 505 may be formed between the sixth dielectric layer 506 and the third recording layer 504, if necessary. The fifth interface layer 503 does not have to be formed, if not necessary. These layers can be formed in the same manner as in the case of the second reflective layer 208, the interface layer 207, the fourth dielectric layer 206, the fourth interface layer 205, the second recording layer 204, the third interface layer 203, and the third dielectric layer 202 of the second information layer 11, respectively, as described in Embodiment 2.

The third information layer 15 is formed in this manner.

Subsequently, the intermediate layer 5 (whose thickness is 15 µm, for example) is formed on the fifth dielectric layer 502 of the third information layer 15. The intermediate layer 5 can be formed by applying a photo-curable resin (especially an acrylic ultraviolet curable resin) or a slow-acting thermosetting resin onto the fifth dielectric layer 502, subjecting it to spin coating, and then curing the resin. In order to provide guide grooves for guiding the laser beam 1 on the intermediate layer 5, a substrate (mold) having grooves formed thereon is attached tightly to the resin before being cured, the resin is cured, and then the substrate (mold) is peeled off. Thus, the guide grooves can be formed on the intermediate layer 5. The intermediate layer can be formed by using not only the above-mentioned spin-coating method but also a printing technique such as, for example, screen printing and ink-jet printing applied to microfabrication technology.

After the fifth dielectric layer 502 is formed or after the intermediate layer 5 is formed, an initialization process for crystallizing the entire surface of the third recording layer 504 may be carried out, if necessary. The third recording layer 504 can be crystallized by irradiation with a laser beam.

Subsequently, the second information layer 14 is formed on the intermediate layer 5. Specifically, first, the second transmittance adjusting layer 409, the second reflective layer 408, the fourth dielectric layer 406, the second recording layer 404, the third interface layer 403, and the third dielectric layer 402 are formed in this order on the intermediate layer 5. In this case, a fourth interface layer 405 may be formed between the fourth dielectric layer 406 and the second recording layer 404, if necessary. The third interface layer 403 does not have to be formed, if not necessary. These layers can be formed in the same manner as in the case of the transmittance adjusting layer 109, the first reflective layer 108, the second dielectric layer 106, the second interface layer 105, the first recording layer 104, the first interface layer 103, and the first dielectric layer 102 of the first information layer 10, respectively, described in Embodiment 1.

The second information layer 14 is formed in the manner as described above.

Subsequently, the intermediate layer 3 (whose thickness is 25 µm, for example) is formed on the third dielectric layer 402 of the second information layer 14 in the same manner as in the case of the intermediate layer 5 described above.

After the third dielectric layer 402 is formed or after the intermediate layer 3 is formed, an initialization process for crystallizing the entire surfaces of the second recording layer 404 and/or the third recording layer 504 may be carried out, if necessary. The second recording layer 404 and/or the third recording layer 504 can be crystallized by irradiation with a laser beam.

Subsequently, the first information layer 13 is formed on the intermediate layer 3. Specifically, first, the first transmittance adjusting layer 309, the first reflective layer 308, the second dielectric layer 306, the first recording layer 304, the first interface layer 303, and the first dielectric layer 302 are formed in this order on the intermediate layer 3. In this case, a second interface layer 305 may be formed between the second dielectric layer 306 and the first recording layer 304, if necessary. The first interface layer 303 does not have to be formed, if not necessary. These layers can be formed in the same manner as in the case of the transmittance adjusting layer 109, the first reflective layer 108, the second dielectric layer 106, the second interface layer 105, the first recording layer 104, the first interface layer 103, and the first dielectric layer 102 of the first information layer 10, respectively, described in Embodiment 1.

The first information layer 13 is formed in the manner as described above.

Finally, the transparent layer 2 (whose thickness is 60 µm, for example) is formed on the first dielectric layer 302. The transparent layer 2 can be formed in the same manner as described in Embodiment 1.

After the first dielectric layer 302 is formed or after the transparent layer 2 is formed, an initialization process for crystallizing the entire surfaces of the first recording layer 304, the second recording layer 404 and/or the third recording layer 504 may be carried out, if necessary. The first recording layer 304, the second recording layer 404 and/or the third recording layer 504 can be crystallized by irradiation with a laser beam.

The optical information recording medium 16 can be manufactured in the manner as described above. In the present embodiment, sputtering is employed as a film forming method for each of the layers, but the method is not limited thereto, and it also is possible to employ, for example, vacuum vapor deposition, ion plating, CVD, or MBE.

Embodiment 4

Figure 4:
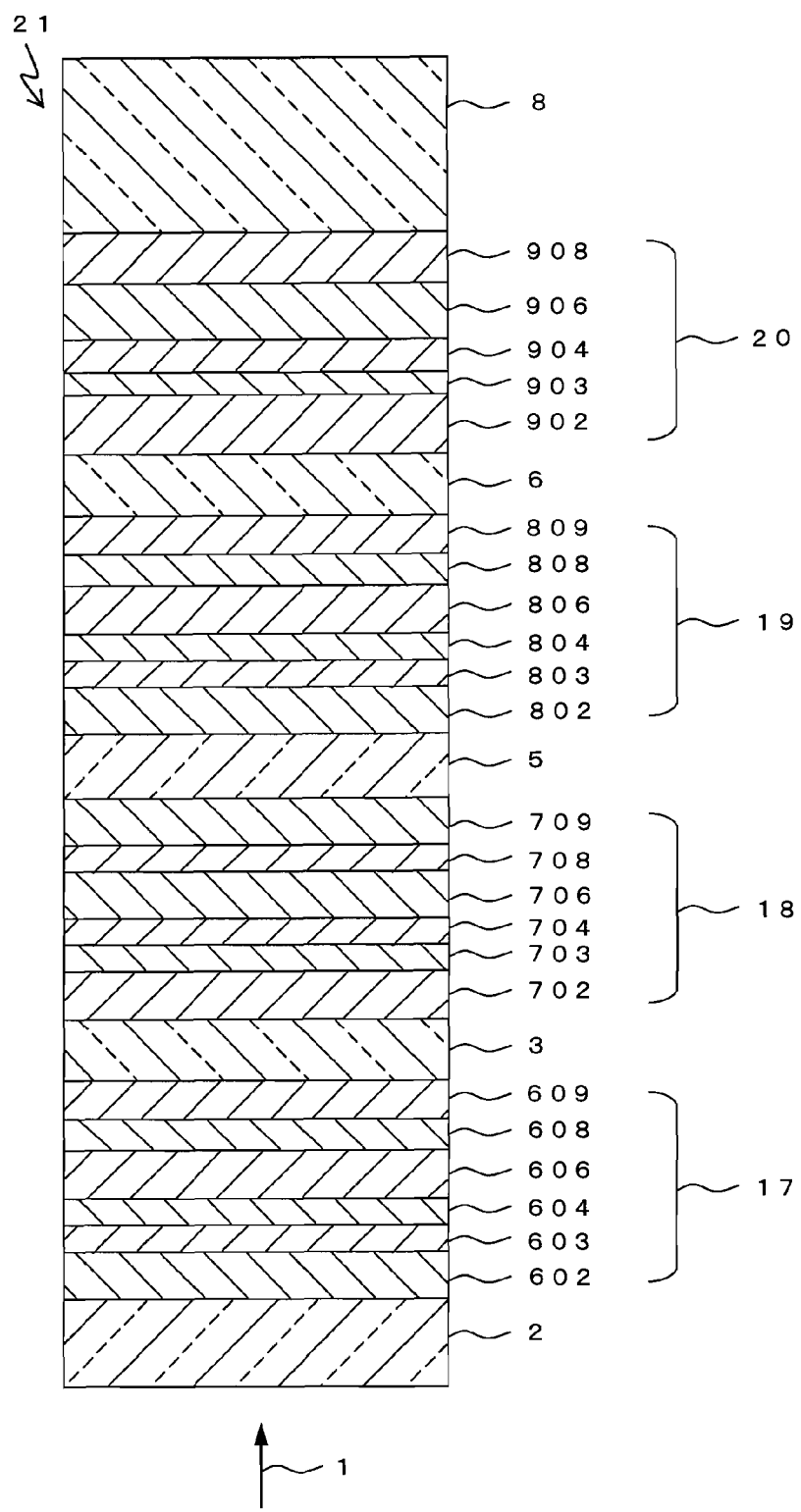
FIG. 4 is a partial cross-sectional view showing an example of a layered structure of an optical information recording medium of the present invention including four information layers.

In Embodiment 4, an example of an optical information recording medium will be described, in which the multi-layer optical information recording medium according to Embodiment 1 is provided with four information layers, that is, N=4. FIG. 4 shows a partial cross-sectional view of an optical information recording medium 21 according to Embodiment 4. The optical information recording medium 21 is a four-layer optical information recording medium on/from which information can be recorded/reproduced by a laser beam 1 irradiated from one side of the medium.

The optical information recording medium 21 includes a substrate 8, and a fourth information layer 20, an intermediate layer 6, a third information layer 19, an intermediate layer 5, a second information layer 18, an intermediate layer 3, a first information layer 17, and a transparent layer 2 that are formed sequentially on the substrate 8. The substrate 8, the intermediate layers 3, 5, 6, and the transparent layer 2 can be formed of the same materials as those of the corresponding layers described in Embodiments 1 and 2. These layers of the optical information recording medium 21 have the same shapes and functions as those of the corresponding layers described in Embodiments 1 and 2.

Hereinafter, the structures of the fourth information layer 20, the third information layer 19, the second information layer 18, and the first information layer 17 are described in detail. In the present embodiment, the first information layer 17, the second information layer 18, and the third information layer 19 correspond to the L-th information layer of the optical information recording medium of the present invention. In the case where a plurality of layers having the same functions are provided in the optical information recording medium of the present embodiment, they are distinguished from each other by referring to them as a first layer, second layer, . . . from the incident side of the laser beam 1, for the sake of explanation.

The fourth information layer 20 includes a seventh dielectric layer 902, a seventh interface layer 903, a fourth recording layer 904, a eighth dielectric layer 906, and a fourth reflective layer 908, which are disposed in this order from the incident side of the laser beam 1. The seventh interface layer 903 may be provided if necessary, and it does not always have to be provided. An eighth interface layer 905 may be disposed between the fourth recording layer 904 and the eighth dielectric layer 906 (the eighth interface layer is not shown in FIG. 4, but it is explained as an "eighth interface layer 905" for the sake of convenience in the present specification). An interface layer 907 further may be disposed between the eighth dielectric layer 906 and the fourth reflective layer 908 (the interface layer is not shown in FIG. 4, but it is explained as an "interface layer 907" for the sake of convenience in the present specification). Information is recorded/reproduced on/from the fourth information layer 20 by the laser beam 1 that has passed through the transparent layer 2, the first information layer 17, the intermediate layer 3, the second information layer 18, the intermediate layer 5, the third information layer 19, and the intermediate layer 6.

The seventh dielectric layer 902, the seventh interface layer 903, the fourth recording layer 904, the eighth interface layer 905, the eighth dielectric layer 906, the interface layer 907, and the fourth reflective layer 908 that constitute the fourth information layer 20, respectively, can be formed of the same materials as those of the third dielectric layer 202, the third interface layer 203, the second recording layer 204, the fourth interface layer 205, the fourth dielectric layer 206, the interface layer 207, and the second reflective layer 208 of the second information layer 11 of Embodiment 2. These layers of the fourth information layer 20 have the same shapes and functions as those of the corresponding layers described in Embodiment 2.

Preferably, a reflectance $R_{c4}$(%) of the fourth information layer 20 obtained when the fourth recording layer 904 is in the crystalline phase and a reflectance $R_{a4}$(%) of the fourth information layer 20 obtained when the fourth recording layer 904 is in the amorphous phase satisfy $R_{a4} < R_{c4}$. This allows the reflectance to be high in the initial state in which information has not been recorded yet, thereby allowing a stable recording/reproducing operation to be performed. Furthermore, in order to obtain good recording/reproduction characteristics by increasing a difference in reflectance $(R_{c4} - R_{a4})$, $R_{c4}$ and $R_{a4}$ preferably satisfy $1 \leq R_{a4} \leq 12$ and $16 \leq R_{c4} \leq 48$, respectively, and more preferably they satisfy $1 \leq R_{a4} \leq 6$ and $16 \leq R_{c4} \leq 32$, respectively.

The third information layer 19 includes a fifth dielectric layer 802, a fifth interface layer 803, a third recording layer 804, a sixth dielectric layer 806, a third reflective layer 808, and a third transmittance adjusting layer 809, which are disposed in this order from the incident side of the laser beam 1. The fifth interface layer 803 may be provided if necessary, and it does not always have to be provided. A sixth interface layer 805 may be disposed between the third recording layer 804 and the sixth dielectric layer 806 (the sixth interface layer is not shown in FIG. 4, but it is explained as a "sixth interface layer 805" for the sake of convenience in the present specification). Information is recorded/reproduced on/from the third information layer 19 by the laser beam 1 that has passed through the transparent layer 2, the first information layer 17, the intermediate layer 3, the second information layer 18, and the intermediate layer 5.

The fifth dielectric layer 802, the fifth interface layer 803, the third recording layer 804, the sixth interface layer 805, the sixth dielectric layer 806, the third reflective layer 808, and the third transmittance adjusting layer 809 that constitute the third information layer 19, respectively, can be formed of the same materials as those of the first dielectric layer 102, the first interface layer 103, the first recording layer 104, the second interface layer 105, the second dielectric layer 106, the first reflective layer 108, and the transmittance adjusting layer 109 of the first information layer 10 of Embodiment 1. These layers of the third information layer 19 have the same shapes and functions as those of the corresponding layers described in Embodiment 1.

In order to allow the amount of laser light required for recording/reproduction to reach the information layer disposed beyond the third information layer 19 relative to the incident side of the laser beam 1, a transmittance $T_{c3}$(%) of the third information layer 19 obtained when the third recording layer 804 is in the crystalline phase and a transmittance $T_{a3}$(%) of the third information layer 19 obtained when the third recording layer 804 is in the amorphous phase preferably satisfy $55<T_{c3}$ and $55<T_{a3}$, respectively, and more preferably they satisfy $60<T_{c3}$ and $60<T_{a3}$, respectively.

Preferably, the transmittances $T_{c3}$ and $T_{a3}$ of the third information layer 19 satisfy $-5 \leq (T_{c3}-T_{a3}) \leq 5$, and more preferably they satisfy $-3 \leq (T_{c3}-T_{a3}) \leq 3$. When $T_{c3}$ and $T_{a3}$ satisfy these conditions, changes in the transmittance due to the state of the third recording layer 804 in the third information layer 19 have little influence when recording/reproduction is performed on/from the information layer disposed beyond the third information layer 19 relative to the incident side of the laser beam 1, and thereby good recording/reproducing characteristics are obtained.

Preferably, a reflectance $R_{c3}$(%) of the third information layer 19 obtained when the third recording layer 804 is in the crystalline phase and a reflectance $R_{a3}$(%) of the third information layer 19 obtained when the third recording layer 804 is in the amorphous phase satisfy $R_{a3}<R_{c3}$. This allows the reflectance to be high in the initial state in which information has not been recorded yet, thereby allowing a stable recording/reproducing operation to be performed. Furthermore, in order to obtain good recording/reproduction characteristics by increasing a difference in reflectance ($R_{c3}-R_{a3}$), $R_{c3}$ and $R_{a3}$ preferably satisfy $0.3 \leq R_{a3} \leq 4$ and $5 \leq R_{c3} \leq 15$, respectively, and more preferably they satisfy $0.3 \leq R_{a3} \leq 3$ and $5 \leq R_{c3} \leq 9$, respectively.

The second information layer 18 includes a third dielectric layer 702, a third interface layer 703, a second recording layer 704, a fourth dielectric layer 706, a second reflective layer 708, and a second transmittance adjusting layer 709, which are disposed in this order from the incident side of the laser beam 1. The third interface layer 703 may be provided if necessary, and it does not always have to be provided. A fourth interface layer 705 may be disposed between the second recording layer 704 and the fourth dielectric layer 706 (the fourth interface layer is not shown in FIG. 4, but it is explained as a "fourth interface layer 705" for the sake of convenience in the present specification). Information is recorded/reproduced on/from the second information layer 18 by the laser beam 1 that has passed through the transparent layer 2, the first information layer 17, and the intermediate layer 3.

The third dielectric layer 702, the third interface layer 703, the second recording layer 704, the fourth interface layer 705, the fourth dielectric layer 706, the second reflective layer 708, and the second transmittance adjusting layer 709 that constitute the second information layer 18, respectively, can be formed of the same materials as those of the first dielectric layer 102, the first interface layer 103, the first recording layer 104, the second interface layer 105, the second dielectric layer 106, the first reflective layer 108, and the transmittance adjusting layer 109 in the first information layer 10 of Embodiment 1. These layers of the second information layer 18 have the same shapes and functions as those of the corresponding layers described in Embodiment 1.

In order to allow the amount of laser light required for recording/reproduction to reach the information layer disposed beyond the second information layer 18 relative to the incident side of the laser beam 1, a transmittance $T_{c2}$(%) of the second information layer 18 obtained when the second recording layer 704 is in the crystalline phase and a transmittance $T_{a2}$(%) of the second information layer 18 obtained when the second recording layer 704 is in the amorphous phase preferably satisfy $60<T_{c2}$ and $60<T_{a2}$, respectively, and more preferably they satisfy $65<T_{c2}$ and $65<T_{a2}$, respectively.

Preferably, the transmittances $T_{c2}$ and $T_{a2}$ of the second information layer 18 satisfy $-5 \leq (T_{c2}-T_{a2}) \leq 5$, and more preferably $-3 \leq (T_{c2}-T_{a2}) \leq 3$. When $T_{c2}$ and $T_{a2}$ satisfy these conditions, changes in the transmittance due to the state of the second recording layer 704 in the second information layer 18 have little influence when recording/reproduction is performed on/from the information layer disposed beyond the second information layer 18 relative to the incident side of the laser beam 1, and thereby good recording/reproducing characteristics can be obtained.

Preferably, a reflectance $R_{c2}$(%) of the second information layer 18 obtained when the second recording layer 704 is in the crystalline phase and a reflectance $R_{a2}$(%) of the second information layer 18 obtained when the second recording layer 704 is in the amorphous phase satisfy $R_{a2}<R_{c2}$. This allows the reflectance to be high in the initial state in which information has not been recorded yet, thereby allowing a stable recording/reproducing operation to be performed. Furthermore, in order to obtain good recording/reproduction characteristics by increasing a difference in reflectance ($R_{c2}-R_{a2}$), $R_{c2}$ and $R_{a2}$ preferably satisfy $0.1 \leq R_{a2} \leq 1$ and $1.5 \leq R_{c2} \leq 6$, respectively, and more preferably they satisfy $0.1 \leq R_{a2} \leq 0.7$ and $1.5 \leq R_{c2} \leq 3.5$, respectively.

The first information layer 17 includes a first dielectric layer 602, a first interface layer 603, a first recording layer 604, a second dielectric layer 606, a first reflective layer 608, and a first transmittance adjusting layer 609, which are disposed in this order from the incident side of the laser beam 1. The first interface layer 603 may be provided if necessary, and it does not always have to be provided. A second interface layer 605 may be disposed between the first recording layer 604 and the second dielectric layer 606 (the second interface layer is not shown in FIG. 4, but it is explained as a "second interface layer 605" for the sake of convenience in the present specification).

The first dielectric layer 602, the first interface layer 603, the first recording layer 604, the second interface layer 605, the second dielectric layer 606, the first reflective layer 608, and the first transmittance adjusting layer 609 that constitute the first information layer 17, respectively, can be formed of the same materials as those of the first dielectric layer 102, the first interface layer 103, the first recording layer 104, the second interface layer 105, the second dielectric layer 106, the first reflective layer 108, and the transmittance adjusting layer 109 of the first information layer 10 of Embodiment 1. The layers of the first information layer 17 have the same shapes and functions as those of the corresponding layers described in Embodiment 1.

In order to allow the amount of laser light required for recording/reproduction to reach the information layer disposed beyond the first information layer 17 relative to the incident side of the laser beam 1, a transmittance $T_{c1}$(%) of the first information layer 17 obtained when the first recording layer 604 is in the crystalline phase and a transmittance $T_{a1}$(%) of the first information layer 17 obtained when the first recording layer 604 is in the amorphous phase preferably satisfy $60<T_{c1}$ and $60<T_{a1}$, respectively, and more preferably they satisfy $65<T_{c1}$ and $65<T_{a1}$, respectively.

Preferably, the transmittances $T_{c1}$ and $T_{a1}$ of the first information layer 17 satisfy $-5 \leq (T_{c1}-T_{a1}) \leq 5$, and more preferably they satisfy $-3 \leq (T_{c1}-T_{a1}) \leq 3$. When $T_{c1}$ and $T_{a1}$ satisfy these conditions, changes in the transmittance due to the state of the first recording layer 604 in the first information layer 17 have little influence when recording/reproduction is performed on/from the information layer disposed beyond the first information layer 17 relative to the incident side of the laser beam 1, and thereby good recording/reproducing characteristics can be obtained.

Preferably, a reflectance $R_{c1}$(%) of the first information layer 17 obtained when the first recording layer 604 is in the crystalline phase and a reflectance $R_{a1}$(%) of the first information layer 17 obtained when the first recording layer 604 is in the amorphous phase satisfy $R_{a1}<R_{c1}$. This allows the reflectance to be high in the initial state in which information has not been recorded yet, thereby allowing a stable recording/reproducing operation to be performed. Furthermore, in order to obtain good recording/reproduction characteristics by increasing a difference in reflectance ($R_{c1}-R_{a1}$), $R_{c1}$ and $R_{a1}$ preferably satisfy $0.1 \leq R_{a1} \leq 0.8$ and $1.2 \leq R_{c1} \leq 3$, respectively, and more preferably they satisfy $0.1 \leq R_{a1} \leq 0.5$ and $1.2 \leq R_{c1} \leq 2$, respectively.

When $R_{c1}$, $R_{a1}$, $R_{c2}$, $R_{a2}$, $R_{c3}$, $R_{a3}$, $R_{c4}$, $R_{a4}$, $T_{c1}$, $T_{a1}$, $T_{c2}$, $T_{a2}$, $T_{c3}$, and $T_{a3}$ are designed as described above, the amounts of effective reflected light from the first information layer 17, the second information layer 18, the third information layer 19, and the fourth information layer 20 can be matched with each other (for example, the effective reflectance of these layers is 1.5%).

The optical information recording medium 21 can be manufactured by the method described below.

First, a substrate 8 (whose thickness is 1.1 mm, for example) is prepared and disposed in a film forming apparatus.

Subsequently, the fourth information layer is formed on the substrate 8. Specifically, first, the fourth reflective layer 908, the eighth dielectric layer 906, the fourth recording layer 904, the seventh interface layer 903, and the seventh dielectric layer 902 are formed in this order on the substrate 8. In this case, an interface layer 907 may be formed between the fourth reflective layer 908 and the eighth dielectric layer 906, if necessary. Furthermore, an eighth interface layer 905 may be formed between the eighth dielectric layer 906 and the fourth recording layer 904, if necessary. The seventh interface layer 903 does not have to be formed, if not necessary. These layers can be formed in the same manner as in the case of the second reflective layer 208, the interface layer 207, the fourth dielectric layer 206, the fourth interface layer 205, the second recording layer 204, the third interface layer 203, and the third dielectric layer 202 of the second information layer 11, respectively, as described in Embodiment 2.

The fourth information layer 20 is formed in this manner.

Subsequently, the intermediate layer 6 (whose thickness is 10 μm, for example) is formed on the seventh dielectric layer 902 of the fourth information layer 20. The intermediate layer 6 can be formed by applying a photo-curable resin (especially an acrylic ultraviolet curable resin) or a slow-acting thermosetting resin onto the seventh dielectric layer 902, subjecting it to spin coating, and then curing the resin. In order to provide guide grooves for guiding the laser beam 1 on the intermediate layer 6, a substrate (mold) having grooves formed thereon is attached tightly to the resin before being cured, the resin is cured, and then the substrate (mold) is peeled off. Thus, the guide grooves can be formed on the intermediate layer 6. The intermediate layer can be formed by using not only the above-mentioned spin-coating method but also a printing technique such as, for example, screen printing and ink-jet printing applied to microfabrication technology.

After the seventh dielectric layer 902 is formed or after the intermediate layer 6 is formed, an initialization process for crystallizing the entire surface of the fourth recording layer 904 may be carried out, if necessary. The fourth recording layer 904 can be crystallized by irradiation with a laser beam.

Subsequently, the third information layer 19 is formed on the intermediate layer 6. Specifically, first, the third transmittance adjusting layer 809, the third reflective layer 808, the sixth dielectric layer 806, the third recording layer 804, the fifth interface layer 803, and the fifth dielectric layer 802 are formed in this order on the intermediate layer 6. In this case, a sixth interface layer 805 may be formed between the sixth dielectric layer 806 and the third recording layer 804, if necessary. The fifth interface layer 803 does not have to be formed, if not necessary. These layers can be formed in the same manner as in the case of the transmittance adjusting layer 109, the first reflective layer 108, the second dielectric layer 106, the second interface layer 105, the first recording layer 104, the first interface layer 103, and the first dielectric layer 102 of the first information layer 10, respectively, described in Embodiment 1.

The third information layer 19 is formed in this manner.

Subsequently, the intermediate layer 5 (whose thickness is 20 μm, for example) is formed on the fifth dielectric layer 802 of the third information layer 19 in the same manner as in the case of the intermediate layer 6 described above.

After the fifth dielectric layer 802 is formed or after the intermediate layer 5 is formed, an initialization process for crystallizing the entire surfaces of the third recording layer 804 and/or the fourth recording layer 904 may be carried out, if necessary. The third recording layer 804 and/or the fourth recording layer 904 can be crystallized by irradiation with a laser beam.

Subsequently, the second information layer 18 is formed on the intermediate layer 5. Specifically, first, the second transmittance adjusting layer 709, the second reflective layer 708, the fourth dielectric layer 706, the second recording layer 704, the third interface layer 703, and the third dielectric layer 702 are formed in this order on the intermediate layer 5. In this case, a fourth interface layer 705 may be formed between the fourth dielectric layer 706 and the second recording layer 704, if necessary. The third interface layer 703 does not have to be formed, if not necessary. These layers can be formed in the same manner as in the case of the transmittance adjusting layer 109, the first reflective layer 108, the second dielectric layer 106, the second interface layer 105, the first recording layer 104, the first interface layer 103, and the first dielectric layer 102 of the first information layer 10, respectively, described in Embodiment 1.

The second information layer 18 is formed in this manner.

Subsequently, the intermediate layer 3 (whose thickness is 15 μm, for example) is formed on the third dielectric layer 702 of the second information layer 18 in the same manner as in the case of the intermediate layer 6 described above.

After the third dielectric layer 702 is formed or after the intermediate layer 3 is formed, an initialization process for crystallizing the entire surfaces of the second recording layer 704, the third recording layer 804 and/or the fourth recording layer 904 may be carried out, if necessary. The second recording layer 704, the third recording layer 804 and/or the fourth recording layer 904 can be crystallized by irradiation with a laser beam.

Subsequently, the first information layer 17 is formed on the intermediate layer 3. Specifically, first, the first transmittance adjusting layer 609, the first reflective layer 608, the second dielectric layer 606, the first recording layer 604, the first interface layer 603, and the first dielectric layer 602 are formed in this order on the intermediate layer 3. In this case, a second interface layer 605 may be formed between the second dielectric layer 606 and the first recording layer 604, if necessary. The first interface layer 603 does not have to be formed, if not necessary. These layers can be formed in the same manner as in the case of the transmittance adjusting layer 109, the first reflective layer 108, the second dielectric layer 106, the second interface layer 105, the first recording layer 104, the first interface layer 103, and the first dielectric layer 102 of the first information layer 10, respectively, described in Embodiment 1.

The first information layer 17 is formed in this manner.

Finally, the transparent layer 2 (whose thickness is 55 μm, for example) is formed on the first dielectric layer 602. The transparent layer 2 can be formed in the same manner as described in Embodiment 1.

After the first dielectric layer 602 is formed or after the transparent layer 2 is formed, an initialization process for crystallizing the entire surfaces of the first recording layer 604, the second recording layer 704, the third recording layer 804 and/or the fourth recording layer 904 may be carried out, if necessary. The first recording layer 604, the second recording layer 704, the third recording layer 804 and/or the fourth recording layer 904 can be crystallized by irradiation with a laser beam.

The optical information recording medium 21 can be manufactured in the manner as described above. In the present embodiment, sputtering is employed as a film forming method for each of the layers, but the method is not limited thereto, and it also is possible to employ, for example, vacuum vapor deposition, ion plating, CVD, or MBE.

Embodiment 5

Figure 5:
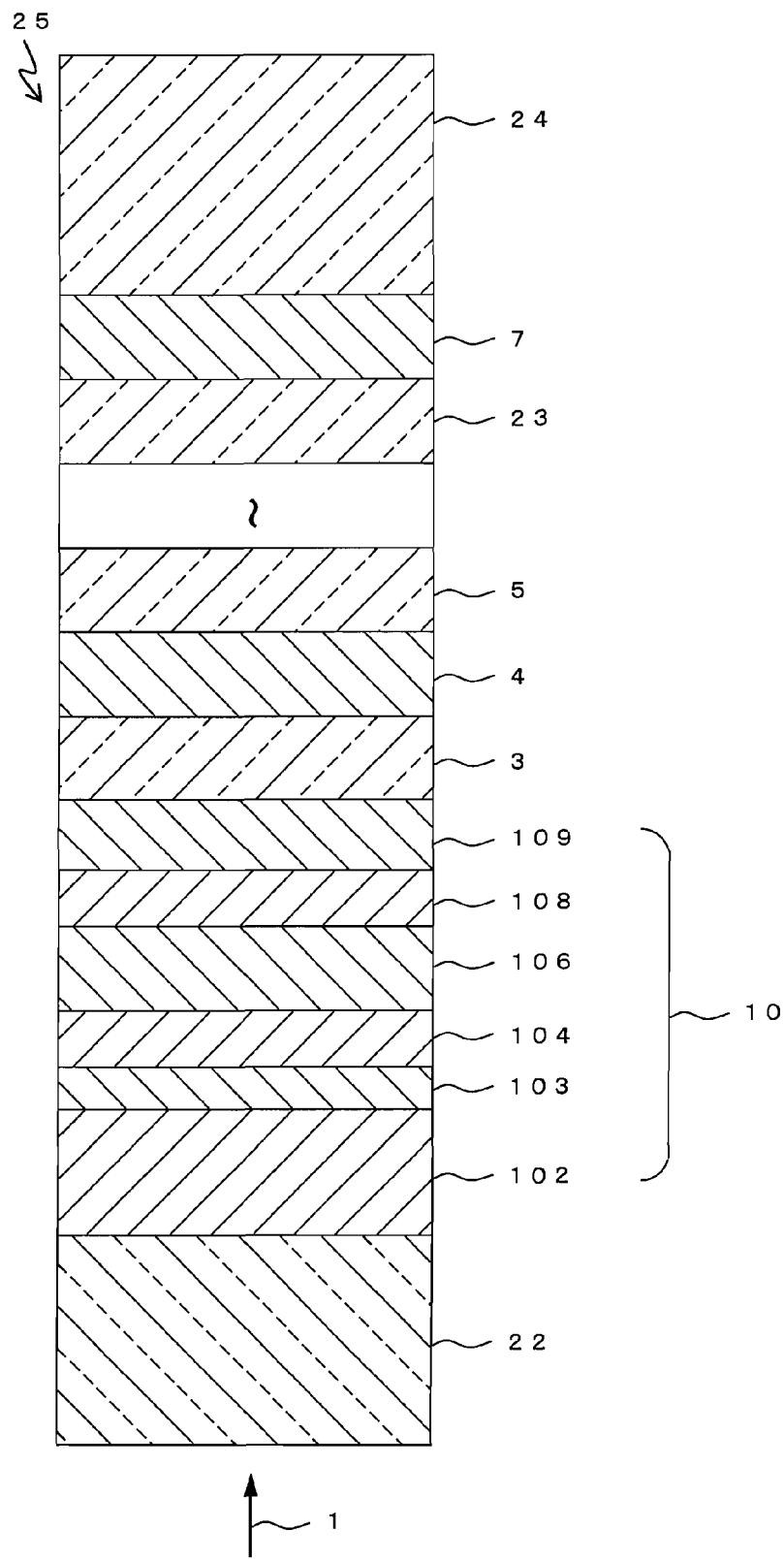
FIG. 5 is a partial cross-sectional view showing an example of a layered structure of an optical information recording medium of the present invention including N information layers.

In Embodiment 5, another example of the optical information recording medium of the present invention will be described. FIG. 5 shows a partial cross-sectional view of an optical information recording medium 25 according to Embodiment 5. Like the optical information recording medium 9 described in Embodiment 1, the optical information recording medium 25 is a multi-layer optical information recording medium on/from which information can be recorded/reproduced by a laser beam 1 irradiated from one side of the medium.

The optical information recording medium 25 has a structure in which (N−1) information layers including a first information layer 10, a second information layer 4, . . . that are formed sequentially on a substrate 22 with respective intermediate layers 3, 5, etc. being interposed therebetween are bonded to an N-th information layer 7 formed on a substrate 24 with an intermediate layer 23 being interposed therebetween. In the present embodiment, the first information layer 10 corresponds to the L-th information layer in the optical information recording medium of the present invention. In the case where a plurality of layers having the same functions are provided in the optical information recording medium of the present embodiment, they are distinguished from each other by referring to them as a first layer, second layer, . . . from the incident side of the laser beam 1, for the sake of explanation.

The substrates 22 and 24 are transparent disk-shaped substrates. As a material of the substrates 22 and 24, a resin such as polycarbonate, amorphous polyolefin, and PMMA, or glass can be used, as in the case of the substrate 8.

Guide grooves for guiding the laser beam may be formed, if necessary, on the surface of the substrate 22 facing the first information layer 10 and the surface of the substrate 24 facing the N-th information layer 7. It is preferable that the other surface of the substrate 22 opposite to the first information layer 10 and the other surface of the substrate 24 opposite to the N-th information layer 7 are flat and smooth. As a material of the substrates 22 and 24, polycarbonate is especially useful for its excellent transfer characteristics, suitability for mass production, as well as its low cost. It is preferable that the thicknesses of the substrates 22 and 24 are in the range of 0.3 mm to 0.9 mm, so that they are sufficiently strong, and the optical information recording medium 25 had a thickness of about 1.2 mm.

The intermediate layer 23 is made of a resin such as a photo-curable resin (especially an acrylic ultraviolet curable resin) or a slow-acting thermosetting resin.

The intermediate layer 23 preferably has low light absorption with respect to the laser beam 1 to be used, and preferably has low optical birefringence in a short wavelength region. It is preferable that the thickness of the intermediate layer 23 is in the range of 0.6 μm to 50 μm for the same reasons as for the intermediate layers 3, 5, etc.

The same reference numerals are assigned to the same components as those in Embodiment 1, and no further description thereof is given.

The optical information recording medium 25 can be manufactured by the method described below.

First, the first information layer 10 is formed on the substrate 22 (whose thickness is 0.6 mm, for example). In the case where guide grooves for guiding the laser beam 1 are formed on the substrate 22, the first information layer 10 is formed on the side of the substrate 22 on which the guide grooves are formed. Specifically, the substrate 22 is placed in a film forming apparatus, and the first dielectric layer 102, the first interface layer 103, the first recording layer 104, the second dielectric layer 106, the first reflective layer 108, and the transmittance adjusting layer 109 are formed sequentially on the substrate 22. The first interface layer 103 does not have to be formed, if not necessary. The second interface layer 105 may be formed between the first recording layer 104 and the second dielectric layer 106, if necessary. The method of forming each of these layers is the same as that described in Embodiment 1. After that, (N−2) information layers (the second to (N−1)th information layers) are formed sequentially with the respective intermediate layers being interposed therebetween.

Separately, the N-th information layer 7 is formed on the substrate 24 (whose thickness is 0.6 mm, for example). The N-th information layer 7 is formed of a single-layer film or a multi-layer film. As in the case of Embodiment 1, each of the layers can be formed by sputtering targets to be used as materials sequentially in a film forming apparatus.

Finally, the substrate 22 on which the respective information layers have been formed is bonded to the substrate 24 using the intermediate layer 23. Specifically, the substrates 22 and 24 can be bonded in such a manner that a resin such as a photo-curable resin (especially an acrylic ultraviolet curable resin) or a slow-acting thermosetting resin is applied onto the information layer 7, the substrate 22 on which the first information layer 10 is formed is attached tightly onto the N-th information layer 7 and subjecting them to spin coating, and then the resin is cured. Alternatively, an adhesive resin may be applied uniformly onto the N-th information layer 7 in advance, which is attached tightly to the substrate 22.

After the substrate 22 and the substrate 24 are attached tightly to each other, an initialization process for crystallizing the entire surface of the first recording layer 104 may be carried out, if necessary. The first recording layer 104 can be crystallized by irradiation with a laser beam.

The optical information recording medium 25 can be manufactured in the manner as described above. In the present embodiment, sputtering is employed as a film forming method for each of the layers, but the method is not limited thereto, and it also is possible to employ, for example, vacuum vapor deposition, ion plating, CVD, or MBE.

Embodiment 6

Figure 6:
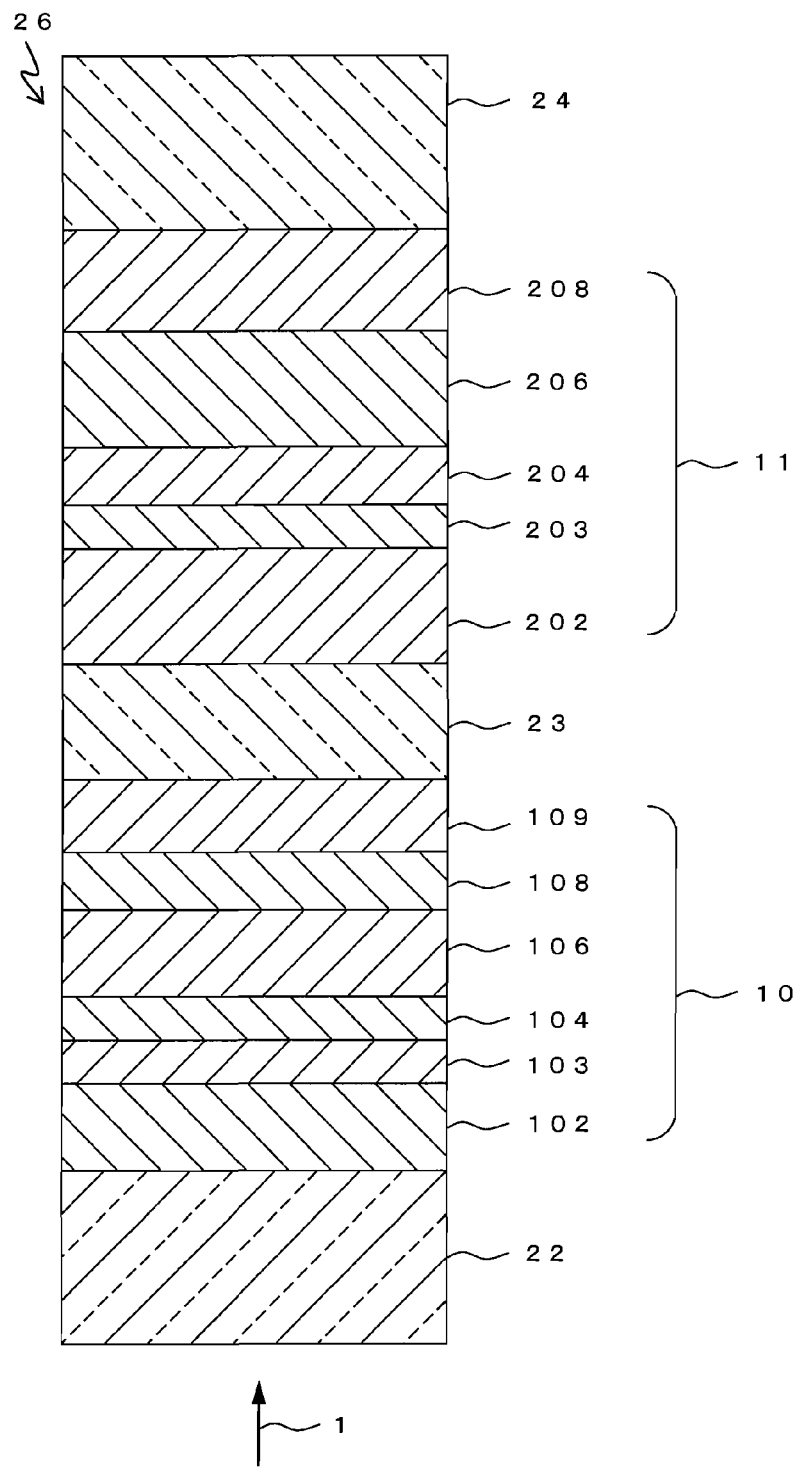
FIG. 6 is a partial cross-sectional view showing an example of a layered structure of an optical information recording medium of the present invention including two information layers.

In Embodiment 6, an example of an optical information recording medium will be described, in which the multi-layer optical information recording medium according to Embodiment 5 of the present invention is provided with two information layers, that is, N=2. FIG. 6 shows a partial cross-sectional view of an optical information recording medium 26 according to Embodiment 6. Like the optical information recording medium 12 described in Embodiment 2, the optical information recording medium 26 is a two-layer optical information recording medium on/from which information can be recorded/reproduced by the laser beam 1 irradiated from one side of the medium.

The optical information recording medium 26 has a structure in which the first information layer 10 is formed on the substrate 22 and the second information layer 11 is formed on the substrate 24, and these layered bodies are bonded to each other with the intermediate layer 23 being interposed therebetween. In the present embodiment, the first information layer 10 corresponds to the L-th information layer in the optical information recording medium of the present invention. In the case where a plurality of layers having the same functions are provided in the optical information recording medium of the present embodiment, they are distinguished from each other by referring to them as a first layer, second layer, . . . from the incident side of the laser beam 1, for the sake of explanation.

Guide grooves for guiding the laser beam may be formed, if necessary, on the surface of the substrate 22 facing the second reflective layer 208. It is preferable that the other surface of the substrate 22 opposite to the second reflective layer 208 is flat and smooth.

The same reference numerals are assigned to the same components as those in Embodiment 2 and Embodiment 5, and no further description thereof is given.

The optical information recording medium 26 can be manufactured by the method described below.

First, the first information layer 10 is formed on the substrate 22 (whose thickness is 0.6 mm, for example) in the same manner as in Embodiment 5.

After the transmittance adjusting layer 109 is formed, an initialization process for crystallizing the entire surface of the first recording layer 104 may be carried out, if necessary. The first recording layer 104 can be crystallized by irradiation with a laser beam.

Separately, the second information layer 11 is formed on the substrate 24 (whose thickness is 0.6 mm, for example). In the case where guide grooves for guiding the laser beam 1 are formed on the substrate 24, the second information layer 11 is formed on the side of the substrate 24 on which the guide grooves are formed. Specifically, the substrate 24 is placed in a film forming apparatus, and the second reflective layer 208, the fourth dielectric layer 206, the second recording layer 204, the third interface layer 203, and the third dielectric layer 202 are formed sequentially on the substrate 24. The third interface layer 203 does not have to be formed, if not necessary. The fourth interface layer 205 may be formed between the second recording layer 204 and the fourth dielectric layer 206, if necessary The interface layer 207 may be formed between the second reflective layer 208 and the fourth dielectric layer 206, if necessary. The method of forming each of these layers is the same as that described in Embodiment 2.

After the third dielectric layer 202 is formed, an initialization process for crystallizing the entire surface of the second recording layer 204 may be carried out, if necessary. The second recording layer 204 can be crystallized by irradiation with a laser beam.

Finally, the substrate 22 on which the first information layer 10 has been formed and the substrate 24 on which the second information layer 11 has been formed are bonded to each other using the intermediate layer 23. Specifically, the substrates 22 and 24 can be bonded in such a manner that a resin such as a photo-curable resin (especially an acrylic ultraviolet curable resin) or a slow-acting thermosetting resin is applied onto the first information layer 10 or the second information layer 11, the third dielectric layer 202 formed on the substrate 24 is attached tightly to the transmittance adjusting layer 109 formed on the substrate 22 and subjecting them to spin coating, and then the resin is cured. Alternatively, an adhesive resin may be applied uniformly onto the first information layer 10 or the second information layer 11 in advance, so that the substrate 22 and the substrate 24 are bonded to each other.

After that, an initialization process for crystallizing the entire surfaces of the second recording layer 204 and the first recording layer 104 may be carried out, if necessary. In this case, it is preferable that the second recording layer 204 is crystallized first for the same reasons as those described in Embodiment 2.

The optical information recording medium 26 can be manufactured in the manner as described above. In the present embodiment, sputtering is employed as a film forming method for each of the layers, but the method is not limited thereto, and it also is possible to employ, for example, vacuum vapor deposition, ion plating, CVD, or MBE.

Embodiment 7

Figure 7:
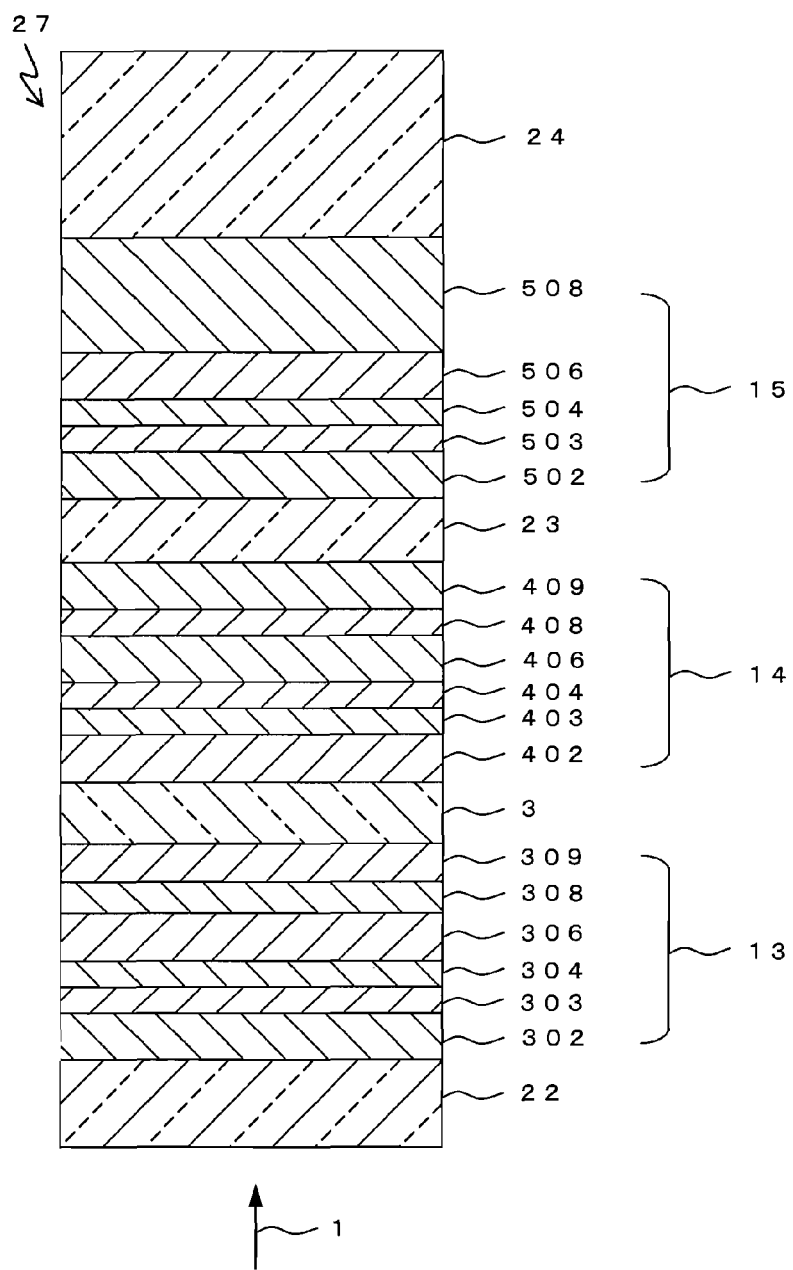
FIG. 7 is a partial cross-sectional view showing an example of a layered structure of an optical information recording medium of the present invention including three information layers.

In Embodiment 7, an example of an optical information recording medium will be described, in which the multi-layer optical information recording medium according to Embodiment 5 is provided with three information layers, that is, N=3. FIG. 7 shows a partial cross-sectional view of an optical information recording medium 27 according to Embodiment 7. Like the optical information recording medium 16 described in Embodiment 3, the optical information recording medium 27 is a three-layer optical information recording medium on/from which information can be recorded/reproduced by the laser beam 1 irradiated from one side of the medium.

The optical information recording medium 27 has a structure in which the first information layer 13 and the second information layer 14 are formed on the substrate 22 and the third information layer 15 is formed on the substrate 24, and these layered bodies are bonded to each other with the intermediate layer 23 being interposed therebetween. In the present embodiment, the first information layer 13 and the second information layer 14 correspond to the L-th information layer in the optical information recording medium of the present invention. In the case where a plurality of layers having the same functions are provided in the optical information recording medium of the present embodiment, they are distinguished from each other by referring to them as a first layer, second layer, . . . from the incident side of the laser beam 1, for the sake of explanation.

The same reference numerals are assigned to the same components as those in Embodiment 3, Embodiment 5, and Embodiment 6, and no further description thereof is given.

The optical information recording medium 27 can be manufactured by the method described below.

First, the first information layer 13 is formed on the substrate 22 (whose thickness is 0.6 mm, for example). In the case where guide grooves for guiding the laser beam 1 are formed on the substrate 22, the first information layer 13 is formed on the side of the substrate 22 on which the guide grooves are formed. Specifically, the substrate 22 is placed in a film forming apparatus, and the first dielectric layer 302, the first interface layer 303, the first recording layer 304, the second dielectric layer 306, the first reflective layer 308, and the first transmittance adjusting layer 309 are formed sequentially on the substrate 22. The first interface layer 303 does not have to be formed, if not necessary. The second interface layer 305 may be formed between the first recording layer 304 and the second dielectric layer 306, if necessary. The method of forming each of these layers is the same as that described in Embodiment 3.

Subsequently, the intermediate layer 3 is formed on the first transmittance adjusting layer 309 in the same manner as in Embodiment 3. After the intermediate layer 3 is formed or after the first transmittance adjusting layer 309 is formed, an initialization process for crystallizing the entire surface of the first recording layer 304 may be carried out, if necessary. The first recording layer 304 can be crystallized by irradiation with a laser beam.

Subsequently, the second information layer 14 is formed on the intermediate layer 3. Specifically, the substrate 22 on which the first information layer 13 and the intermediate layer 3 have been formed is placed in a film forming apparatus, and the third dielectric layer 402, the third interface layer 403, the second recording layer 404, the fourth dielectric layer 406, the second reflective layer 408, the second transmittance adjusting layer 409 are formed sequentially thereon. The third interface layer 403 does not have to be formed, if not necessary. The fourth interface layer 405 may be formed between the second recording layer 404 and the fourth dielectric layer 406, if necessary. The method of forming each of these layers is the same as that described in Embodiment 3. After the second transmittance adjusting layer 409 is formed, an initialization process for crystallizing the entire surfaces of the first recording layer 304 and/or the second recording layer 404 may be carried out, if necessary. The first recording layer 304 and/or the second recording layer 404 can be crystallized by irradiation with a laser beam.

Next, the third information layer 15 is formed on the substrate 24 (whose thickness is 0.6 mm, for example). In the case where guide grooves for guiding the laser beam 1 are formed on the substrate 24, the third information layer 15 is formed on the side of the substrate 24 on which the guide grooves are formed. Specifically, the substrate 24 is placed in a film forming apparatus, and the third reflective layer 508, the sixth dielectric layer 506, the third recording layer 504, the fifth interface layer 503, and the fifth dielectric layer 502 are formed sequentially on the substrate 24. The fifth interface layer 503 does not have to be formed, if not necessary. The sixth interface layer 505 may be formed between the third recording layer 504 and the sixth dielectric layer 506, if necessary. Furthermore, the interface layer 507 may be formed between the sixth dielectric layer 506 and the third reflective layer 508, if necessary. The method of forming each of these layers is the same as that described in Embodiment 3.

After the fifth dielectric layer 502 is formed, an initialization process for crystallizing the entire surface of the third recording layer 504 may be carried out, if necessary. The third recording layer 504 can be crystallized by irradiation with a laser beam.

Finally, the substrate 22 on which the first information layer 13, the intermediate layer 3 and the second information layer 14 have been formed and the substrate 24 on which the third information layer 15 has been formed are bonded to each other using the intermediate layer 23. Specifically, the substrates 22 and 24 can be bonded in such a manner that a resin such as a photo-curable resin (especially an acrylic ultraviolet curable resin) or a slow-acting thermosetting resin is applied onto the second information layer 14 or the third information layer 15, the substrate 22 and the substrate 24 are attached tightly to each other and subjecting them to spin coating, and then the resin is cured. Alternatively, an adhesive resin may be applied uniformly onto the second information layer 14 or the third information layer 15 in advance, so that the substrate 22 and the substrate 24 are bonded to each other.

After that, an initialization process for crystallizing the entire surfaces of the third recording layer 504, the second recording layer 404, and/or the first recording layer 304 may be carried out, if necessary.

The optical information recording medium 27 can be manufactured in the manner as described above. In the present embodiment, sputtering is employed as a film forming method for each of the layers, but the method is not limited thereto, and it also is possible to employ, for example, vacuum vapor deposition, ion plating, CVD, or MBE.

Embodiment 8

Figure 8:
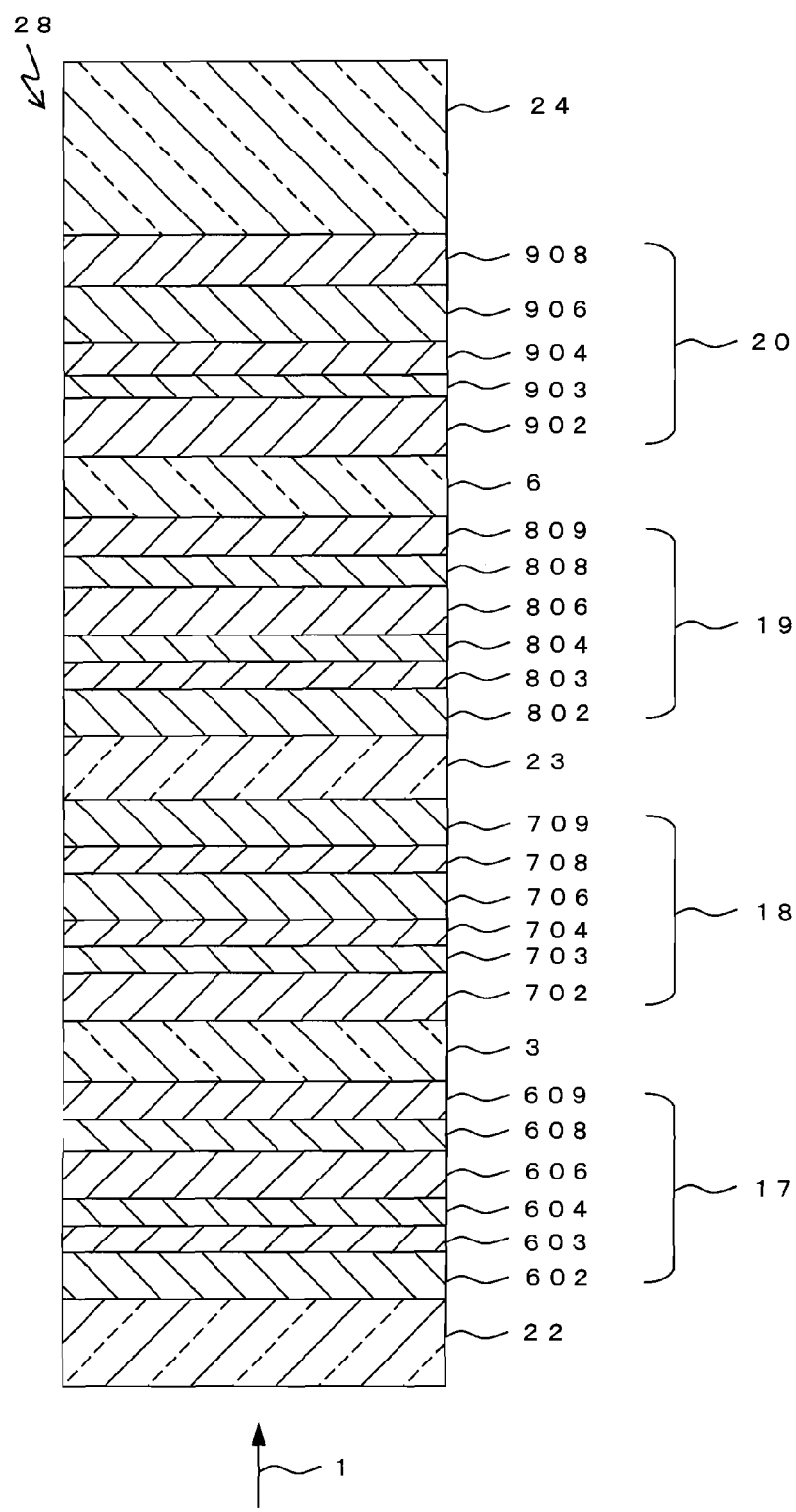
FIG. 8 is a partial cross-sectional view showing an example of a layered structure of an optical information recording medium of the present invention including four information layers.

In Embodiment 8, an example of an optical information recording medium will be described, in which the multi-layer optical information recording medium according to Embodiment 5 is provided with four information layers, that is, N=4. FIG. 8 shows a partial cross-sectional view of an optical information recording medium 28 according to Embodiment 8. Like the optical information recording medium 21 described in Embodiment 4, the optical information recording medium 28 is a four-layer optical information recording medium on/from which information can be recorded/reproduced by the laser beam 1 irradiated from one side of the medium.

The optical information recording medium 28 has a structure in which the first information layer 17 and the second information layer 18 are formed on the substrate 22 and the fourth information layer 20 and the third information layer 19 are formed on the substrate 24, and these layered bodies are bonded to each other with the intermediate layer 23 being interposed therebetween. In the present embodiment, the first information layer 17, the second information layer 18, and the third information layer 19 correspond to the L-th information layer of the optical information recording medium of the present invention. In the case where a plurality of layers having the same functions are provided in the optical information recording medium of the present embodiment, they are distinguished from each other by referring to them as a first layer, second layer, . . . from the incident side of the laser beam 1, for the sake of explanation.

The same reference numerals are assigned to the same components as those in Embodiment 4, Embodiment 5, Embodiment 6, and Embodiment 7, and no further description thereof is given.

The optical information recording medium 28 can be manufactured by the method described below.

First, the first information layer 17 is formed on the substrate 22 (whose thickness is 0.6 mm, for example). In the case where guide grooves for guiding the laser beam 1 are formed on the substrate 22, the first information layer 17 is formed on the side of the substrate 22 on which the guide grooves are formed. Specifically, the substrate 22 is placed in a film forming apparatus, and the first dielectric layer 602, the first interface layer 603, the first recording layer 604, the second dielectric layer 606, the first reflective layer 608, and the first transmittance adjusting layer 609 are formed sequentially on the substrate 22. The first interface layer 603 does not have to be formed, if not necessary. The second interface layer 605 may be formed between the first recording layer 604 and the second dielectric layer 606, if necessary. The method of forming each of these layers is the same as that described in Embodiment 4.

Subsequently, the intermediate layer 3 is formed on the first transmittance adjusting layer 609 in the same manner as in Embodiment 4. After the intermediate layer 3 is formed or after the first transmittance adjusting layer 609 is formed, an initialization process for crystallizing the entire surface of the first recording layer 604 may be carried out, if necessary. The first recording layer 604 can be crystallized by irradiation with a laser beam.

Subsequently, the second information layer 18 is formed on the intermediate layer 3. Specifically, the substrate 22 on which the first information layer 17 and the intermediate layer 3 have been formed is placed in a film forming apparatus, and the third dielectric layer 702, the third interface layer 703, the second recording layer 704, the fourth dielectric layer 706, the second reflective layer 708, the second transmittance adjusting layer 709 are formed sequentially thereon. The third interface layer 703 does not have to be formed, if not necessary. The fourth interface layer 705 may be formed between the second recording layer 704 and the fourth dielectric layer 706, if necessary. The method of forming each of these layers is the same as that described in Embodiment 4. After the second transmittance adjusting layer 709 is formed, an initialization process for crystallizing the entire surfaces of the first recording layer 604 and/or the second recording layer 704 may be carried out, if necessary. The first recording layer 604 and/or the second recording layer 704 can be crystallized by irradiation with a laser beam.

Next, the fourth information layer 20 is formed on the substrate 24 (whose thickness is 0.6 mm, for example). In the case where guide grooves for guiding the laser beam 1 are formed on the substrate 24, the fourth information layer 20 is formed on the side of the substrate 24 on which the guide grooves are formed. Specifically, the substrate 24 is placed in a film forming apparatus, and the fourth reflective layer 908, the eighth dielectric layer 906, the fourth recording layer 904, the seventh interface layer 903, and the seventh dielectric layer 902 are formed sequentially on the substrate 24. The seventh interface layer 903 does not have to be formed, if not necessary. The eighth interface layer 905 may be formed between the fourth recording layer 904 and the eighth dielectric layer 906, if necessary. Furthermore, the interface layer 907 may be formed between the eighth dielectric layer 906 and the fourth reflective layer 908, if necessary. The method of forming each of these layers is the same as that described in Embodiment 4.

Subsequently, the intermediate layer 6 is formed on the seventh dielectric layer 902 in the same manner as in Embodiment 4. After the intermediate layer 6 is formed or after the seventh dielectric layer 902 is formed, an initialization process for crystallizing the entire surface of the fourth recording layer 904 may be carried out, if necessary. The fourth recording layer 904 can be crystallized by irradiation with a laser beam.

Subsequently, the third information layer 19 is formed on the intermediate layer 6. Specifically, the substrate 24 on which the fourth information layer 20 and the intermediate layer 6 have been formed is placed in a film forming apparatus, and the third transmittance adjusting layer 809, the third reflective layer 808, the sixth dielectric layer 806, the third recording layer 804, the fifth interface layer 803, and the fifth dielectric layer 802 are formed sequentially thereon. The fifth interface layer 803 does not have to be formed, if not necessary. The sixth interface layer 805 may be formed between the third recording layer 804 and the sixth dielectric layer 806, if necessary. The method of forming each of these layers is the same as that described in Embodiment 4. After the fifth dielectric layer 802 is formed, an initialization process for crystallizing the entire surfaces of the third recording layer 804 and/or the fourth recording layer 904 may be carried out, if necessary. The third recording layer 804 and/or the fourth recording layer 904 can be crystallized by irradiation with a laser beam.

Finally, the substrate 22 on which the first information layer 17, the intermediate layer 3 and the second information layer 18 have been formed and the substrate 24 on which the fourth information layer 20, the intermediate layer 6 and the third information layer 19 have been formed are bonded to each other using the intermediate layer 23. Specifically, the substrates 22 and 24 can be bonded in such a manner that a resin such as a photo-curable resin (especially an acrylic ultraviolet curable resin) or a slow-acting thermosetting resin is applied onto the second information layer 18 or the third information layer 19, the substrate 22 and the substrate 24 are attached tightly to each other and subjecting them to spin coating, and then the resin is cured. Alternatively, an adhesive resin may be applied uniformly onto the second information layer 18 or the third information layer 19 in advance, so that the substrate 22 and the substrate 24 are bonded to each other.

After that, an initialization process for crystallizing the entire surfaces of the fourth recording layer 904, the third recording layer 804, the second recording layer 704, and/or the first recording layer 604 may be carried out, if necessary.

The optical information recording medium 28 can be manufactured in the manner as described above. In the present embodiment, sputtering is employed as a film forming method for each of the layers, but the method is not limited thereto, and it also is possible to employ, for example, vacuum vapor deposition, ion plating, CVD, or MBE.

Embodiment 9

In Embodiment 9, a method of recording/reproducing information on/from the optical information recording medium of the present invention as described in Embodiments 1, 2, 3, 4, 5, 6, 7, and 8 will be described.

Figure 9:
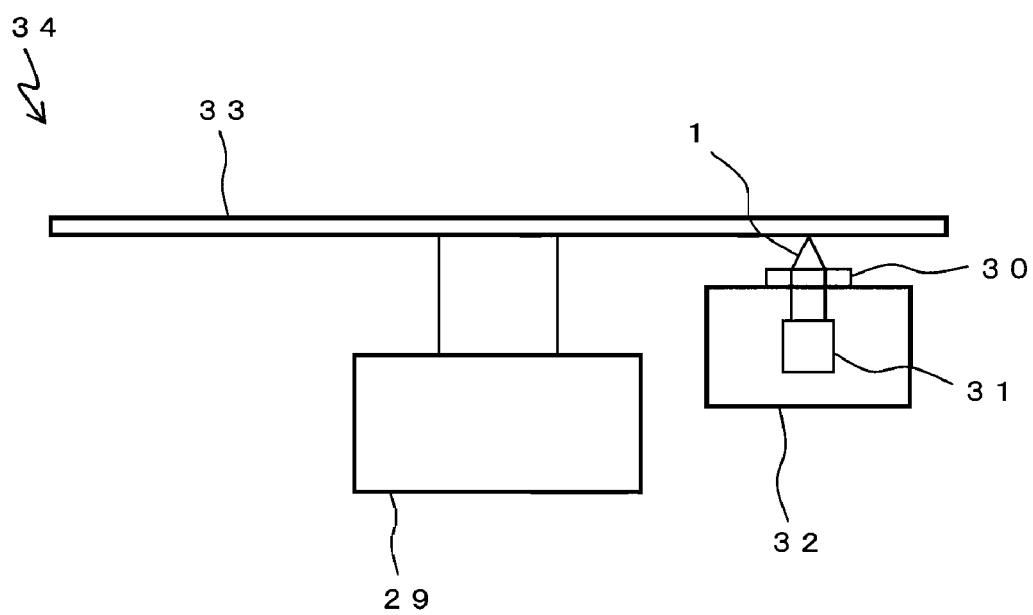
FIG. 9 is a schematic view showing a part of a configuration of a recording/reproducing apparatus used for recording/reproducing on/from the optical information recording medium of the present invention.

FIG. 9 shows schematically a part of a configuration of a recording/reproducing apparatus 34 used for the recording/reproducing method for the optical information recording medium of the present invention. The recording/reproducing apparatus 34 shown in FIG. 9 includes a spindle motor 29 for rotating an optical information recording medium 33, and an optical head 32 provided with a semiconductor laser 31 and an objective lens 30 for focusing a laser beam 1 emitted from the semiconductor laser 31. The optical information recording medium 33 is the optical information recording medium according to any of Embodiments 1 to 8, and includes a plurality of information layers (for example, a first information layer 10 and a second information layer 11). The objective lens 30 focuses the laser beam 1 onto each of the information layers.

Recording, erasing and overwriting of information on the optical information recording medium are performed by modulating the power of the laser beam 1 between a peak power ($P_p$ (mW)) of high power and a bias power ($P_b$ (mW)) of low power. When a recording layer is irradiated with a laser beam 1 with the peak power, amorphous phase portions are formed locally in the recording layer, and these portions serve as recording marks. When a portion between the recording marks is irradiated with a laser beam 1 with the bias power, a crystalline phase portion (erased portion) is formed therein. When the laser beam 1 is irradiated with the peak power, then a so-called multi-pulse, in which a pulse train is formed, is commonly used. The multi-pulse may be modulated between two power levels of the peak power and the bias power, or it may be modulated among three power levels or four power levels in the range of 0 mW to the peak power including a cooling power ($P_c$ (mW)) and a bottom power ($P_B$ (mW)), which are further lower than the bias power.

Information signals obtained from the optical information recording medium by irradiating the optical information recording medium with a laser beam 1 of reproduction power are read out with a detector, and thereby the signals are reproduced. The reproduction power ($P_r$ (mW)) is set at a power level that is lower than that of the peak power and the bias power, has no influence on the optical state of the recording marks when irradiated with the laser beam 1 of this power level, and allows a sufficient amount of reflected light to be obtained to reproduce the recording marks from the optical information recording medium.

It is preferable that the numerical aperture NA of the objective lens 30 is in the range of 0.5 to 1.1, and more preferably in the range of 0.6 to 0.9 to adjust the spot diameter of the laser beam within the range of 0.4 μm to 0.7 μm. It is preferable that the wavelength of the laser beam 1 is 450 nm or less (more preferably, within the range of 350 nm to 450 nm). It is preferable that the linear velocity of the optical information recording medium when recording information is in the range of 4 msec to 50 msec, and more preferably in the range of 9 msec to 40 m/sec), because in this range, crystallization caused by reproduction light tends not to occur and sufficient erasing performance is obtained. Needless to say, other wavelengths, numerical apertures of the objective lens, and linear velocities may be used according to the types or the like of the optical information recording medium, although they are not shown here. For example, the wavelength of the laser beam may be 650 to 670 nm.

When recording is performed on the first information layer 10 in the optical information recording medium 12 or the optical information recording medium 26 each provided with two information layers, the laser beam 1 is focused onto the first recording layer 104, and thereby information is recorded on the first recording layer 104 with the laser beam 1 that has passed through the transparent layer 2 (or the substrate 22). Reproduction is performed by detecting the laser beam 1 that has been reflected by the first recording layer 104 and passed through the transparent layer 2 (or the substrate 22). On the other hand, when recording is performed on the second information layer 11, the laser beam 1 is focused on the second recording layer 204, and thereby information is recorded with the laser beam 1 that has passed through the transparent layer 2 (or the substrate 22), the first information layer 10, and the intermediate layer 3 (or the intermediate layer 23). Reproduction is performed by detecting the laser beam 1 that has been reflected by the second recording layer 204 and passed through the intermediate layer 3 (or the intermediate layer 23), the first information layer 10, and the transparent layer 2 (or the substrate 22).

In the case where guide grooves for guiding the laser beam 1 are formed on the substrate 8, and the intermediate layers 3, 5 and 6, information may be recorded on the groove surfaces (grooves) closer to the incident side of the laser beam 1, or it may be recorded on the groove surfaces (lands) farther away therefrom. Information may be recorded in both the grooves and lands.

Using this recording/reproducing apparatus, the performance of the optical information recording medium can be evaluated in the following manner. The recording performance can be evaluated in the following manner. The power of the laser beam 1 is modulated between 0 and $P_p$ (mW), random signals with mark lengths from 0.149 μm (2T) to 0.596 μm (8T) are recorded with the (1-7) modulation method, and the front end jitter and the rear end jitter of the recording marks (discrepancy in mark positions) are measured with a time interval analyzer. The smaller the jitter value is, the better the recording performance is. $P_p$ and $P_b$ are determined such that the average value (average jitter) of the front end jitter and the rear end jitter is minimized, and the optimum $P_p$ for this case is taken as the recording sensitivity.

The erasing performance can be evaluated in the following manner. The power of the laser beam 1 is modulated between 0 and $P_p$ (mW), signals with mark lengths of 0.149 μm (2T) and 0.671 μm (9T) are recorded alternately in the same groove ten consecutive times, and then the 2T signal is overwritten thereon at the eleventh time and the amplitude of the 2T signal is measured with a spectrum analyzer. Then, the 9T signal is further overwritten thereon and the amplitude of the 2T signal is measured again with the spectrum analyzer so as to calculate the difference between the amplitudes as an erasing ratio of the 2T signal. The larger the erasing ratio is, the better the erasing performance is.

The signal intensity can be evaluated in the following manner. The power of the laser beam 1 is modulated between 0 and $P_p$ (mW), signals with mark lengths of 0.149 μm (2T) and 0.671 μm (9T) are recorded alternately in the same groove ten consecutive times, and finally the 2T signal is overwritten thereon. Then, the signal amplitude at the frequency level of the 2T signal (carrier level) and the noise amplitude (noise level) are measured with the spectrum analyzer so as to calculate a CNR (carrier-to-noise ratio) between the carrier level and the noise level. The larger the CNR is, the stronger the signal intensity is.

The number of times of repeated rewriting can be evaluated in the following manner. The power of the laser beam 1 is modulated between 0 and $P_p$ (mW), random signals with mark lengths from 0.149 μm (2T) to 0.596 μm (8T) are recorded alternately in the same groove consecutively, and the front end jitter and the rear end jitter at each rewriting cycle is measured with a time interval analyzer. The number of times of repeated rewriting at which there is an increase of 3% with respect to the average jitter of the front end jitter and the rear end jitter at the first rewriting is taken as the upper limit of the number of times of repeated rewriting. $P_p$, $P_b$, $P_c$ and $P_B$ are determined such that the average jitter value is minimized.

Embodiment 10

In Embodiment 10, an embodiment of the sputtering target of the present invention will be described below.

The sputtering target of the present invention contains at least W. When this sputtering target is used, a dielectric layer (transmittance adjusting layer) containing W can be formed. The sputtering target of the present invention further may contain M1, where M1 is at least one element selected from Ce, Nb, and Ti. The sputtering target of the present invention further may contain M2, where M2 is at least one element selected from Ag, Bi, Mg, Mn, Y, Zn, and Zr. When this sputtering target is used, a transmittance adjusting layer containing W-M1, W-M2 or W-M1-M2 can be formed. By using such a sputtering target and introducing a rare gas and a trace amount of reactive gas (especially oxygen gas), the transmittance adjusting layer included in the optical information recording medium of the present invention as described in each of Embodiments 1 to 8 can be formed.

A sputtering target obtained by further including O into the above-mentioned sputtering target also can be used. Also by using such a sputtering target and introducing only a rare gas, or a rare gas and a trace amount of reactive gas (especially oxygen gas), the transmittance adjusting layer included in the optical information recording medium of the present invention as described in each of Embodiments 1 to 8 can be formed.

In addition, in a process of high-speed film formation, variations of the optical information recording medium, such as individual variations of reflectance or variations of jitter on the medium surface, for example, can be reduced. To form a film at higher speed and to reduce variations of the medium further, the sputtering target of the present invention preferably has high density (which means a filling factor of powder, and is defined as 100% when the sputtering target is filled with the powder leaving no space). The density is preferably 80% or more, and more preferably, 90% or more.

Next, an example of a manufacturing method for a sputtering target of the present invention will be described.

As an example, a manufacturing method of a sputtering target containing W and M1 will be described. Powders of high purity materials W and M1, each having a predetermined particle diameter, are prepared, and these materials are weighed and mixed at a predetermined mixture ratio, then are put into a hot pressing apparatus. The hot pressing apparatus is evacuated if necessary, and the mixed powder is sintered while being maintained for a predetermined time under conditions of a predetermined high pressure and high temperature. By mixing the materials sufficiently, the sputtering target has a uniform composition in both the in-plane and thickness directions. In addition, by optimizing the conditions of pressure, temperature and time, the filling property improves and thereby a sputtering target with high density can be produced. Thus, the sputtering target having a predetermined composition ratio of W and M1 is formed. After the sintering, the sputtering target may be bonded to, for example, a flat copper plate by using a solder such as In, if necessary. In this case, sputtering can be performed while the sputtering target is mounted onto the sputtering apparatus.

Likewise, the sputtering target containing W and M2 can be produced in the same manner as described above by preparing powders of high purity materials W and M2, each having a predetermined particle diameter. The sputtering target containing W, M1, and M2 also can be produced in the same manner as described above by preparing powders of high purity materials W, M1, and M2, each having a predetermined particle diameter. Alternatively, when the above-mentioned sputtering target is produced, powders of high purity materials W-M1 and W-M2, each having a predetermined particle diameter, may be prepared, powders of high purity materials W and M1-M2, each having a predetermined particle diameter, may be prepared, or a powder of a high purity material W-M1-M2 having a predetermined particle diameter may be prepared. The sputtering target can be produced in the same manner as described above using any of the above powder mixtures.

Likewise, a sputtering target containing O can be produced in the same manner as described above by preparing powders of high purity materials W—O, M1-O, M2-O, W-M1-O W-M2-O, and W-M1-M2-O, each having a predetermined particle diameter.

To produce the transmittance adjusting layer to be provided in the optical information recording medium of the present invention, film formation is preferably performed by sputtering using the above-mentioned sputtering target. The use of sputtering have the advantage of being able to produce good-quality thin films relatively easily because film forming apparatuses for mass production of multilayer films already have been marketed.

Figure 10:
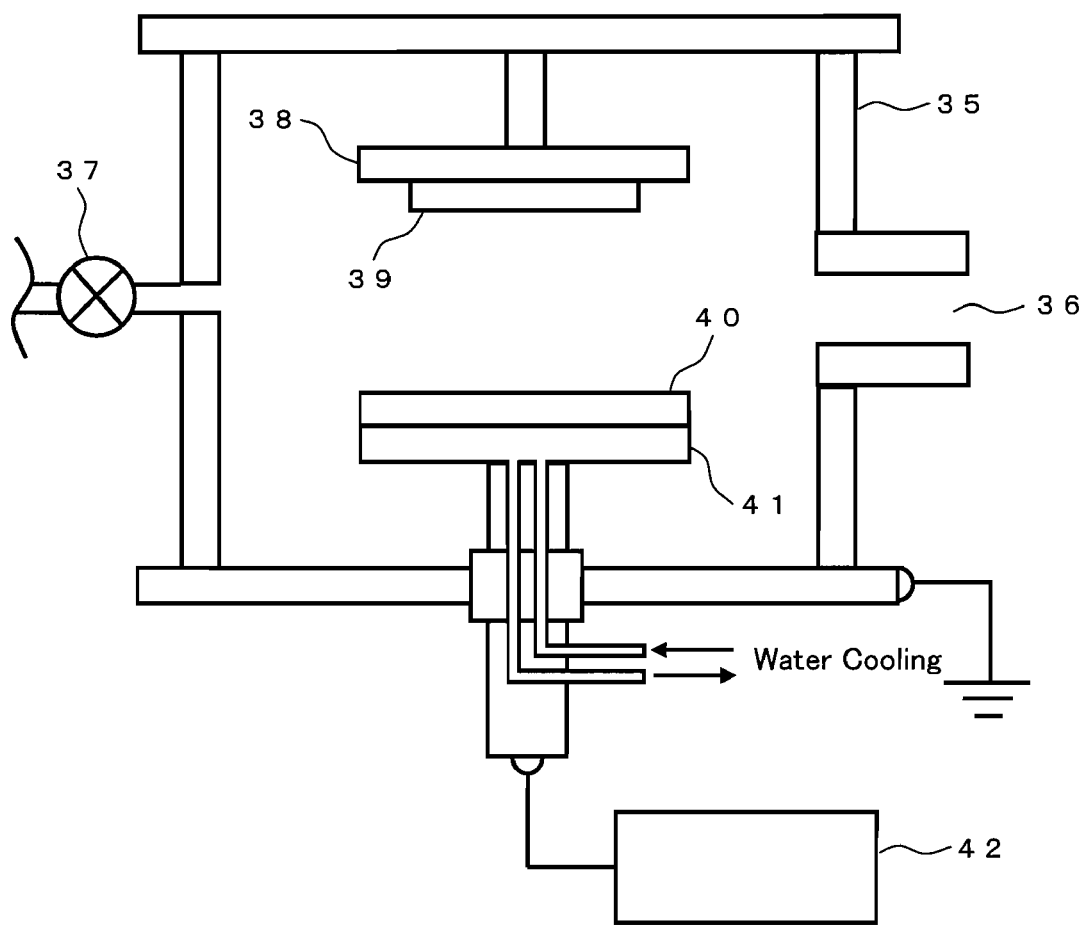
FIG. 10 is a schematic view showing a part of a sputtering apparatus used for manufacturing the optical information recording medium of the present invention.

An example of a sputtering apparatus used in the present embodiment will be described below. FIG. 10 shows the manner in which a film is formed using a sputtering apparatus. As shown in FIG. 10, in this sputtering apparatus, a vacuum pump (not shown) is connected to a vacuum container 35 through an exhaust port 36 so that a high vacuum can be maintained in the vacuum container 35. A gas can be supplied at a predetermined flow rate from a gas supply port 37. A substrate 39 (the substrate herein refers to a base material on which a film is to be deposited) is mounted on a positive electrode 38. The vacuum container 35 and the substrate 39 are maintained to be positive by grounding the vacuum container 35. A sputtering target 40 is connected to a negative electrode 41, and is connected to a power source 42 via a switch (not shown). When a predetermined voltage is applied between the positive electrode 38 and the negative electrode 41, particles are released from the sputtering target 40, and thereby a thin film is formed on the substrate 39.

EXAMPLES

Hereafter, the present invention will be described in further detail by way of Examples.

Example 1

In Example 1, the relationship between the material of the transmittance adjusting layer and the film formation rate of the transmittance adjusting layer, as well as the relationship between the degree of vacuum in the film forming chamber and the film formation rate were examined. Specifically, transmittance adjusting layers were formed on substrates using different materials, and the film formation rates were measured by changing the degree of vacuum in the film forming chamber before the film formation.

The film formation rates were measured in the following manner. First, as a substrate, a polycarbonate substrate (with a diameter of 120 mm and a thickness of 1.1 mm) was prepared, and a glass substrate for thickness measurement (with a length of 12 mm, a width of 18 mm, and a thickness of 1.1 mm) was attached onto the polycarbonate substrate. Then, a transmittance adjusting layer was formed by sputtering on the substrate to which the glass substrate was attached. The degrees of vacuum in the film forming chamber before and during the film formation were measured with an ionization vacuum gauge.

The film forming apparatus for forming the above transmittance adjusting layer by sputtering was provided with a sputtering target for forming this transmittance adjusting layer. The sputtering target was 100 mm in diameter and 6 mm in thickness. The transmittance adjusting layer was formed in an Ar gas atmosphere with a pressure of 0.13 Pa at a power of 200 W using a RF power source.

Finally, the thickness of the transmittance adjusting layer formed on the glass substrate attached onto the substrate was measured with a probe-type thickness meter. The thickness formed per unit time, that is, a film formation rate, was calculated based on the measured thickness and the time taken to form the transmittance adjusting layer.

Table 1 shows the relationship among the material of the transmittance adjusting layer thus formed, the degree of vacuum in the film forming chamber, and the film formation rate of the transmittance adjusting layer. Film formation rate was normalized by taking the film formation rate of $TiO_2$ as 1 when the degree of vacuum in the film forming chamber before the film formation was $1.3 \times 10^{-4}$ Pa.

TABLE 1

| Degree of vacuum in film forming chamber before film formation | Film formation rate of transmittance adjusting layer 109 | |
|---|---|---|
| (Pa) | $TiO_2$ | $WO_3$ |
| $1.3 \times 10^{-4}$ | 1.0 | 3.5 |
| $4.0 \times 10^{-4}$ | 0.9 | 3.5 |
| $8.0 \times 10^{-4}$ | 0.8 | 3.4 |

As a result, it was found that the film formation rate of $WO_3$ as a transmittance adjusting layer was higher than that of $TiO_2$, and the film formation rate did not decrease with the decrease in the degree of vacuum in the film forming chamber before the film formation. Thus, it was found that $WO_3$ containing W and O is preferable as a material of the transmittance adjusting layer.

Example 2

In Example 2, the optical information recording medium 12 of FIG. 2 was produced, and the relationship between the material of the transmittance adjusting layer 109 and the film formation rate, the stability of the film formation rate and the refractive index of the transmittance adjusting layer 109, the transmittance ($T_{c1}$) of the first information layer 10, and the moisture resistance of the first information layer 10 was examined. Specifically, Samples 2-1 to 2-27 of the optical information recording medium 12 including the first information layer 10 provided with the transmittance adjusting layer 109 were produced using different materials for the transmittance adjusting layer 109. With respect to each of these samples, the film formation rate, the stability of the film formation rate and the refractive index of the transmittance adjusting layer 109, as well as the transmittance of the first information layer 10 and the moisture resistance of the first information layer 10 were measured.

The samples were produced in the following manner. First, as the substrate 8, a polycarbonate substrate (with a diameter of 120 mm and a thickness of 1.1 mm) provided with guide grooves (with a depth of 20 nm and a track pitch of 0.32 μm) for guiding the laser beam 1 was prepared. Then, an Ag—Pd—Cu layer (with a thickness of 80 nm) serving as the second reflective layer 208, a $(In_2O_3)_{50}(ZrO_2)_{50}$ layer (with a thickness of 25 nm) serving as the fourth dielectric layer 206, a $Ge_{45}In_1Bi_3Te_{51}$ layer (with a thickness of 10 nm) serving as the second recording layer 204, a $(Cr_2O_3)_{50}(ZrO_2)_{50}$ layer (with a thickness of 5 nm) serving as the third interface layer 203, a $(ZnS)_{80}(SiO_2)_{20}$ layer (with a thickness of 60 nm) serving as the third dielectric layer 202 were formed sequentially on the polycarbonate substrate by sputtering.

The film forming apparatus for performing sputtering to form the above layers was provided with an Ag—Pd—Cu alloy sputtering target for forming the second reflective layer 208, an $(In_2O_3)_{50}(ZrO_2)_{50}$ sputtering target for forming the fourth dielectric layer 206, a Ge—In—Bi—Te alloy sputtering target for forming the second recording layer 204, a $(Cr_2O_3)_{50}(ZrO_2)_{50}$ sputtering target for forming the third interface layer 203, and a $(ZnS)_{80}(SiO_2)_{20}$ sputtering target for forming the third dielectric layer 202, respectively. All the sputtering targets were 100 mm in diameter and 6 mm in thickness.

The second reflective layer 208 was formed in an Ar gas atmosphere with a pressure of 0.2 Pa at a power of 200 W using a DC power source. The fourth dielectric layer 206 was formed in an Ar gas atmosphere with a pressure of 0.13 Pa at a power of 200 W using a RF power source. The second recording layer 204 was formed in an Ar gas atmosphere with a pressure of 0.13 Pa at a power of 100 W using a DC power source. The third interface layer 203 was formed in an Ar gas atmosphere with a pressure of 0.13 Pa at a power of 200 W using a RF power source. The third dielectric layer 202 was formed in an Ar gas atmosphere with a pressure of 0.13 Pa at a power of 400 W using a RF power source.

Next, an acrylic ultraviolet curable resin was applied onto the third dielectric layer 202, a substrate on which guide grooves (with a depth of 20 nm and a track pitch of 0.32 μm) were formed was placed thereon, attached tightly thereto, and rotated to form a uniform resin layer. Then, the resin was cured and the substrate was peeled off. As a result, the intermediate layer 3 with a thickness of 25 μm on which guide grooves for guiding the laser beam 1 were formed on the side facing the first information layer 10 was obtained.

After that, the transmittance adjusting layer 109 (with a thickness of 20 nm), an Ag—Pd—Cu layer (with a thickness of 9 nm) serving as the first reflective layer 108, an $Al_2O_3$ layer (with a thickness of 10 nm) serving as the second dielectric layer 106, a $(SiO_2)_{20}(In_2O_3)_{50}(ZrO_2)_{30}$ layer (with a thickness of 5 nm) serving as the second interface layer 105, a $Ge_{45}In_1Bi_3Te_{51}$ layer (with a thickness of 7 nm) serving as the first recording layer 104, a $(SiO_2)_{25}(Cr_2O_3)_{50}(ZrO_2)_{25}$ layer (with a thickness of 5 nm) serving as the first interface layer 103, and a $(ZnS)_{80}(SiO_2)_{20}$ layer (with a thickness of 40 nm) serving as the first dielectric layer 102 were formed sequentially on the intermediate layer 3 by sputtering.

The film forming apparatus for performing sputtering to form the above layers was provided with a sputtering target for forming the transmittance adjusting layer 109, an Ag—Pd—Cu alloy sputtering target for forming the first reflective layer 108, an $Al_2O_3$ sputtering target for forming the second dielectric layer 106, a $(SiO_2)_{25}(In_2O_3)_{50}(ZrO_2)_{25}$ sputtering target for forming the second interface layer 105, a Ge—In—Bi—Te alloy sputtering target for forming the first recording layer 104, a $(SiO_2)_{25}(Cr_2O_3)_{50}(ZrO_2)_{25}$ sputtering target for forming the first interface layer 103, and a $(ZnS)_{80}(SiO_2)_{20}$ sputtering target for forming the first dielectric layer 102, respectively. All the sputtering targets were 100 mm in diameter and 6 mm in thickness.

The transmittance adjusting layer 109 was formed in a mixed gas atmosphere of Ar and oxygen (3% oxygen gas with respect to the total of the mixed gas) with a pressure of 0.13 Pa at a power of 200 W using a RF power source. The first reflective layer 108 was formed in an Ar gas atmosphere with a pressure of 0.2 Pa at a power of 100 W using a DC power source. The second dielectric layer 106 was formed in an Ar gas atmosphere with a pressure of 0.13 Pa at a power of 400 W using a RF power source. The second interface layer 105 was formed in an Ar gas atmosphere with a pressure of 0.13 Pa at a power of 200 W using a RF power source. The first recording layer 104 was formed in an Ar gas atmosphere with a pressure of 0.13 Pa at a power of 50 W using a DC power source. The first interface layer 103 was formed in an Ar gas atmosphere with a pressure of 0.13 Pa at a power of 200 W using a RF power source. The first dielectric layer 102 was formed in an Ar gas atmosphere with a pressure of 0.13 Pa at a power of 400 W using a RF power source.

Finally, an acrylic ultraviolet curable resin was applied onto the first dielectric layer 102, which was rotated to form a uniform resin layer. Then, the resin was irradiated with ultraviolet rays to be cured, and thereby a transparent layer 2 with a thickness of 75 μm was formed. After that, an initialization process for crystallizing the second recording layer 204 and the first recording layer 104 by irradiation with a laser beam was carried out. A plurality of samples were produced using different materials for the transmittance adjusting layer 109 in the manner as described above. These samples were used as samples for evaluating the transmittance and the moisture resistance.

The film formation rate was measured in the same manner as in Example 1. The stability of the film formation rate was evaluated using the measurement result of the film formation rate. A stable film formation rate means that a rate of change in the film formation rate is small with respect to the degree of vacuum in the film forming chamber before the film formation. Each sample for measuring the refractive index of the transmittance adjusting layer 109 was prepared by attaching a quartz substrate (with a length of 12 mm, a width of 18 mm, and a thickness of 1.1 mm) for measuring the refractive index to a polycarbonate substrate and forming a material for the transmittance adjusting layer 109 by sputtering on the polycarbonate substrate to which the quartz substrate was attached. The refractive index was measured with an ellipsometer.

Each sample produced for evaluating the transmittance and the moisture resistance was subjected to measurement of the reflectances ($R_{c1}$ and $R_{c2}$) of the second information layer 11 and the first information layer 10 of the optical information recording medium 12 using the recording/reproducing apparatus 34 in FIG. 9. In this case, the wavelength of the laser beam 1 was 405 nm, the numerical aperture NA of the objective lens 30 was 0.85, and the linear velocity of the sample during the measurement was 4.9 m/s. The reflectances were measured in the grooves.

The transmittance ($T_{c1}$) of the first information layer 10 was obtained by measuring ahead of time the reflectance ($R_{c0}$) of the sample in which only the second information layer 11 was formed and performing a calculation ($R_{c2}=R_{c0} \times T_{c1} \times T_{c1}$) based on that reflectance ($R_{c0}$) and the reflectance ($R_{c2}$) of the second information layer 11 of each of Samples 2-1 to 2-27.

The moisture resistance of the first information layer 10 was judged by performing an accelerated aging test on each sample under the conditions of a temperature of 85° C. and a relative humidity of 85% RH (relative humidity) and observing the state of the sample after the test with an optical microscope.

Table 2 shows, for each sample, the material (film composition) of the transmittance adjusting layer 109 thus formed, the film formation rate, the stability of the film formation rate and the refractive index of the transmittance adjusting layer 109, and the transmittance and the moisture resistance of the first information layer 10. The film formation rate was normalized by taking the film formation rate of $TiO_2$ as 1 when the degree of vacuum in the film forming chamber measured in Example 1 was $1.3 \times 10^{-4}$ Pa. The stability of the film formation rate was judged, in the film forming chamber having a degree of vacuum of $1.3 \times 10^{-4}$ Pa to $8.0 \times 10^{-4}$ Pa before the film formation, as "○" when a rate of change in the film formation rate was less than 5%, as "Δ" when it was at least 5% but less than 10%, and as "x" when it was at least 10%, respectively. The moisture resistance was judged, under the conditions of a temperature of 85° C. and a relative humidity of 85% RH, as "○" when neither corrosion nor peeling occurred even after the accelerated aging for 200 hours, as "Δ" when corrosion and peeling occurred after 200 hours but they did not occur after 100 hours, and as "x" when corrosion and peeling occurred after 100 hours, respectively. Furthermore, each sample was evaluated comprehensively as "A" when the transmittance was at least 44%, and both the stability of the film formation rate and the moisture resistance were judged as "○", as "B" when the transmittance was less than 44%, or at least one of the stability of the film formation rate and the moisture resistance was judged as "Δ", as "C" when both the stability of the film formation rate and the moisture resistance were judged as "Δ", and as "D" when at least one of the stability of the film formation rate and the moisture resistance was judged as "x", respectively.

TABLE 2

| Sample No. | Material of transmittance adjusting layer 109 (mol %) | Respective elements expressed in atom % | Film formation rate | Stability | Refractive index | Transmittance (%) | Moisture resistance | Comprehensive evaluation |
|---|---|---|---|---|---|---|---|---|
| 2-1 | $WO_3$ | $W_{25.0}O_{75.0}$ | 3.5 | ○ | 2.4 | 44.7 | Δ | B |
| 2-2 | $(WO_3)_{95}(TiO_2)_5$ | $W_{24.1}Ti_{1.3}O_{74.6}$ | 3.3 | ○ | 2.4 | 45.2 | Δ | B |
| 2-3 | $(WO_3)_{80}(TiO_2)_{20}$ | $W_{21.1}Ti_{5.3}O_{73.6}$ | 3.1 | ○ | 2.5 | 46.5 | ○ | A |
| 2-4 | $(WO_3)_{50}(TiO_2)_{50}$ | $W_{14.3}Ti_{14.3}O_{71.4}$ | 2.4 | ○ | 2.6 | 47.3 | ○ | A |
| 2-5 | $(WO_3)_{20}(TiO_2)_{80}$ | $W_{6.3}Ti_{25.0}O_{68.7}$ | 1.6 | Δ | 2.7 | 48.1 | ○ | B |
| 2-6 | $TiO_2$ | $Ti_{33.3}O_{66.7}$ | 1.0 | X | 2.7 | 49.8 | ○ | D |
| 2-7 | $(WO_3)_{50}(Nb_2O_5)_{50}$ | $W_{9.1}Nb_{18.2}O_{72.7}$ | 3.2 | ○ | 2.5 | 46.6 | ○ | A |
| 2-8 | $(WO_3)_{10}(TiO_2)_{45}(Nb_2O_5)_{45}$ | $W_{2.0}Ti_{9.2}Nb_{18.4}O_{70.4}$ | 2.2 | ○ | 2.6 | 47.5 | ○ | A |
| 2-9 | $(WO_3)_5(TiO_2)_{45}(Nb_2O_5)_{50}$ | $W_{1.0}Ti_{8.9}Nb_{19.8}O_{70.3}$ | 2.1 | ○ | 2.6 | 47.7 | ○ | A |
| 2-10 | $(WO_3)_{50}(CeO_2)_{50}$ | $W_{14.3}Ce_{14.3}O_{71.4}$ | 2.6 | Δ | 2.6 | 47.4 | ○ | B |
| 2-11 | $(WO_3)_{95}(Bi_2O_3)_5$ | $W_{23.5}Bi_{2.5}O_{74.0}$ | 3.7 | ○ | 2.5 | 46.2 | Δ | B |

TABLE 2-continued

| Sample No. | Material of transmittance adjusting layer 109 (mol %) | Respective elements expressed in atom % | Film formation rate | Stability | Refractive index | Transmittance (%) | Moisture resistance | Comprehensive evaluation |
|---|---|---|---|---|---|---|---|---|
| 2-12 | $(WO_3)_{80}(Bi_2O_3)_{20}$ | $W_{19.0}Bi_{9.5}O_{71.5}$ | 4.7 | ○ | 2.6 | 47.5 | ○ | A |
| 2-13 | $(WO_3)_{50}(Bi_2O_3)_{50}$ | $W_{11.1}Bi_{22.2}O_{66.7}$ | 6.4 | ○ | 2.7 | 48.9 | ○ | A |
| 2-14 | $(WO_3)_{20}(Bi_2O_3)_{80}$ | $W_{4.2}Bi_{33.3}O_{62.5}$ | 7.7 | ○ | 2.7 | 50.0 | Δ | B |
| 2-15 | $Bi_2O_3$ | $Bi_{40.0}O_{60.0}$ | 9.1 | ○ | 2.8 | 50.7 | X | D |
| 2-16 | $(WO_3)_{50}(Ag_2O)_{50}$ | $W_{14.3}Ag_{28.6}O_{57.1}$ | 2.5 | ○ | 2.3 | 43.2 | ○ | B |
| 2-17 | $(WO_3)_{50}(MgO)_{50}$ | $W_{16.7}Mg_{16.7}O_{66.6}$ | 2.1 | ○ | 2.1 | 40.2 | ○ | B |
| 2-18 | $(WO_3)_{50}(MnO)_{50}$ | $W_{16.7}Mn_{16.7}O_{66.6}$ | 2.0 | ○ | 2.2 | 41.8 | ○ | B |
| 2-19 | $(WO_3)_{75}(Y_2O_3)_{25}$ | $W_{17.6}Y_{11.8}O_{70.6}$ | 2.9 | ○ | 2.3 | 43.5 | ○ | B |
| 2-20 | $(WO_3)_{50}(ZnO)_{50}$ | $W_{16.7}Zn_{16.7}O_{66.6}$ | 3.7 | ○ | 2.3 | 43.1 | ○ | B |
| 2-21 | $(WO_3)_{67}(ZrO_2)_{33}$ | $W_{18.3}Zr_{9.0}O_{72.7}$ | 2.7 | ○ | 2.4 | 44.4 | ○ | A |
| 2-22 | $(WO_3)_{80}(TiO_2)_{12}(Bi_2O_3)_8$ | $W_{20.2}Ti_{3.0}Bi_{4.0}O_{72.8}$ | 3.2 | ○ | 2.5 | 47.0 | ○ | A |
| 2-23 | $(WO_3)_{50}(TiO_2)_{30}(Bi_2O_3)_{20}$ | $W_{12.8}Ti_{7.7}Bi_{10.3}O_{69.2}$ | 2.5 | ○ | 2.6 | 47.6 | ○ | A |
| 2-24 | $(WO_3)_{20}(TiO_2)_{48}(Bi_2O_3)_{32}$ | $W_{5.2}Ti_{12.5}Bi_{16.7}O_{65.6}$ | 2.0 | ○ | 2.7 | 48.3 | ○ | A |
| 2-25 | $(TiO_2)_{50}(Nb_2O_5)_{50}$ | $Ti_{10}Nb_{20}O_{70}$ | 1.8 | Δ | 2.6 | 47.4 | Δ | C |
| 2-26 | $Nb_2O_5$ | $Nb_{28.4}O_{71.4}$ | 2.6 | ○ | 2.5 | 46.8 | X | D |
| 2-27 | $CeO_2$ | $Ce_{33.3}O_{66.7}$ | 1.5 | X | 2.6 | 47.5 | Δ | D |

As a result, in Sample 2-6, in which the transmittance adjusting layer 109 was made only of $TiO_2$, the film formation rate decreased 10% or more with a change in the degree of vacuum, and it was found that this sample had poor stability of the film formation rate. It also was found that Sample 2-13, in which the transmittance adjusting layer 109 was made only of $Bi_2O_3$, had poor moisture resistance. It was found that Sample 2-26, in which the transmittance adjusting layer 109 was made only of $Nb_2O_5$, had poor moisture resistance. Furthermore, it was found that Sample 2-27, in which the transmittance adjusting layer 109 was made only of $CeO_2$, had poor stability of the film formation rate.

It was found that in Sample 2-1, in which the transmittance adjusting layer 109 contains W and O, Samples 2-2 to 2-5 and Samples 2-7 to 2-10, each in which the transmittance adjusting layer 109 is represented by the above formula (1) $W_{a1}M1_{b1}O_{100-a1-b1}$ (atom %), where a1 and b1 satisfy $0<a1<30$ and $0<b1<29$, respectively, Samples 2-11 to 2-14 and Samples 2-16 to 2-21, each in which the transmittance adjusting layer 109 is represented by the above formula (3) $W_{a2}M2_{b2}O_{100-a2-b2}$ (atom %), where a2 and b2 satisfy $0<a2<30$ and $0<b2<35$, respectively, and Samples 2-22 to 2-24, each in which the transmittance adjusting layer 109 is represented by the above formula (4) $W_{a3}M1_{b3}M2_{c3}O_{100-a3-b3-c3}$ (atom %), where a3, b3, and c3 satisfy $0<a3<30$, $4<b3<16$, and $3<c3<22$, respectively, the transmittance adjusting layer 109 had a high film formation rate, good stability of the film formation rate, and high refractive index of 2.1 or more. It was found that the first information layer 10 also had a good transmittance and moisture resistance. Particularly among these samples, Samples 2-3 to 2-5, 2-7 to 2-10, 2-11 to 2-14, and 2-22 to 2-24, each in which the transmittance adjusting layer 109 is an oxide containing at least one element selected from W, Ce, Nb, Ti, and Bi, had a high refractive index of 2.5 or more and could enhance the transmittance of the first information layer to 10 to 45% or higher. Therefore, it was found that these samples were particularly excellent as a transmittance adjusting layer. Compared with Samples 2-8 and 2-9, each in which the transmittance adjusting layer 109 was made of W, M1 (where M1 is Ti and Nb) and O, Sample 2-25 produced as a comparative example in which the transmittance adjusting layer 109 was made only of M1 (where M1 is Ti and Nb) and O had a slightly low film formation rate and slightly deteriorated moisture resistance. Samples 2-26 and 2-27 were produced as comparative examples, each in which the transmittance adjusting layer 109 did not contain W and was made only of M1 (where M1 is Nb or Ce) and O. Sample 2-26 made of $Nb_2O_5$ had poor moisture resistance, and Sample 2-27 made of $CeO_2$ had poor stability of the film formation rate.

In each of Samples 2-3 and 2-4 in which $10 \leq a1 \leq 22$ and $5 \leq b1 \leq 23$ are satisfied in the above formula (1), the transmittance adjusting layer 109 had sufficiently high film formation rate, good stability of the film formation rate, sufficiently high refractive index, and further excellent moisture resistance.

From the above results, it was found that the transmittance adjusting layer 109 has a composition desirably containing at least W and O, and further preferably containing the materials represented by the formulas (1), (3) and (4).

Example 3

In Example 3, the optical information recording medium 16 of FIG. 3 was produced, and the relationship between the material of the first transmittance adjusting layer 309 and the film formation rate, the stability of the film formation rate and the refractive index of the first transmittance adjusting layer 309, the transmittance of the first information layer 13, and the moisture resistance of the first information layer 13 was examined. Specifically, Samples 3-1 to 3-11 of the optical information recording medium 16 including the first information layer 13 provided with the first transmittance adjusting layer 309 were produced using different materials for the first transmittance adjusting layer 309. With respect to each of these samples, the film formation rate, the stability of the film formation rate and the refractive index of the first transmittance adjusting layer 309, as well as the transmittance of the first information layer 13 and the moisture resistance of the first information layer 13 were measured.

The samples were produced in the following manner. First, as the substrate 8, a polycarbonate substrate (with a diameter of 120 mm and a thickness of 1.1 mm) provided with guide grooves (with a depth of 20 nm and a track pitch of 0.32 μm) for guiding the laser beam 1 was prepared. Then, an Ag—Pd—Cu layer (with a thickness of 100 nm) serving as the third reflective layer 508, a $(SiO_2)_{25}(In_2O_3)_{50}(ZrO_2)_{25}$ layer (with a thickness of 10 nm) serving as the sixth dielectric layer 506, a $(Cr_2O_3)_{50}(ZrO_2)_{50}$ layer (with a thickness of 5 nm) serving as the sixth interface layer 505 (not shown), a $Sb_{80}Te_{14}Ge_6$ layer (with a thickness of 10 nm) serving as the third recording layer 504, a $(Cr_2O_3)_{50}(ZrO_2)_{50}$ layer (with a thickness of 5 nm) serving as the fifth interface layer 503, and a $(ZnS)_{80}(SiO_2)_{20}$ layer (with a thickness of 45 nm) serving as the fifth dielectric layer 502 were formed sequentially on the polycarbonate substrate by sputtering.

The film forming apparatus for performing sputtering to form the above layers was provided with an Ag—Pd—Cu alloy sputtering target for forming the third reflective layer 508, a $(SiO_2)_{25}(In_2O_3)_{50}(ZrO_2)_{25}$ sputtering target for forming the sixth dielectric layer 506, a $(Cr_2O_3)_{50}(ZrO_2)_{50}$ sputtering target for forming the sixth interface layer 505, a Sb—Te—Ge alloy sputtering target for forming the third recording layer 504, a $(Cr_2O_3)_{50}(ZrO_2)_{50}$ sputtering target for forming the fifth interface layer 503, and a $(ZnS)_{80}(SiO_2)_{20}$ sputtering target for forming the fifth dielectric layer 502, respectively. All the sputtering targets were 200 mm in diameter and 6 mm in thickness.

The third reflective layer 508 was formed in an Ar gas atmosphere with a pressure of 0.2 Pa at a power of 2000 W using a DC power source. The sixth dielectric layer 506 was formed in an Ar gas atmosphere with a pressure of 0.13 Pa at a power of 2000 W using a RF power source. The sixth interface layer 505 was formed in an Ar gas atmosphere with a pressure of 0.13 Pa at a power of 3000 W using a RF power source. The third recording layer 504 was formed in an Ar gas atmosphere with a pressure of 0.13 Pa at a power of 200 W using a pulse DC power source. The fifth interface layer 503 was formed in an Ar gas atmosphere with a pressure of 0.13 Pa at a power of 3000 W using a RF power source. The fifth dielectric layer 502 was formed in an Ar gas atmosphere with a pressure of 0.13 Pa at a power of 2500 W using a RF power source.

Next, an acrylic ultraviolet curable resin was applied onto the fifth dielectric layer 502, a substrate on which guide grooves (with a depth of 20 nm and a track pitch of 0.32 μm) were formed was placed thereon, attached tightly thereto, and rotated to form a uniform resin layer. Then, the resin was cured and the substrate was peeled off. As a result, the intermediate layer 5 with a thickness of 15 μm on which guide grooves for guiding the laser beam 1 were formed on the side facing the second information layer 14 was obtained.

After that, a $(WO_3)_{50}(Bi_2O_3)_{50}$ layer (with a thickness of 20 nm) serving as the second transmittance adjusting layer 409, an Ag—Pd—Cu layer (with a thickness of 8 nm) serving as the second reflective layer 408, an $(In_2O_3)_{50}(ZrO_2)_{50}$ layer (with a thickness of 10 nm) serving as the fourth dielectric layer 406, a $Ge_{40}Sn_5Sb_1Bi_3Te_{51}$ layer (with a thickness of 6 nm) serving as the second recording layer 404, a $(SiO_2)_{25}(Cr_2O_3)_{50}(ZrO_2)_{25}$ layer (with a thickness of 5 nm) serving as the third interface layer 403, and a $(ZnS)_{80}(SiO_2)_{20}$ layer (with a thickness of 45 nm) serving as the fourth dielectric layer 402 were formed sequentially on the intermediate layer 5 by sputtering.

The film forming apparatus for performing sputtering to form the above layers was provided with a $(WO_3)_{50}(Bi_2O_3)_{50}$ sputtering target for forming the second transmittance adjusting layer 409, an Ag—Pd—Cu alloy sputtering target for forming the second reflective layer 408, an $(In_2O_3)_{50}(ZrO_2)_{50}$ sputtering target for forming the fourth dielectric layer 406, a Ge—Sn—In—Bi—Te alloy sputtering target for forming the fourth recording layer 404, a $(SiO_2)_{25}(Cr_2O_3)_{50}(ZrO_2)_{25}$ sputtering target for forming the third interface layer 403, and a $(ZnS)_{80}(SiO_2)_{20}$ sputtering target for forming the third dielectric layer 402, respectively. All the sputtering targets were 200 mm in diameter and 6 mm in thickness.

The second transmittance adjusting layer 409 was formed in a mixed gas atmosphere of Ar and oxygen (3% oxygen gas with respect to the total of the mixed gas) with a pressure of 0.13 Pa at a power of 2000 W using a pulse DC power source. The second reflective layer 408 was formed in an Ar gas atmosphere with a pressure of 0.2 Pa at a power of 1000 W using a DC power source. The fourth dielectric layer 406 was formed in an Ar gas atmosphere with a pressure of 0.13 Pa at a power of 2000 W using a RF power source. The second recording layer 404 was formed in an Ar gas atmosphere with a pressure of 0.13 Pa at a power of 100 W using a pulse DC power source. The third interface layer 403 was formed in an Ar gas atmosphere with a pressure of 0.13 Pa at a power of 3000 W using a RF power source. The third dielectric layer 402 was formed in an Ar gas atmosphere with a pressure of 0.13 Pa at a power of 2500 W using a RF power source.

Next, an acrylic ultraviolet curable resin was applied onto the third dielectric layer 402, a substrate on which guide grooves (with a depth of 20 nm and a track pitch of 0.32 μm) were formed was placed thereon, attached tightly thereto, and rotated to form a uniform resin layer. Then, the resin was cured and the substrate was peeled off. As a result, the intermediate layer 3 with a thickness of 25 μm on which guide grooves for guiding the laser beam 1 were formed on the side facing the first information layer 13 was obtained.

After that, the first transmittance adjusting layer 309 (with a thickness of 15 nm), an Ag—Pd—Cu layer (with a thickness of 7 nm) serving as the first reflective layer 308, an $Al_2O_3$ layer (with a thickness of 10 nm) serving as the second dielectric layer 306, a $(SiO_2)_{25}(Cr_2O_3)_{50}(ZrO_2)_{25}$ layer (with a thickness of 5 nm) serving as the second interface layer 305 (not shown), a $Ge_{40}Sn_5In_1Bi_3Te_{51}$ layer (with a thickness of 5.5 nm) serving as the first recording layer 304, a $(SiO_2)_{25}(Cr_2O_3)_{50}(ZrO_2)_{25}$ layer (with a thickness of 5 nm) serving as the first interface layer 303, a $(ZnS)_{80}(SiO_2)_{20}$ layer (with a thickness of 35 nm) serving as the first dielectric layer 302 were formed sequentially on the intermediate layer 3 by sputtering.

The film forming apparatus for performing sputtering to form the above layers was provided with a sputtering target for forming the first transmittance adjusting layer 309, an Ag—Pd—Cu alloy sputtering target for forming the first reflective layer 308, an $Al_2O_3$ sputtering target for forming the second dielectric layer 306, a $(SiO_2)_{25}(Cr_2O_3)_{50}(ZrO_2)_{25}$ sputtering target for forming the second interface layer 305, a Ge—Sn—In—Bi—Te alloy sputtering target for forming the first recording layer 304, a $(SiO_2)_{25}(Cr_2O_3)_{50}(ZrO_2)_{25}$ sputtering target for forming the first interface layer 303, and a $(ZnS)_{80}(SiO_2)_{20}$ sputtering target for forming the first dielectric layer 302, respectively. All the sputtering targets were 200 mm in diameter and 6 mm in thickness.

The first transmittance adjusting layer 309 was formed in a mixed gas atmosphere of Ar and oxygen (3% oxygen gas with respect to the total of the mixed gas) with a pressure of 0.13 Pa at a power of 2000 W using a pulse DC power source. The first reflective layer 308 was formed in an Ar gas atmosphere with a pressure of 0.2 Pa at a power of 1000 W using a DC power source. The second dielectric layer 306 was formed in an Ar gas atmosphere with a pressure of 0.13 Pa at a power of 2000 W using a RF power source. The second interface layer 305 was formed in an Ar gas atmosphere with a pressure of 0.13 Pa at a power of 3000 W using a RF power source. The first recording layer 304 was formed in an Ar gas atmosphere with a pressure of 0.13 Pa at a power of 100 W using a pulse DC power source. The first interface layer 303 was formed in an Ar gas atmosphere with a pressure of 0.13 Pa at a power of 3000 W using a RF power source. The first dielectric layer 302 was formed in an Ar gas atmosphere with a pressure of 0.13 Pa at a power of 2500 W using a RF power source.

Finally, an acrylic ultraviolet curable resin was applied onto the first dielectric layer 302, which was rotated to form a uniform resin layer. Then, the resin was irradiated with ultraviolet rays to be cured, and thereby a transparent layer 2 with a thickness of 60 μm was formed. After that, an initialization process for crystallizing the third recording layer 504, the second recording layer 404 and the first recording layer 304 by irradiation with a laser beam was carried out. A plurality of samples were produced using different materials for the first transmittance adjusting layer 309 in the manner as described above. These samples were used as samples for evaluating the transmittance and the moisture resistance.

The film formation rate, the stability of the film formation rate, and the refractive index of the first transmittance adjusting layer 309 were measured in the same manner as in Example 2.

Each sample produced for evaluating the transmittance and the moisture resistance was subjected to measurement of the reflectances ($R_{c1}$, $R_{c2}$ and $R_{c3}$) of the third information layer 15, the second information layer 14 and the first information layer 13 of the optical information recording medium 16 using the recording/reproducing apparatus 34 in FIG. 9. In this case, the wavelength of the laser beam 1 was 405 nm, the numerical aperture NA of the objective lens 30 was 0.85, and the linear velocity of the sample during the measurement was 4.9 m/s. The reflectances were measured in the grooves.

The transmittance ($T_{c1}$) of the first information layer 13 was obtained by measuring ahead of time the reflectance ($R_{c0}$) of the sample in which only the second information layer 14 was formed and performing a calculation ($R_{c2}=R_{c0} \times T_{c1} \times T_{c1}$) based on that reflectance ($R_{c0}$) and the reflectance ($R_{c2}$) of the second information layer 14 of each of Samples 3-1 to 3-11.

The moisture resistance of the first information layer 13 was judged by performing an accelerated aging test on each sample under the conditions of a temperature of 85° C. and a relative humidity of 85% RH and observing the state of the sample after the test with an optical microscope.

Table 3 shows, for each sample, the material (film composition) of the first transmittance adjusting layer 309 thus formed, the film formation rate, the stability of the film formation rate and the refractive index of the first transmittance adjusting layer 309, and the transmittance ($T_{c1}$) and the moisture resistance of the first information layer 13. The film formation rate was normalized by taking the film formation rate of $TiO_2$ as 1 when the degree of vacuum in the film forming chamber measured in Example 1 was $1.3 \times 10^{-4}$ Pa. The stability of the film formation rate was judged, in the film forming chamber having a degree of vacuum of $1.3 \times 10^{-4}$ Pa to $8.0 \times 10^{-4}$ Pa before the film formation, as "○" when a rate of change in the film formation rate was less than 5%, as "Δ" when it was at least 5% but less than 10%, and as "x" when it was at least 10%, respectively. The moisture resistance was judged, under the conditions of a temperature of 85° C. and a relative humidity of 85% RH, as "○" when neither corrosion nor peeling occurred even after the accelerated aging for 200 hours, as "Δ" when corrosion and peeling occurred after 200 hours but they did not occur after 100 hours, and as "x" when corrosion and peeling occurred after 100 hours, respectively. Furthermore, each sample was evaluated comprehensively as "A" when the transmittance was at least 50%, and both the stability of the film formation rate and the moisture resistance were judged as "○", as "B" when the transmittance was less than 50%, or at least one of the stability of the film formation rate and the moisture resistance was judged as "Δ", as "C" when both the stability of the film formation rate and the moisture resistance were judged as "Δ", and as "D" when at least one of the stability of the film formation rate and the moisture resistance was judged as "x", respectively.

TABLE 3

| Sample No. | Material of first transmittance adjusting layer 309 (mol %) | Respective elements expressed in atom % | Film formation rate | Stability | Refractive index | Transmittance (%) | Moisture resistance | Comprehensive evaluation |
|---|---|---|---|---|---|---|---|---|
| 3-1 | $(WO_3)_{80}(TiO_2)_{20}$ | $W_{21.1}Ti_{5.3}O_{73.6}$ | 2.9 | ○ | 2.5 | 50.2 | ○ | A |
| 3-2 | $(WO_3)_{50}(TiO_2)_{50}$ | $W_{14.3}Ti_{14.3}O_{71.4}$ | 2.4 | ○ | 2.6 | 51.9 | ○ | A |
| 3-3 | $(WO_3)_{20}(TiO_2)_{80}$ | $W_{6.3}Ti_{25.0}O_{68.7}$ | 1.3 | Δ | 2.7 | 53.6 | ○ | B |
| 3-4 | $(WO_3)_{50}(Nb_2O_5)_{50}$ | $W_{9.1}Nb_{18.2}O_{72.7}$ | 3.2 | ○ | 2.5 | 50.4 | ○ | A |
| 3-5 | $(WO_3)_{50}(CeO_2)_{50}$ | $W_{14.3}Ce_{14.3}O_{71.4}$ | 2.5 | Δ | 2.6 | 52.1 | ○ | B |
| 3-6 | $(WO_3)_{80}(Bi_2O_3)_{20}$ | $W_{19.0}Bi_{9.5}O_{71.5}$ | 4.7 | ○ | 2.6 | 52.3 | ○ | A |
| 3-7 | $(WO_3)_{50}(Bi_2O_3)_{50}$ | $W_{11.1}Bi_{22.2}O_{66.7}$ | 5.9 | ○ | 2.7 | 53.5 | ○ | A |
| 3-8 | $(WO_3)_{20}(Bi_2O_3)_{80}$ | $W_{4.2}Bi_{33.3}O_{62.5}$ | 7.1 | ○ | 2.7 | 54.0 | Δ | B |
| 3-9 | $(WO_3)_{80}(TiO_2)_{12}(Bi_2O_3)_8$ | $W_{20.2}Ti_{3.0}Bi_{4.0}O_{72.8}$ | 3.1 | ○ | 2.5 | 51.0 | ○ | A |
| 3-10 | $(WO_3)_{50}(TiO_2)_{30}(Bi_2O_3)_{20}$ | $W_{12.8}Ti_{7.7}Bi_{10.3}O_{69.2}$ | 2.4 | ○ | 2.6 | 52.7 | ○ | A |
| 3-11 | $(WO_3)_{20}(TiO_2)_{48}(Bi_2O_3)_{32}$ | $W_{5.2}Ti_{12.5}Bi_{16.7}O_{65.6}$ | 1.8 | ○ | 2.7 | 53.8 | ○ | A |

As a result, it was found that in Samples 3-1 to 3-11, each in which the first transmittance adjusting layer 309 contains W and O and is represented by the above formula (1), (3) or (4), the first transmittance adjusting layer 309 had a high film formation rate, good stability of the film formation rate, and high refractive index of 2.5 or more. It was found that the first information layer 13 also had a good transmittance and moisture resistance.

From the above results, it was found that the first transmittance adjusting layer 309 has a composition desirably containing at least W and O and preferably represented by, for example, the formula (1), (3) or (4).

Example 4

In Example 4, the optical information recording medium 21 of FIG. 4 was produced, and the relationship between the material of the first transmittance adjusting layer 609 and the film formation rate, the stability of the film formation rate and the refractive index of the first transmittance adjusting layer 609, the transmittance of the first information layer 17, and the moisture resistance of the first information layer 17 was examined. Specifically, Samples 4-1 to 4-8 of the optical information recording medium 21 including the first information layer 17 provided with the first transmittance adjusting layer 609 were produced using different materials for the first transmittance adjusting layer 609. With respect to each of these samples, the film formation rate, the stability of the film formation rate and the refractive index of the first transmittance adjusting layer 609, as well as the transmittance of the first information layer 17 and the moisture resistance of the first information layer 17 were measured.

The samples were produced in the following manner. First, as the substrate 8, a polycarbonate substrate (with a diameter of 120 mm and a thickness of 1.1 mm) provided with guide grooves (with a depth of 20 nm and a track pitch of 0.32 μm) for guiding the laser beam 1 was prepared. Then, an Ag—Pd—Cu layer (with a thickness of 100 nm) serving as the fourth reflective layer 908, a $(SiO_2)_{25}(In_2O_3)_{50}(ZrO_2)_{25}$ layer (with a thickness of 10 nm) serving as the eighth dielectric layer 906, a $(Cr_2O_3)_{50}(ZrO_2)_{50}$ layer (with a thickness of 5 nm) serving as the eighth interface layer 905 (not shown), a $Ge_{40}Sn_5In_1Bi_3Te_{51}$ layer (with a thickness of 12 nm) serving as the fourth recording layer 904, a $(Cr_2O_3)_{50}(ZrO_2)_{50}$ layer (with a thickness of 5 nm) serving as the seventh interface layer 903, a $(ZnS)_{80}(SiO_2)_{20}$ layer (with a thickness of 65 nm) serving as the seventh dielectric layer 902 were formed sequentially on the polycarbonate substrate by sputtering.

The film forming apparatus for performing sputtering to form the above layers was provided with an Ag—Pd—Cu alloy sputtering target for forming the fourth reflective layer 908, a $(SiO_2)_{25}(In_2O_3)_{50}(ZrO_2)_{25}$ sputtering target for forming the eighth dielectric layer 906, a $(Cr_2O_3)_{50}(ZrO_2)_{50}$ sputtering target for forming the eighth interface layer 905, a Ge—Sn—In—Bi—Te alloy sputtering target for forming the fourth recording layer 904, a $(Cr_2O_3)_{50}(ZrO_2)_{50}$ sputtering target for forming the seventh interface layer 903, and a $(ZnS)_{80}(SiO_2)_{20}$ sputtering target for forming the seventh dielectric layer 902, respectively. All the sputtering targets were 200 mm in diameter and 6 mm in thickness.

The fourth reflective layer 908 was formed in an Ar gas atmosphere with a pressure of 0.2 Pa at a power of 2000 W using a DC power source. The eighth dielectric layer 906 was formed in an Ar gas atmosphere with a pressure of 0.13 Pa at a power of 2000 W using a RF power source. The eighth interface layer 905 was formed in an Ar gas atmosphere with a pressure of 0.13 Pa at a power of 3000 W using a RF power source. The fourth recording layer 904 was formed in an Ar gas atmosphere with a pressure of 0.13 Pa at a power of 200 W using a pulse DC power source. The seventh interface layer 903 was formed in an Ar gas atmosphere with a pressure of 0.13 Pa at a power of 3000 W using a RF power source. The seventh dielectric layer 902 was formed in an Ar gas atmosphere with a pressure of 0.13 Pa at a power of 2500 W using a RF power source.

Next, an acrylic ultraviolet curable resin was applied onto the seventh dielectric layer 902, a substrate on which guide grooves (with a depth of 20 nm and a track pitch of 0.32 μm) were formed was placed thereon, attached tightly thereto, and rotated to form a uniform resin layer. Then, the resin was cured and the substrate was peeled off. As a result, the intermediate layer 6 with a thickness of 10 μm on which guide grooves for guiding the laser beam 1 were formed on the side facing the third information layer 19 was obtained.

After that, a $(WO_3)_{50}(Bi_2O_3)_{50}$ layer (with a thickness of 20 nm) serving as the third transmittance adjusting layer 809, an Ag—Pd—Cu layer (with a thickness of 8 nm) serving as the third reflective layer 808, an $(In_2O_3)_{50}(ZrO_2)_{50}$ layer (with a thickness of 10 nm) serving as the sixth dielectric layer 806, a $Sb_{85}Ge_{15}$ layer (with a thickness of 6 nm) serving as the third recording layer 804, a $(SiO_2)_{25}(Cr_2O_3)_{50}(ZrO_2)_{25}$ layer (with a thickness of 5 nm) serving as the fifth interface layer 803, and a $(ZnS)_{80}(SiO_2)_{20}$ layer (with a thickness of 45 nm) serving as the fifth dielectric layer 802 were formed sequentially on the intermediate layer 6 by sputtering.

The film forming apparatus for performing sputtering to form the above layers was provided with a $(WO_3)_{50}(Bi_2O_3)_{50}$ sputtering target for forming the third transmittance adjusting layer 809, an Ag—Pd—Cu alloy sputtering target for forming the third reflective layer 808, an $(In_2O_3)_{50}(ZrO_2)_{50}$ sputtering target for forming the sixth dielectric layer 806, a Sb—Ge alloy sputtering target for forming the third recording layer 804, a $(SiO_2)_{25}(Cr_2O_3)_{50}(ZrO_2)_{25}$ sputtering target for forming the fifth interface layer 803, and a $(ZnS)_{80}(SiO_2)_{20}$ sputtering target for forming the fifth dielectric layer 802, respectively. All the sputtering targets were 200 mm in diameter and 6 mm in thickness.

The third transmittance adjusting layer 809 was formed in a mixed gas atmosphere of Ar and oxygen (3% oxygen gas with respect to the total of the mixed gas) with a pressure of 0.13 Pa at a power of 2000 W using a pulse DC power source. The third reflective layer 808 was formed in an Ar gas atmosphere with a pressure of 0.2 Pa at a power of 1000 W using a DC power source. The sixth dielectric layer 806 was formed in an Ar gas atmosphere with a pressure of 0.13 Pa at a power of 2000 W using a RF power source. The third recording layer 804 was formed in an Ar gas atmosphere with a pressure of 0.13 Pa at a power of 100 W using a pulse DC power source. The fifth interface layer 803 was formed in an Ar gas atmosphere with a pressure of 0.13 Pa at a power of 3000 W using a RF power source. The fifth dielectric layer 802 was formed in an Ar gas atmosphere with a pressure of 0.13 Pa at a power of 2500 W using a RF power source.

Next, an acrylic ultraviolet curable resin was applied onto the fifth dielectric layer 802, a substrate on which guide grooves (with a depth of 20 nm and a track pitch of 0.32 μm) were formed was placed thereon, attached tightly thereto, and rotated to form a uniform resin layer. Then, the resin was cured and the substrate was peeled off. As a result, the intermediate layer 5 with a thickness of 20 μm on which guide grooves for guiding the laser beam 1 were formed on the side facing the second information layer 18 was obtained.

After that, a $(WO_3)_{50}(TiO_2)_{30}(Bi_2O_3)_{20}$ layer (with a thickness of 20 nm) serving as the second transmittance adjusting layer 709, an Ag—Pd—Cu layer (with a thickness of 7 nm) serving as the second reflective layer 708, an $(In_2O_3)_{50}(ZrO_2)_{50}$ layer (with a thickness of 10 nm) serving as the fourth dielectric layer 706, a $Sb_{81}Te_{13}Ge_6$ layer (with a thickness of 5 nm) serving as the second recording layer 704, a $(SiO_2)_{25}(Cr_2O_3)_{50}(ZrO_2)_{25}$ layer (with a thickness of 5 nm) serving as the third interface layer 703, and a $(ZnS)_{80}(SiO_2)_{20}$ layer (with a thickness of 40 nm) serving as the third dielectric layer 702 were formed sequentially on the intermediate layer 5 by sputtering.

The film forming apparatus for performing sputtering to form the above layers was provided with a $(WO_3)_{50}(TiO_2)_{30}(Bi_2O_3)_{20}$ sputtering target for forming the second transmittance adjusting layer 709, an Ag—Pd—Cu alloy sputtering target for forming the second reflective layer 708, an $(In_2O_3)_{50}(ZrO_2)_{50}$ sputtering target for forming the fourth dielectric layer 706, a Sb—Te—Ge alloy sputtering target for forming the second recording layer 704, a $(SiO_2)_{25}(Cr_2O_3)_{50}(ZrO_2)_{25}$ sputtering target for forming the third interface layer 703, and a $(ZnS)_{80}(SiO_2)_{20}$ sputtering target for forming the third dielectric layer 702, respectively. All the sputtering targets were 200 mm in diameter and 6 mm in thickness.

The second transmittance adjusting layer 709 was formed in a mixed gas atmosphere of Ar and oxygen (3% oxygen gas with respect to the total of the mixed gas) with a pressure of 0.13 Pa at a power of 2000 W using a pulse DC power source. The second reflective layer 708 was formed in an Ar gas atmosphere with a pressure of 0.2 Pa at a power of 1000 W using a DC power source. The fourth dielectric layer 706 was formed in an Ar gas atmosphere with a pressure of 0.13 Pa at a power of 2000 W using a RF power source. The second recording layer 704 was formed in an Ar gas atmosphere with a pressure of 0.13 Pa at a power of 100 W using a pulse DC power source. The third interface layer 703 was formed in an Ar gas atmosphere with a pressure of 0.13 Pa at a power of 3000 W using a RF power source. The third dielectric layer 702 was formed in an Ar gas atmosphere with a pressure of 0.13 Pa at a power of 2500 W using a RF power source.

Next, an acrylic ultraviolet curable resin was applied onto the third dielectric layer 702, a substrate on which guide grooves (with a depth of 20 nm and a track pitch of 0.32 μm) were formed was placed thereon, attached tightly thereto, and rotated to form a uniform resin layer. Then, the resin was cured and the substrate was peeled off. As a result, the intermediate layer 3 with a thickness of 15 μm on which guide grooves for guiding the laser beam 1 were formed on the side facing the first information layer 17 was obtained.

After that, the first transmittance adjusting layer 609 (with a thickness of 15 nm), an Ag—Pd—Cu layer (with a thickness of 6 nm) serving as the first reflective layer 608, an $Al_2O_3$ layer (with a thickness of 10 nm) serving as the second dielectric layer 606, a $(SiO_2)_{25}(Cr_2O_3)_{50}(ZrO_2)_{25}$ layer (with a thickness of 3 nm) serving as the second interface layer 605 (not shown), a $Ge_{40}Sn_5In_1Bi_3Te_{51}$ layer (with a thickness of 4.5 nm) serving as the first recording layer 604, a $(SiO_2)_{25}(Cr_2O_3)_{50}(ZrO_2)_{25}$ layer (with a thickness of 5 nm) serving as the first interface layer 603, and a $(ZnS)_{80}(SiO_2)_{20}$ layer (with a thickness of 35 nm) serving as the first dielectric layer 602 were formed sequentially on the intermediate layer 3 by sputtering.

The film forming apparatus for performing sputtering to form the above layers was provided with a sputtering target for forming the first transmittance adjusting layer 609, an Ag—Pd—Cu alloy sputtering target for forming the first reflective layer 608, an $Al_2O_3$ sputtering target for forming the second dielectric layer 606, a $(SiO_2)_{25}(Cr_2O_3)_{50}(ZrO_2)_{25}$ sputtering target for forming the second interface layer 605, a Ge—Sn—In—Bi—Te alloy sputtering target for forming the first recording layer 604, a $(SiO_2)_{25}(Cr_2O_3)_{50}(ZrO_2)_{25}$ sputtering target for forming the first interface layer 603, and a $(ZnS)_{80}(SiO_2)_{20}$ sputtering target for forming the first dielectric layer 602, respectively. All the sputtering targets were 200 mm in diameter and 6 mm in thickness.

The first transmittance adjusting layer 609 was formed in a mixed gas atmosphere of Ar and oxygen (3% oxygen gas with respect to the total of the mixed gas) with a pressure of 0.13 Pa at a power of 2000 W using a pulse DC power source. The first reflective layer 608 was formed in an Ar gas atmosphere with a pressure of 0.2 Pa at a power of 1000 W using a DC power source. The second dielectric layer 606 was formed in an Ar gas atmosphere with a pressure of 0.13 Pa at a power of 2000 W using a RF power source. The second interface layer 605 was formed in an Ar gas atmosphere with a pressure of 0.13 Pa at a power of 3000 W using a RF power source. The first recording layer 604 was formed in an Ar gas atmosphere with a pressure of 0.13 Pa at a power of 100 W using a pulse DC power source. The first interface layer 603 was formed in an Ar gas atmosphere with a pressure of 0.13 Pa at a power of 3000 W using a RF power source. The first dielectric layer 602 was formed in an Ar gas atmosphere with a pressure of 0.13 Pa at a power of 2500 W using a RF power source.

Finally, an acrylic ultraviolet curable resin was applied onto the first dielectric layer 602, which was rotated to form a uniform resin layer. Then, the resin was irradiated with ultraviolet rays to be cured, and thereby a transparent layer 2 with a thickness of 55 μm was formed. After that, an initialization process for crystallizing the fourth recording layer 904, the third recording layer 804, the second recording layer 704 and the first recording layer 604 by irradiation with a laser beam was carried out. A plurality of samples were produced using different materials for the first transmittance adjusting layer 609 in the manner as described above. These samples were used as samples for evaluating the transmittance and moisture resistance.

The film formation rate, the stability of the film formation rate, and the refractive index of the first transmittance adjusting layer 609 were measured in the same manner as in Example 2.

Each sample produced for evaluating the transmittance and the moisture resistance was subjected to measurement of the reflectances of the fourth information layer 20, the third information layer 19, the second information layer 18 and the first information layer 17 of the optical information recording medium 21 using the recording/reproducing apparatus 34 in FIG. 9. In this case, the wavelength of the laser beam 1 was 405 nm, the numerical aperture NA of the objective lens 30 was 0.85, and the linear velocity of the sample during the measurement was 4.9 m/s. The reflectances were measured in the grooves.

The transmittance ($T_{c1}$) of the first information layer 17 was obtained by measuring ahead of time the reflectance ($R_{c0}$) of the sample in which only the second information layer 18 was formed and performing a calculation ($R_{c2}=R_{c0} \times T_{c1} \times T_{c1}$) based on that reflectance ($R_{c0}$) and the reflectance ($R_{c2}$) of the second information layer 18 of each of Samples 4-1 to 4-8.

The moisture resistance of the first information layer 17 was judged by performing an accelerated aging test on each sample under the conditions of a temperature of 85° C. and a relative humidity of 85% RH and observing the state of the sample after the test with an optical microscope.

Table 4 shows, for each sample, the material (film composition) of the first transmittance adjusting layer 609 thus formed, the film formation rate, the stability of the film formation rate and the refractive index of the first transmittance adjusting layer 609, and the transmittance and the moisture resistance of the first information layer 17. The film formation rate was normalized by taking the film formation rate of $TiO_2$ as 1 when the degree of vacuum in the film forming chamber measured in Example 1 was $1.3 \times 10^{-4}$ Pa. The stability of the film formation rate was judged, in the film forming chamber having a degree of vacuum of $1.3 \times 10^{-4}$ Pa to $8.0 \times 10^{-4}$ Pa before the film formation, as "○" when a rate of change in the film formation rate was less than 5%, as "Δ" when it was at least 5% but less than 10%, and as "x" when it was at least 10%, respectively. The moisture resistance was judged, under the conditions of a temperature of 85° C. and a relative humidity of 85% RH, as "○" when neither corrosion nor peeling occurred even after the accelerated aging for 200 hours, as "Δ" when corrosion and peeling occurred after 200 hours but they did not occur after 100 hours, and as "x" when corrosion and peeling occurred after 100 hours, respectively. Furthermore, each sample was evaluated comprehensively as "A" when the transmittance was at least 50%, and both the stability of the film formation rate and the moisture resistance were judged as "○", as "B" when the transmittance was less than 50%, or at least one of the stability of the film formation rate and the moisture resistance was judged as "Δ", as "C" when both the stability of the film formation rate and the moisture resistance were judged as "Δ", and as "D" when at least one of the stability of the film formation rate and the moisture resistance was judged as "x", respectively.

TABLE 4

| Sample No. | Material of first transmittance adjusting layer 609 (mol %) | Respective elements expressed in atom % | Film formation rate | Stability | Refractive index | Transmittance (%) | Moisture resistance | Comprehensive evaluation |
|---|---|---|---|---|---|---|---|---|
| 4-1 | $(WO_3)_{50}(TiO_2)_{50}$ | $W_{14.3}Ti_{14.3}O_{71.4}$ | 2.4 | ◯ | 2.6 | 51.9 | ◯ | A |
| 4-2 | $(WO_3)_{20}(TiO_2)_{80}$ | $W_{6.3}Ti_{25.0}O_{68.7}$ | 1.3 | △ | 2.7 | 53.6 | ◯ | B |
| 4-3 | $(WO_3)_{50}(CeO_2)_{50}$ | $W_{14.3}Ce_{14.3}O_{71.4}$ | 2.5 | △ | 2.6 | 52.1 | ◯ | B |
| 4-4 | $(WO_3)_{80}(Bi_2O_3)_{20}$ | $W_{19.0}Bi_{9.5}O_{71.5}$ | 4.7 | ◯ | 2.6 | 52.3 | ◯ | A |
| 4-5 | $(WO_3)_{50}(Bi_2O_3)_{50}$ | $W_{11.1}Bi_{22.2}O_{66.7}$ | 5.9 | ◯ | 2.7 | 53.5 | ◯ | A |
| 4-6 | $(WO_3)_{20}(Bi_2O_3)_{80}$ | $W_{4.2}Bi_{33.3}O_{62.5}$ | 7.1 | ◯ | 2.7 | 54.0 | △ | B |
| 4-7 | $(WO_3)_{50}(TiO_2)_{30}(Bi_2O_3)_{20}$ | $W_{12.8}Ti_{7.7}Bi_{10.3}O_{69.2}$ | 2.4 | ◯ | 2.6 | 52.7 | ◯ | A |
| 4-8 | $(WO_3)_{20}(TiO_2)_{48}(Bi_2O_3)_{32}$ | $W_{5.2}Ti_{12.5}Bi_{16.7}O_{65.6}$ | 1.8 | ◯ | 2.7 | 53.8 | ◯ | A |

As a result, it was found that in Samples 4-1 to 4-8, each in which the first transmittance adjusting layer 609 contains W and O and is represented by the above formula (1), (3) or (4), the first transmittance adjusting layer 609 had a high film formation rate, good stability of the film formation rate, and high refractive index of 2.6 or more. It was found that the first information layer 17 also had a good transmittance and moisture resistance.

From the above results, it was found that the first transmittance adjusting layer 609 has a composition desirably containing at least W and O and preferably represented by, for example, the formula (1), (3) or (4).

Example 5

In Example 5, the optical information recording medium 12 of FIG. 2 was produced, and the relationship between the thickness of the transmittance adjusting layer 109 and the transmittance of the first information layer 10 was examined. Specifically, Samples 5-1 to 5-8 of the optical information recording medium 12 including the first information layer 10 provided with the transmittance adjusting layer 109 with different thicknesses were produced. With respect to each of these samples, the transmittance of the first information layer 10 was measured.

The samples were produced in the following manner. First, as the substrate 8, a polycarbonate substrate (with a diameter of 120 mm and a thickness of 1.1 mm) provided with guide grooves (with a depth of 20 nm and a track pitch of 0.32 µm) for guiding the laser beam 1 was prepared. Then, an Ag—Pd—Cu layer (with a thickness of 80 nm) serving as the second reflective layer 208, a $(In_2O_3)_{50}(ZrO_2)_{50}$ layer (with a thickness of 25 nm) serving as the fourth dielectric layer 206, a $Ge_{45}In_1Bi_3Te_{51}$ layer (with a thickness of 10 m) serving as the second recording layer 204, a $(Cr_2O_3)_{50}(ZrO_2)_{50}$ layer (with a thickness of 5 nm) serving as the third interface layer 203, and a $(ZnS)_{80}(SiO_2)_{20}$ layer (with a thickness of 60 nm) serving as the third dielectric layer 202 were formed sequentially on the polycarbonate substrate by sputtering.

The film forming apparatus for performing sputtering to form the above layers was provided with an Ag—Pd—Cu alloy sputtering target for forming the second reflective layer 208, an $(In_2O_3)_{50}(ZrO_2)_{50}$ sputtering target for forming the fourth dielectric layer 206, a Ge—In—Bi—Te alloy sputtering target for forming the second recording layer 204, a $(Cr_2O_3)_{50}(ZrO_2)_{50}$ sputtering target for forming the third interface layer 203, and a $(ZnS)_{80}(SiO_2)_{20}$ sputtering target for forming the third dielectric layer 202, respectively. All the sputtering targets were 200 mm in diameter and 6 mm in thickness.

The second reflective layer 208 was formed in an Ar gas atmosphere with a pressure of 0.2 Pa at a power of 2000 W using a DC power source. The fourth dielectric layer 206 was formed in an Ar gas atmosphere with a pressure of 0.13 Pa at a power of 2000 W using a RF power source. The second recording layer 204 was formed in an Ar gas atmosphere with a pressure of 0.13 Pa at a power of 200 W using a pulse DC power source. The third interface layer 203 was formed in an Ar gas atmosphere with a pressure of 0.13 Pa at a power of 3000 W using a RF power source. The third dielectric layer 202 was formed in an Ar gas atmosphere with a pressure of 0.13 Pa at a power of 2500 W using a RF power source.

Next, an acrylic ultraviolet curable resin was applied onto the third dielectric layer 202, a substrate on which guide grooves (with a depth of 20 nm and a track pitch of 0.32 µm) were formed was placed thereon, attached tightly thereto, and rotated to form a uniform resin layer. Then, the resin was cured and the substrate was peeled off. As a result, the intermediate layer 3 with a thickness of 25 µm on which guide grooves for guiding the laser beam 1 were formed on the side facing the first information layer 10 was obtained.

After that, a $(WO_3)_{50}(Bi_2O_3)_{50}$ layer serving as the transmittance adjusting layer 109, an Ag—Pd—Cu layer (with a thickness of 9 nm) serving as the first reflective layer 108, an $Al_2O_3$ layer (with a thickness of 10 nm) serving as the second dielectric layer 106, a $(SiO_2)_{20}(In_2O_3)_{50}(ZrO_2)_{30}$ layer (with a thickness of 5 nm) serving as the second interface layer 105, a $Ge_{45}In_1Bi_3Te_{51}$ layer (with a thickness of 7 nm) serving as the first recording layer 104, a $(SiO_2)_{25}(Cr_2O_3)_{50}(ZrO_2)_{25}$ layer (with a thickness of 5 nm) serving as the first interface layer 103, and a $(ZnS)_{80}(SiO_2)_{20}$ layer (with a thickness of 40 nm) serving as the first dielectric layer 102 were formed sequentially on the intermediate layer 3 by sputtering.

The film forming apparatus for performing sputtering to form the above layers was provided with a $(WO_3)_{50}(Bi_2O_3)_{50}$ sputtering target for forming the transmittance adjusting layer 109, an Ag—Pd—Cu alloy sputtering target for forming the first reflective layer 108, an $Al_2O_3$ sputtering target for forming the second dielectric layer 106, a $(SiO_2)_{25}(In_2O_3)_{50}(ZrO_2)_{25}$ sputtering target for forming the second interface layer 105, a Ge—In—Bi—Te alloy sputtering target for forming the first recording layer 104, a $(SiO_2)_{25}(Cr_2O_3)_{50}(ZrO_2)_{25}$ sputtering target for forming the first interface layer 103, and a $(ZnS)_{80}(SiO_2)_{20}$ sputtering target for forming the first dielectric layer 102, respectively. All the sputtering targets were 200 mm in diameter and 6 mm in thickness.

The transmittance adjusting layer 109 was formed in a mixed gas atmosphere of Ar and oxygen (3% oxygen gas with respect to the total of the mixed gas) with a pressure of 0.13 Pa at a power of 2000 W using a RF power source. The first reflective layer 108 was formed in an Ar gas atmosphere with a pressure of 0.2 Pa at a power of 1000 W using a DC power source. The second dielectric layer 106 was formed in an Ar gas atmosphere with a pressure of 0.13 Pa at a power of 2000 W using a RF power source. The second interface layer 105 was formed in an Ar gas atmosphere with a pressure of 0.13

Pa at a power of 2000 W using a RF power source. The first recording layer 104 was formed in an Ar gas atmosphere with a pressure of 0.13 Pa at a power of 100 W using a pulse DC power source. The first interface layer 103 was formed in an Ar gas atmosphere with a pressure of 0.13 Pa at a power of 3000 W using a RF power source. The first dielectric layer 102 was formed in an Ar gas atmosphere with a pressure of 0.13 Pa at a power of 2500 W using a RF power source.

Finally, an acrylic ultraviolet curable resin was applied onto the first dielectric layer 102, which was rotated to form a uniform resin layer. Then, the resin was irradiated with ultraviolet rays to be cured, and thereby a transparent layer 2 with a thickness of 75 μm was formed. After that, an initialization process for crystallizing the second recording layer 204 and the first recording layer 104 by irradiation with a laser beam was carried out. A plurality of samples of the transmittance adjusting layer 109 with different thicknesses were produced in the manner as described above.

Each sample thus obtained was subjected to measurement of the reflectances ($R_{c1}$ and $R_{c2}$) of the second information layer 11 and the first information layer 10 of the optical information recording medium 12 using the recording/reproducing apparatus 34 in FIG. 9. In this case, the wavelength of the laser beam 1 was 405 nm, the numerical aperture NA of the objective lens 30 was 0.85, and the linear velocity of the sample during the measurement was 4.9 m/s. The reflectances were measured in the grooves.

The transmittance ($T_{c1}$) of the first information layer 10 was obtained by measuring ahead of time the reflectance ($R_{c0}$) of the sample in which only the second information layer 11 was formed and performing a calculation ($R_{c2}=R_{c0} \times T_{c1} \times T_{c1}$) based on that reflectance ($R_{c0}$) and the reflectance ($R_{c2}$) of the second information layer 11 of each of Samples 2-1 to 2-24.

Table 5 shows, for each sample, the thickness of the transmittance adjusting layer 109 and the transmittance of the first information layer 10.

TABLE 5

| Sample No. | Thickness of transmittance adjusting layer 109 (nm) | Transmittance of first information layer 10 (%) |
|---|---|---|
| 5-1 | 8 | 44.8 |
| 5-2 | 9 | 45.3 |
| 5-3 | 12 | 46.8 |
| 5-4 | 15 | 47.5 |
| 5-5 | 20 | 48.9 |
| 5-6 | 25 | 47.2 |
| 5-7 | 30 | 45.4 |
| 5-8 | 33 | 44.6 |

As a result, it was found that in Samples 5-2 to 5-7, each in which the transmittance adjusting layer 109 has a thickness of at least 9 nm but not more than 30 nm, the transmittance of the first information layer 10 was at least 45%.

From the above results, it was found that the thickness of the transmittance adjusting layer 109 preferably is in the range of at least 9 nm but not more than 30 nm.

Example 6

In Example 3, with respect to each of Samples 3-1 to 3-11, the signal intensity and the erasing performance of the first information layer 13 in the optical information recording medium 16 were measured using the recording/reproducing apparatus 34 in FIG. 9. In this case, the wavelength of the laser beam 1 was 405 nm, the numerical aperture NA of the objective lens 30 was 0.85, the linear velocity of the sample during the measurement was 9.8 m/s, and the shortest mark length (2T) was 0.149 μm. Information was recorded in the grooves. As a result, it was confirmed that each of these samples achieved a CNR of 42 dB or higher as a measure of the signal intensity and an erasing ratio of 25 dB or higher as a measure of the erasing performance, and thus could be used as a rewritable optical information recording medium.

Example 7

In Examples 1 to 6, when the transmittance adjusting layer 109, the first transmittance adjusting layer 309, the second transmittance adjusting layer 409, the first transmittance adjusting layer 609, the second transmittance adjusting layer 709, and/or the third transmittance adjusting layer 809 were formed using sputtering targets not containing oxygen but containing W, W-M1, W-M2, and/or W-M1-M2 alloys in an oxygen-Ar mixed gas atmosphere having a high content of oxygen (for example, 50% oxygen gas with respect to the total of the mixed gas), similar results were obtained.

INDUSTRIAL APPLICABILITY

According to the optical information recording medium of the present invention, a multi-layer optical information recording medium including a plurality of information layers can be manufactured efficiently. The optical information recording medium of the present invention is useful as an optical disc or the like such as a high density rewritable disc (for example, Blu-ray Disc Rewritable (BD-RE), DVD-RAM, DVD-RW, and DVD+RW), a write-once disc (for example, Blu-ray Disc Recordable (BD-R), and DVD-R), and a reproduction-only disc (for example, Blu-ray Disc Read-Only (BD-ROM), DVD-ROM).

The invention claimed is:

1. An optical information recording medium comprising: N information layers, where N is a natural number of 2 or more; and an intermediate layer for separating the N information layers optically from each other, wherein with the N information layers being referred to as a first information layer to an N-th information layer sequentially from an optical beam incident side, an L-th information layer included in the N information layers includes a recording layer on which information can be recorded by irradiation with an optical beam, a reflective layer, and a transmittance adjusting layer in this order from the optical beam incident side, where L is at least one natural number that satisfies $1 \leq L \leq N-1$, and the transmittance adjusting layer contains tungsten (W), oxygen (O), and M1, where the M1 is at least one element selected from the group consisting of Ce and Ti.

2. The optical information recording medium according to claim 1, wherein the transmittance adjusting layer contains a material represented by following formula (1):

$$W_{a1}M1_{b1}O_{100-a1-b1} \text{ (atom \%)} \quad (1),$$

where a1 and b1 satisfy $0<a1<30$ and $0<b1<29$, respectively.

3. The optical information recording medium according to claim 1, wherein the transmittance adjusting layer contains a material represented by following formula (2):

$$(WO_3)_{100-c1}(D1)_{c1} \text{ (mol \%)} \quad (2),$$

where D1 is at least one compound selected from $CeO_2$ and $TiO_2$, and c1 satisfies $0<c1 \leq 95$.

4. An optical information recording medium comprising: N information layers, where N is a natural number of 2 or more and an intermediate layer for separating the N information layers optically from each other, wherein with the N information layers being referred to as a first information layer to an N-th information layer sequentially from an optical beam incident side, an L-th information layer included in the N information layers includes a recording layer on which information can be recorded by irradiation with an optical beam, a reflective layer, and a transmittance adjusting layer in this order from the optical beam incident side, where L is at least one natural number that satisfies $1 \leq L \leq N-1$, and the transmittance adjusting layer contains tungsten (W), oxygen (O), and M2, where the M2 is at least one element selected from the group consisting of Ag, Bi, Mg, Y, and Zr.

5. The optical information recording medium according to claim 4, wherein the transmittance adjusting layer contains at least one compound selected from the group consisting of $Ag_2WO_4$, $Bi_2WO_6$, $MgWO_4$, $Y_2W_3O_{12}$, and $ZrW_2O_8$.

6. The optical information recording medium according to claim 4, wherein the transmittance adjusting layer contains a material represented by following formula (3):

$$W_{a2}M2_{b2}O_{100-a2-b2} \text{ (atom \%)} \qquad (3),$$

where a2 and b2 satisfy $0<a2<30$ and $0<b2<35$, respectively.

7. The optical information recording medium according to claim 1, wherein the transmittance adjusting layer further contains M2', where M2' is at least one element selected from the group consisting of Ag, Bi, Mg, Mn, Y, Zn, and Zr.

8. The optical information recording medium according to claim 7, wherein the transmittance adjusting layer contains a material represented by following formula (4):

$$W_{a3}M1_{b3}M2'_{c3}O_{100-a3-b3-c3} \text{ (atom \%)} \qquad (4),$$

where a3, b3, and c3 satisfy $0<a3<30$, $4<b3<16$, and $3<c3<22$, respectively.

9. The optical information recording medium according to claim 1, wherein the transmittance adjusting layer has a thickness d1 (nm) in a range of $9 \leq d1 \leq 30$.

10. The optical information recording medium according to claim 1, wherein the recording layer is capable of undergoing a phase change by irradiation with the optical beam.

11. The optical information recording medium according to claim 10, wherein the recording layer contains Ge, Te, and at least one element selected from the group consisting of Sb, Bi, In, and Sn, and the recording layer contains at least 50 atom % of Te.

12. The optical information recording medium according to claim 10, wherein the recording layer contains at least 70 atom % of Sb.

13. The optical information recording medium according to claim 10, wherein the recording layer has a thickness of 9 nm or less.

14. The optical information recording medium according to claim 1, wherein the reflective layer contains Ag as a main component.

15. The optical information recording medium according to claim 14, wherein the reflective layer has a thickness of 15 nm or less.

16. The optical information recording medium according to claim 1, wherein the intermediate layer contains an acrylic resin as a main component.

17. A method of manufacturing the optical information recording medium according to claim 1, the method comprising at least a step of forming the transmittance adjusting layer, wherein in the step of forming the transmittance adjusting layer, the transmittance adjusting layer is formed by using a sputtering target containing at least tungsten (W) and oxygen (O), or the transmittance adjusting layer is formed by using a sputtering target containing at least tungsten (W) and a gas containing at least oxygen (O).

18. The method of manufacturing the optical information recording medium according to claim 17, wherein the sputtering target further contains M1, where the M1 is at least one element selected from the group consisting of Ce and Ti.

19. The method of manufacturing the optical information recording medium according to claim 17, wherein the sputtering target and the transmittance adjusting layer each further contain M2', where M2' is at least one element selected from the group consisting of Ag, Bi, Mg, Mn, Y, Zn, and Zr.

20. The method of manufacturing the optical information recording medium according to claim 17, the method further comprising a step of forming the intermediate layer prior to the step of forming the transmittance adjusting layer.

21. A sputtering target comprising at least tungsten (W) and M1, where the M1 is at least one element selected from the group consisting of Ce and Ti.

22. The sputtering target according to claim 21, further comprising M2, where the M2 is at least one element selected from the group consisting of Ag, Bi, Mg, Y, and Zr.

23. The sputtering target according to claim 21, further comprising oxygen (O).

24. The sputtering target according to claim 23, comprising a material represented by following formula (5):

$$W_{a1}M1_{b1}O_{100-a1-b1} \text{ (atom \%)} \qquad (5),$$

where a1 and b1 satisfy $0<a1<30$ and $0<b1<29$, respectively.

25. The sputtering target according to claim 23, comprising a material represented by following formula (6):

$$(WO_3)_{100-c1}(D1)_{c1} \text{ (mol \%)} \qquad (6),$$

where D1 is at least one compound selected from the group consisting of $CeO_2$ and $TiO_2$, and c1 satisfies $0<c1 \leq 95$.

26. The sputtering target according to claim 23, further comprising M2, where the M2 is at least one element selected from the group consisting of Ag, Bi, Mg, Y, and Zr.

27. The sputtering target according to claim 26, comprising a material represented by following formula (7):

$$W_{a3}M1_{b3}M2_{c3}O_{100-a3-b3-c3} \text{ (atom \%)} \qquad (7),$$

where a3, b3, and c3 satisfy $0<a3<30$, $4<b3<16$, and $3<c3<22$, respectively.

28. A sputtering target comprising at least tungsten (W) and M2, where M2 is at least one element selected from the group consisting of Ag, Bi, Mg, Y, and Zr.

29. The sputtering target according to claim 28, further comprising oxygen (O).

30. The sputtering target according to claim 29, comprising a material represented by following formula (8):

$$W_{a2}M2_{b2}O_{100-a2-b2} \text{ (atom \%)} \qquad (8),$$

where a2 and b2 satisfy $0<a2<30$ and $0<b2<35$, respectively.

31. The optical information recording medium according to claim 4, wherein the transmittance adjusting layer has a thickness d1 (nm) in a range of $9 \leq d1 \leq 30$.

32. The optical information recording medium according to claim 4, wherein the recording layer is capable of undergoing a phase change by irradiation with the optical beam.

33. The optical information recording medium according to claim 32,
wherein the recording layer contains Ge, Te, and at least one element selected from the group consisting of Sb, Bi, In, and Sn, and
the recording layer contains at least 50 atom % of Te.

34. The optical information recording medium according to claim 32, wherein the recording layer contains at least 70 atom % of Sb.

35. The optical information recording medium according to claim 32, wherein the recording layer has a thickness of 9 nm or less.

36. The optical information recording medium according to claim 4, wherein the reflective layer contains Ag as a main component.

37. The optical information recording medium according to claim 36, wherein the reflective layer has a thickness of 15 nm or less.

38. The optical information recording medium according to claim 4, wherein the intermediate layer contains an acrylic resin as a main component.

39. The optical information recording medium according to claim 4, wherein transmittance adjusting layer further contains M1, where the M1 is at least one element selected from the group consisting of Ce and Ti.

40. A method of manufacturing the optical information recording medium according to claim 4, the method comprising at least a step of forming the transmittance adjusting layer,
wherein in the step of forming the transmittance adjusting layer, the transmittance adjusting layer is formed by using a sputtering target containing at least tungsten (W) and oxygen (O), or the transmittance adjusting layer is formed by using a sputtering target containing at least tungsten (W) and a gas containing at least oxygen (O).

41. The method of manufacturing the optical information recording medium according to claim 40, wherein the sputtering target further contains the M2.

42. The method of manufacturing the optical information recording medium according to claim 40, wherein the sputtering target and the transmittance adjusting layer each further contain M1, where the M1 is at least one element selected from the group consisting of Ce and Ti.

43. The method of manufacturing the optical information recording medium according to claim 40, the method further comprising a step of forming the intermediate layer prior to the step of forming the transmittance adjusting layer.

\* \* \* \* \*

UNITED STATES PATENT AND TRADEMARK OFFICE
CERTIFICATE OF CORRECTION

PATENT NO. : 8,158,233 B2
APPLICATION NO. : 12/593693
DATED : April 17, 2012
INVENTOR(S) : Nishihara et al.

Page 1 of 1

It is certified that error appears in the above-identified patent and that said Letters Patent is hereby corrected as shown below:

Column 63, line 3 (Claim 4): after "more" insert --;--.

Signed and Sealed this
Nineteenth Day of February, 2013

Teresa Stanek Rea
*Acting Director of the United States Patent and Trademark Office*